United States Patent
Casparian et al.

(10) Patent No.: US 10,574,233 B2
(45) Date of Patent: Feb. 25, 2020

(54) RETRACTABLE AND/OR VARIABLE DEPRESSION FORCE KEY ASSEMBLIES AND METHODS FOR USING THE SAME

(71) Applicant: DELL PRODUCTS L.P., Round Rock, TX (US)

(72) Inventors: Mark A. Casparian, Miami, FL (US); Joe A. Olmsted, Cedar Park, TX (US); Philip J. Grossmann, Austin, TX (US); Jason Morrison, Cedar Park, TX (US); Frank C. Azor, Palmetto Bay, FL (US)

(73) Assignee: Dell Products L.P., Round Rock, TX (US)

( * ) Notice: Subject to any disclaimer, the term of this patent is extended or adjusted under 35 U.S.C. 154(b) by 54 days.

(21) Appl. No.: 15/418,232

(22) Filed: Jan. 27, 2017

(65) Prior Publication Data
US 2018/0219552 A1    Aug. 2, 2018

(51) Int. Cl.
| H03K 17/972 | (2006.01) |
| H01F 7/02 | (2006.01) |
| H01F 7/20 | (2006.01) |
| H01H 3/12 | (2006.01) |
| H01H 13/7065 | (2006.01) |

(52) U.S. Cl.
CPC ......... *H03K 17/972* (2013.01); *H01F 7/0226* (2013.01); *H01F 7/0273* (2013.01); *H01F 7/204* (2013.01); *H01H 3/125* (2013.01); *H01H 13/7065* (2013.01); *H01H 2221/04* (2013.01); *H01H 2227/034* (2013.01); *H01H 2227/036* (2013.01); *H03K 2217/96023* (2013.01); *H03K 2217/96042* (2013.01)

(58) Field of Classification Search
CPC ..... H03K 17/972; H01F 1/057; H01F 7/0273; H01F 7/204; H01H 36/004
See application file for complete search history.

(56) References Cited

U.S. PATENT DOCUMENTS

| 3,720,948 A | 3/1973 | Eichen et al. |
| 4,627,003 A | 12/1986 | Kishi et al. |
| 5,990,872 A | 11/1999 | Jorgenson et al. |
| 6,794,992 B1 | 9/2004 | Rogers |
| 7,772,987 B2 | 8/2010 | Shows |

(Continued)

OTHER PUBLICATIONS

Knaian, "Electropermanent Magnetic Connectors and Actuators: Devices and Their Application in Programmable Matter," Massachusetts Institute of Technology, Jun. 2010, 206 pgs.

(Continued)

*Primary Examiner* — Amine Benlagsir
(74) *Attorney, Agent, or Firm* — Egan Peterman Enders Huston

(57) ABSTRACT

Key assemblies are disclosed herein that are retractable and/or that present a variable key assembly depression force to a user. In one example, one or more key assemblies may be provided that each employ one or more electro-permanent magnets (EPMs) together with permanent magnet and/or magnetically permeable (e.g., ferromagnetic) key assembly components to control key retraction and extension, and/or to control peak depression force (e.g., typing force) required to depress and displace a key assembly from an extended position to a lower position that causes the key assembly to produce a digital or analog output signal.

19 Claims, 22 Drawing Sheets

(56) References Cited

U.S. PATENT DOCUMENTS

| | | | |
|---|---|---|---|
| 8,179,377 | B2 | 5/2012 | Ciesla et al. |
| 8,232,494 | B2 | 7/2012 | Purcocks |
| 8,330,741 | B1 | 12/2012 | Camarota |
| 8,411,029 | B2 | 4/2013 | Casparian et al. |
| 8,456,438 | B2 | 6/2013 | Ciesla et al. |
| 8,629,362 | B1 | 1/2014 | Knighton et al. |
| 8,674,941 | B2 | 3/2014 | Casparian et al. |
| 8,700,829 | B2 | 4/2014 | Casparian et al. |
| 8,748,767 | B2 | 6/2014 | Ozias et al. |
| 8,836,643 | B2 | 9/2014 | Joliff et al. |
| 9,111,005 | B1 | 8/2015 | Ross et al. |
| 9,246,487 | B2 | 1/2016 | Casparian et al. |
| 9,246,687 | B2 | 1/2016 | Dellow |
| 9,272,215 | B2 | 3/2016 | Casparian et al. |
| 9,274,612 | B2 | 3/2016 | Ciesla et al. |
| 9,343,248 | B2 | 5/2016 | Casparian et al. |
| 9,368,300 | B2 | 6/2016 | Casparian et al. |
| 9,372,521 | B2 | 6/2016 | Sultenfuss et al. |
| 9,468,853 | B2 | 10/2016 | Liendo et al. |
| 9,558,527 | B2 | 1/2017 | Sierra et al. |
| 2004/0005183 | A1 | 1/2004 | MacFarlane |
| 2006/0132446 | A1 | 6/2006 | Soh et al. |
| 2007/0188453 | A1* | 8/2007 | O'Sullivan ............ G06F 3/0312 345/163 |
| 2007/0273561 | A1 | 11/2007 | Philipp |
| 2008/0278354 | A1* | 11/2008 | Garrett .................. G06F 3/0202 341/32 |
| 2009/0024926 | A1 | 1/2009 | Morotomi |
| 2011/0001613 | A1 | 1/2011 | Ciesla et al. |
| 2011/0148768 | A1 | 6/2011 | Ladouceur et al. |
| 2011/0210918 | A1 | 9/2011 | Kodama |
| 2013/0154940 | A1* | 6/2013 | Gan ....................... H01H 13/70 345/168 |
| 2014/0002366 | A1 | 1/2014 | Gluckstad et al. |
| 2014/0168086 | A1 | 6/2014 | Huang |
| 2014/0281618 | A1 | 9/2014 | Sultenfuss et al. |
| 2015/0061901 | A1 | 3/2015 | Casparian et al. |
| 2015/0101917 | A1 | 4/2015 | Yen |
| 2015/0332875 | A1* | 11/2015 | Hsu ........................ H01H 3/125 200/344 |
| 2015/0341030 | A1 | 11/2015 | De Saulles et al. |
| 2016/0117793 | A1 | 4/2016 | Sierra et al. |
| 2017/0168711 | A1 | 6/2017 | Temple |
| 2018/0219551 | A1 | 8/2018 | Casparian et al. |
| 2018/0260043 | A1 | 9/2018 | Forde et al. |

OTHER PUBLICATIONS

Hanselman, "Guildwars and the ErgoDex DX1," May 22, 2005, 3 pgs.
The Human Solution, "Ergodex DX1 Input System," Ergodex DX1 Product; Printed from Internet Nov. 10, 2016, 3 pgs.
Ergodex.com, "Products," Printed from Internet Nov. 10, 2016, 2 pgs.
Ergodex.com, "DX1 Buyer Selection Guide," Printed from Internet Nov. 10, 2016, 3 pgs.
Govindan, "Ergodex DX1: The Ultimately Customizable Keyboard", Printed from Internet Nov. 10, 2016, 2 pgs.
Erogodex DX1 Suite, in Character Software, Printed From Internet Nov. 10, 2016; 2 pgs.
Tyson, "Darfon's Maglev Keyboard to Help Slim Future Notebooks", Printed From Internet Nov. 4, 2016; 2 pgs.
Low, "Darfon's Super Thin Maglev Keyboard Will Make Notebooks Even Slimmer", Printed From Internet Nov. 4, 2016; 3 pgs.
Rahul R., Darfon's Maglev Keyboards to Make Future Laptops Super Thin, Printed From Internet Nov. 4, 2016; 2 pgs.
Roston, "Maglev Keyboard Uses Magnets for Ultra Slimness", Printed From Internet Nov. 4, 2016; 6 pgs.
Kowaliski, "Maglev Keyboard to Enable Thinner Notebooks", Printed From Internet Nov. 4, 2016; 1 pg.
Morrison, "Information Handling System Low Profile Keyboard", U.S. Appl. No. 15/058,361, filed Mar. 2, 2016; 23 pgs.
Peeler et al., "Systems and Methods for Display for Non-Graphics Positional Audio Information", U.S. Appl. No. 15/223,613, filed Jul. 29, 2016; 57 pgs.
Casparian et al., "Systems and Methods for Implementing Retractable and/or Variable Depression Force Key Assemblies", U.S. Appl. No. 15/418,120, filed Jan. 27, 2017, 88 pgs.
Casparian et al., "Systems and Methods for Indicating Real Time Availability of Key Assemblies for User Input to an Information Handling System", U.S. Appl. No. 15/587,103, filed May 4, 2017, 104 pgs.
Harris, "How Nail Guns Work", HowStuffWorks, Web Archive, Available on Internet Aug. 8, 2016, 9 pgs.
"How a Player Piano Works", Web Archive, Available on Internet Aug. 25, 2016, 2 pgs.
Wikipedia, "Slide Stop", Available on Internet Aug. 19, 2016, 1 pg.
Casparian et al., "Systems and Methods for Implementing Retractable and/or Variable Depression Force Key Assemblies"; U.S. Appl. No. 15/418,120, filed Jan. 27, 2017, Response to Office action, Filed Jan. 29, 2019, 24 pgs.
Casparian et al., "Systems and Methods for Indicating Real Time Availability of Key Assemblies for User Input to an Information Handling System", U.S. Appl. No. 15/587,103, filed May 4, 2017, Office action, dated Jan. 8, 2019, 18 pgs.
Casparian et al., "Systems and Methods for Implementing Retractable and/or Variable Depression Force Key Assemblies", U.S. Appl. No. 15/418,120, filed Jan. 27, 2017, Office action, dated Oct. 29, 2018, 28 pgs.
Casparian et al., "Systems and Methods for Indicating Real Time Availability of Key Assemblies for User Input to an Information Handling System", U.S. Appl. No. 15/587,103, filed May 4, 2017, Response to Office action, filed May 8, 2019, 18 pgs.

* cited by examiner

RETRACTABLE AND/OR VARIABLE DEPRESSION FORCE KEY ASSEMBLIES AND METHODS FOR USING THE SAME

RELATED APPLICATIONS

The present application is related in subject matter to concurrently filed patent application Ser. No. 15/418,120 filed this same day and entitled "SYSTEMS AND METHODS FOR IMPLEMENTING RETRACTABLE AND/OR VARIABLE DEPRESSION FORCE KEY ASSEMBLIES" by Casparian et al., which is incorporated herein by reference in its entirety.

FIELD

This application relates to key assemblies, and more particularly to key assemblies and methods for using the same.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Systems and methods are disclosed herein that may be implemented to configure, provide and operate retractable key assemblies, and key assemblies that present a variable key assembly depression force to a human user. In one embodiment, one or more key assemblies may be provided that each employ one or more electro-permanent magnets (EPMs) together with permanent magnet and/or magnetically permeable (e.g., ferromagnetic) key assembly components to control key retraction and extension, and/or peak depression force (e.g., typing force) required to depress and displace a key assembly from an extended position to a lower position that causes the key assembly to produce a digital or analog output signal, e.g., to a keyboard controller. In embodiments of the disclosed systems and methods, the state of an external magnetic field of key assembly EPMs may be controlled (e.g., selectably turned ON, turned OFF, varied in polarity direction, and/or varied in strength) by temporary application of a current pulse having an appropriate strength and/or polarity to a conductive coil of a given keyboard assembly EPM to cause magnetic material of the EPM to emit a magnetic field of desired strength and/or polarity that in turn causes the desired key retraction and/or peak key depression force result. Using the disclosed systems and methods, energy consumption is reduced since EPMs only require a temporary electrical current pulse be applied to the EPM coil to select and establish the desired strength of the EPM magnetic field (or to switch the EPM magnetic field ON and OFF), but require no further application of electrical current to hold or maintain the state or strength of the magnetic field emitted by the EPM magnetic material once such state or strength has been so established by application of the temporary current pulse to the EPM coil.

In one exemplary embodiment, a key assembly may be provided alone or part of multiple similar key assemblies of a keyboard matrix. The key assembly may employ an EPM to selectably emit a magnetic field that acts on a magnetically permeable (e.g., ferromagnetic) body of the key assembly, and may be configured such that when the EPM is turned ON it emits a magnetic field that attracts the magnetically permeable body so as to cause the magnetically permeable body to bias the key assembly upward into an extended position, and such that when the EPM is turned OFF the key assembly is biased downward into a retracted position by a downward bias force. Such a downward bias force may be applied, for example, by a spring, a permanent magnet, another separate EPM, etc. In embodiments where a spring or another magnet are used for the downward bias force, the key assembly may be configured such that the downward bias force is less than the minimum upward bias force provided by the EPM when its magnetic field is turned ON. In one embodiment, upward bias applied by at least one EPM to an extended key assembly may be varied (e.g., by varying the time duration or amplitude of current pulses applied to the EPM, by varying the number of EPMs that are simultaneously turned ON to bias the key assembly in the upward position, etc.). By so varying the upward bias applied to an extended key assembly, the required user force to overcome the upward bias force and depress the key assembly downward may be varied.

In another exemplary embodiment, retraction and/or depression force of one or more key assemblies may be controlled and operated using a combination of software, custom application programming interface (API) and key assembly and programmable integrated circuit hardware. In one such an embodiment, a combination of a key retraction profile configurator application and an intervening API may be employed to communicate with a set of software-controlled EPMs that are mechanically configured to cause extension and retraction of key assemblies, and/or to control depression force required by a user to depress individual key assemblies. Such a key retraction profile configurator application may be employed in one embodiment to create user configurable key map information in the form of a unique user configurable application key map file for a given user application in focus (e.g. such as a given computer game). Such a given user application in focus (e.g. such as a given computer game) specifies that all keys used by the given user application are to stay raised or extended, and all other keys not used by the user application are to remain retracted, while the given user application remains in focus.

In a further embodiment, a key retraction profile configurator application may be further provided that allows a user to create custom application profiles (e.g., such as custom computer game profiles for each different application or instance of in-focus application) and/or to load application profiles directly from an application in focus (e.g., such as an application profile written by developers of the application). Such an application profile may include a listing of all the key assemblies that are usable in the application for various commands, an amount of downward finger force (peak or maximum depression force) to overcome upward key assembly bias and cause downward movement of a given key assembly to cause key actuation and output of digital or analog key signal. This application profile information may be communicated to the hardware layer (e.g., including a keyboard controller) via a custom API where the application key identities and peak force parameters per key may be stored for the application that has been loaded and is focus.

It will be understood that peak key assembly depression force may be varied in any suitable manner. For example, multiple EPMs may be provided for each individual key assembly so as to support the ability to incrementally increase the amount of finger force (peak depression force) required for the "make actuation" of the key assembly switch, thus providing a software-controllable technique to allow a user to configure the desired finger force desired on a key assembly-by-key assembly basis. Discrete force levels may also be achieved in one embodiment. In another embodiment a permanent magnet (e.g., aluminum-nickel-cobalt or AlNiCo) in an EPM assembly may be partially magnetized to achieve any desired peak depression force between two different peak depression endpoints. In one embodiment, such partial magnetization may be achieved by varying the voltage of a current pulse applied to the coil of an EPM assembly to generate a temporary magnetic field. In this regard, the generated magnetic field of an EPM coil needs to be greater than the existing coercive force of the EPM magnet material in order to change the residual magnetization of the EPM. Thus, as the generated magnetic field of the EPM coil increases above the coercive force of EPM magnet material, the amount of residual magnetization goes up until the EPM magnet material reaches a fully saturated state.

In another exemplary embodiment, multiple retractable keys of a keyboard matrix array may be individually actuated by electro-permanent magnets that are controlled using retractable key control circuitry and high voltage and current pulses. The retractable key control circuitry may be configured to implement a matrix addressing scheme to individually address the electro-permanent magnet of each key with a high voltage and current pulse of selected polarity (direction) to either retract or extend the selected key. The matrix addressing scheme may include binary decoders coupled to control pairs of Half-H bridge drivers that separately supply high voltage and current pulses of selected polarity to each of the electro-permanent magnets of the individual keys to cause retraction or extension of each key. To control retraction or extension of each key, a microcontroller or other programmable integrated circuit may implement an electronic programming module to provide a current direction control signal, as well as provide the key row address to a row binary decoder and the key column address to a column binary controller. The row and column binary decoders in turn provide chip enable signals to two respective Half-H bridge drivers that correspond to the row and column of the selected key. The direction of current causes magnetic field of the electro-permanent magnets to vary in order to control key retraction and extension. To limit current drawn, the retractable key control circuitry may be configured to actuate only one key of the keyboard matrix at a time, e.g., in round robin fashion. Fault detection and feedback circuitry may be included to provide a feedback signal to the microcontroller that is indicative of a fault detected by the Half-H bridge drivers.

The disclosed systems and methods may be implemented in one exemplary embodiment to enable users (e.g., such as PC Gamers) the ability to configure their keyboard such that only the key assemblies mapped and in use by a user application (e.g., such as a particular computer game) are available for use while all other key assemblies not used by the application are automatically retracted down and out of position such as to not be accidentally pressed while at the same time their respective scan codes may be optionally blocked from being reported to the OS. Alternatively or additionally, the disclosed systems and methods may be implemented to allow a user to adjust the amount of finger force (or peak depression force) required for the "make actuation" point on a key assembly-by-key assembly basis, or for a select group of multiple key assemblies so as to help prevent accidental pressing of critical in-game key assembly buttons, e.g., such as an in-game electromagnetic pulse (EMP) Blast. In one embodiment, a key assembly may be programmed with a greater peak depression force in order to require the key assembly to be pressed with a greater finger force for typing than are all other keys (thus requiring a deliberate press versus accidentally brushing up against the corner of a keycap of a key assembly and inadvertently pressing it).

In one respect, disclosed herein is a key assembly, including: at least one key assembly component including at least one permanent magnet material or magnetically permeable material and coupled to move toward and away from a base; and at least one electro-permanent magnet (EPM) coupled in fixed relationship to the base, the EPM being positioned to emit an external magnetic field that acts on the permanent magnet material or magnetically permeable material of the key assembly component.

In another respect, disclosed herein is a method, including: moving at least one key assembly component toward a base in response to a depression force applied to the key assembly component by a user, the key assembly component including at least one permanent magnet material or magnetically permeable material; and applying at least one current pulse to at least one electro-permanent magnet (EPM) coupled in fixed relationship to the base. The at least one current pulse may be applied to control a state of an external magnetic field of the EPM that acts on the permanent magnet material or magnetically permeable material of the key assembly component.

DESCRIPTION OF ILLUSTRATIVE EMBODIMENTS

Figure 1:
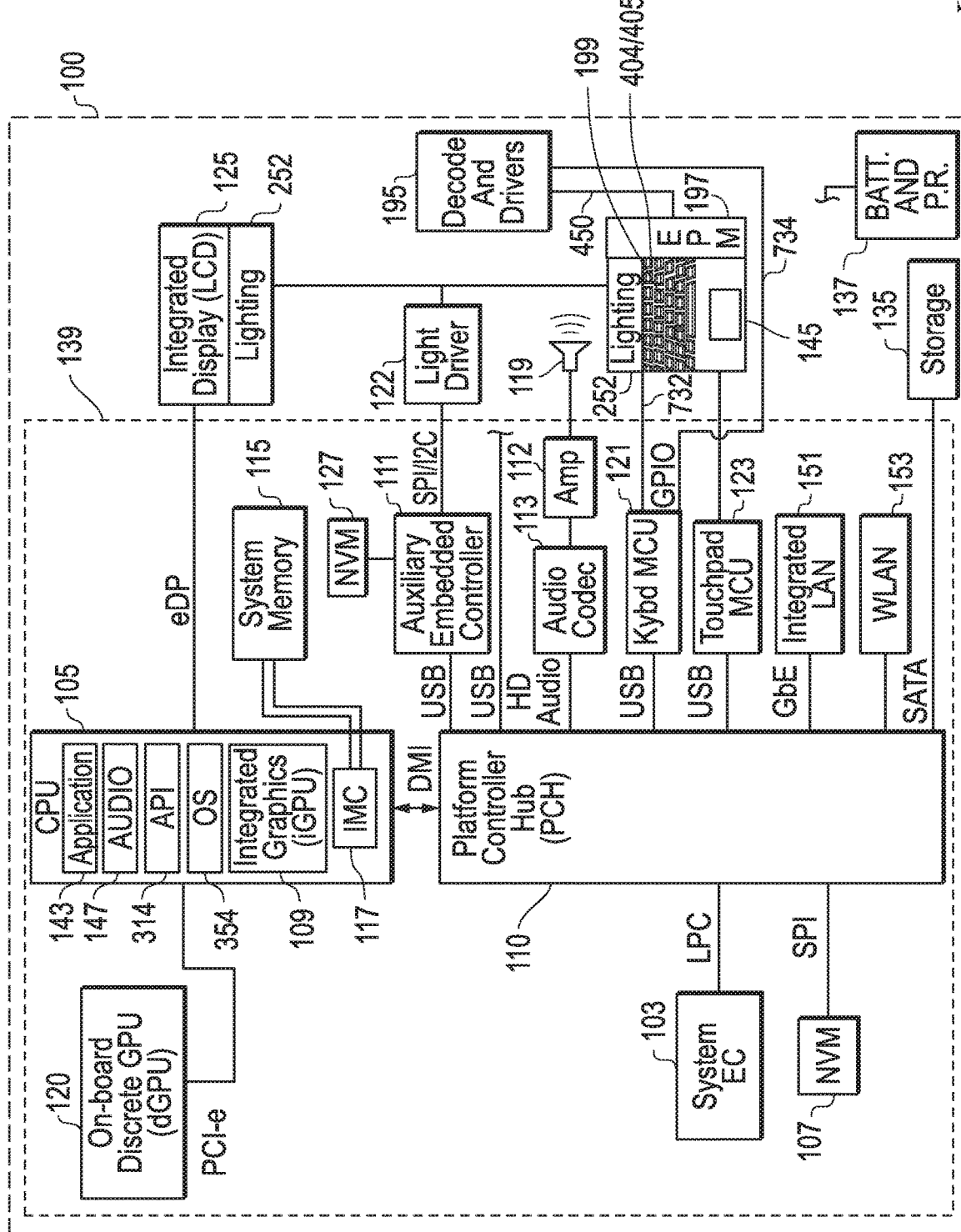
FIG. 1 illustrates a block diagram of a portable information handling system according to one exemplary embodiment of the disclosed systems and methods.

FIG. 1 is a block diagram illustrating a portable information handling system 100 as it may be configured to according to one exemplary embodiment of the disclosed systems and methods. In one embodiment, portable information handling system 100 may be a battery-powered portable information handling system that is configured to be optionally coupled to an external source of system (DC) power, for example AC mains and an AC adapter. Information handling system may also include an internal DC power source 137 (e.g., smart battery pack and power regulation circuitry) that is configured to provide system power source for the system load of information handling system, e.g., when an external source of system power is not available or not desirable. Portable information handling system 100 may be, for example, a notebook or laptop computer, tablet computer, convertible computer, etc. and may be configured with a chassis enclosure delineated as shown by the outer dashed outline.

However, it will be understood that the disclosed systems and methods may be implemented in other embodiments for other types of portable information handling systems that include or are coupled to a separate peripheral keyboard matrix or other peripheral input device such as mouse, game controller, etc. For example, the disclosed systems and methods may be implemented with an AC-powered or non-portable desktop computer or a computer workstation that is coupled to an external keyboard, mouse or game controller that itself includes key assembly components 405 with EPMs 197 and optionally one or more of keyboard controller 121 and/or decode and bridge driver circuitry 195 components described further herein. Alternatively one or more of such keyboard controller 121 and/or decode and bridge driver circuitry 195 components may be instead implemented within a non-portable desktop or computer workstation information handling system chassis that is coupled to the EPMs 197 of the key assemblies 405. Further information on non-portable or non-battery powered information handling system architecture and components may be found in United States Patent Application Publication Number 20140281618A1, which is incorporated herein by reference in its entirety. It will also be understood that the particular configuration of FIG. 1 is exemplary only, and that an information handling system may be configured with fewer, additional or alternative components than those illustrated and described herein.

As shown in FIG. 1, information handling system chassis 100 of this exemplary embodiment includes various integrated components that are embedded on a system motherboard 139, it being understood that any one or more of such embedded components may be alternatively provided separate from motherboard 139 within a chassis case 100 of a portable information handling system, e.g., such as provided on a daughter card or other separate mounting configuration. As further shown, a host programmable integrated circuit 105 is provided, e.g., as a central processing unit CPU such as an Intel Haswell processor, an Advanced Micro Devices (AMD) Kaveri processor, or one of many other suitable programmable integrated circuits currently available. In this embodiment, a host programmable integrated circuit in the form of CPU 105 may execute a host operating system (OS) for the portable information handling system. System memory may include main system memory 115 (e.g., volatile random access memory such as DRAM or other suitable form of random access memory) coupled (e.g., via DDR channel) to an integrated memory controller (iMC) 117 of host programmable integrated circuit 105 to facilitate memory functions, although it will be understood that a memory controller may be alternatively provided as a separate chip or other circuit in other embodiments. Not shown is optional nonvolatile memory (NVM) such as Flash, EEPROM or other suitable non-volatile memory that may also be coupled to host programmable integrated circuit 105.

As shown in FIG. 1, host programmable integrated circuit 105 itself includes an integrated GPU (iGPU) 109 and portable information handling system chassis 100 may also include an optional separate internal discrete GPU (I-dGPU) 120. In one mode of operation, video content from CPU 105 may be sourced at any given time either by iGPU 109 or I-dGPU 120. Further information on integrated and discrete graphics maybe found, for example, in United States Patent Application Publication Number 20160117793A1, which is incorporated herein in its entirety for all purposes. It will be understood that PCI-e is just one example of a suitable type of data bus interface that may be employed to route graphics data between internal components within portable information handling system chassis 100.

As further illustrated in FIG. 1, host programmable integrated circuit 105 may be coupled to embedded platform controller hub (PCH) 110 which may be present to facilitate input/output functions for the host programmable integrated circuit 105 with various internal components of information handling system 100. In this exemplary embodiment, PCH 110 is shown coupled to other embedded components on a motherboard 139 that include system embedded controller 103 (e.g., used for real time detection of events, etc.), non-volatile memory 107 (e.g., storing BIOS, etc.), wireless network card (WLAN) 153 for Wi-Fi or other wireless network communication, integrated network interface card (LAN) 151 for Ethernet or other wired network connection, touchpad microcontroller (MCU) 123, keyboard microcontroller (MCU) 121, audio codec 113, audio amplifier 112, and auxiliary embedded controller 111 which may be implemented by a microcontroller. Also shown coupled to PCH 110 are other non-embedded internal components of information handling system 100 which include integrated display 125 (e.g., LCD or LED flat panel display integrated into notebook computer lid or tablet, or other suitable integrated portable information handling system display device), audio endpoint in the form of internal speaker 119, integrated keyboard and touchpad 145, and storage 135 which may be a local hard drive storage or other suitable type of system storage including solid state drive (SSD), optical drive/s, NVRAM, Flash or any other suitable form of internal storage.

Also shown in FIG. 1 is keyboard controller 121 that may be coupled to receive digital output signals 732 from individual key assemblies 405 (e.g., momentary on digital keys) of keyboard matrix 199 when depressed by a user, and to provide corresponding keyboard output signals (e.g., in the form of scan code signals 736) corresponding to individual depressed digital keys of keyboard matrix 199 to an appropriate device driver 316 (e.g., PS2 keyboard device driver) executing on host programmable integrated circuit 105 via PCH 110. Keyboard controller 121 may poll all the momentary on digital keys in the keyboard matrix 199 and broadcast a scan code output corresponding to any pressed keys to the operating system (OS) 354 of information handling system 100. It will be understood that in other embodiments, other types of retractable key assemblies of a keyboard matrix 199 (e.g., variable pressure or variable displacement key assemblies, etc.) and/or tasks of controller 110 may be implemented by auxiliary embedded controller 111 or other programmable integrated circuit, rather than by a separate microcontroller 121. Keyboard controller 121 may also be configured as shown to control individual electro-permanent magnets (EPMs) 197 via addressed key assembly control signals 734 (e.g., general purpose input/output signals) provided to decode and bridge driver circuitry 195, which in turn provides current pulses 450 to selected EPMs 197 that are configured to cause mechanical retraction or extension of individual keys of keyboard matrix 199 in a manner that will be described further herein. Further information on possible tasks and features of keyboard controller 121 may be found illustrated and described in U.S. Pat. Nos. 8,411,029; and 9,272,215, each of which is incorporated herein by reference in its entirety for all purposes.

Although in one embodiment keyboard controller 121 receives digital output (e.g., momentary on) signals from key assemblies 405, it will be understood that in retractable key assemblies 405 may alternatively or additionally produce analog (e.g., variable pressure or variable displacement) output signals that are provided to a keyboard controller 121 or other programmable integrated circuit, such as auxiliary embedded controller 111 or other device. Examples of production and processing of analog output signals may be found in U.S. Pat. Nos. 8,674,941; 8,700,829; 9,343,248; and 9,111,005, each of which is incorporated herein by reference in its entirety for all purposes.

The tasks and features of auxiliary embedded controller 111 may optionally include, but are not limited to, controlling various possible types of optional non-graphics light sources 252 based on multi-channel audio information produced by a computer game (or any other type of sound-generating computer application of application layer 143) executing on CPU 105. For example, auxiliary embedded controller 111 may be optionally configured to communicate lighting control signals to an optional light driver chip 122 to control lighting colors, luminance level and effects (e.g. pulsing, morphing). A light driver chip 122 may be in turn coupled directly via wire conductor to drive light sources 252 (e.g., RGB LEDs such as Lite-On Technology Corp part number LTST-008BGEW-DF_B-G-R or other suitable lighting elements) based on the lighting control signals received from auxiliary EC 111 or MCU 121 as the case may be. Examples of lighting control technology and techniques that may be utilized with the features of the disclosed systems and methods may be found, for example, in U.S. Pat. Nos. 7,772,987; 8,411,029; 9,272,215; U.S. patent application Ser. No. 14/182,647 filed Feb. 18, 2014, U.S. Pat. No. 9,368,300, and U.S. patent application Ser. No. 15/223,613, filed Jul. 29, 2016, each of which is incorporated herein by reference in its entirety for all purposes.

As further shown in FIG. 1, persistent storage (e.g., non-volatile memory) may be additionally coupled to PCH 110, system EC 103, keyboard controller 121 and/or auxiliary EC 111. Such persistent storage may store or contain firmware or other programming that may be used by EC 103 and/or EC 111 to implement one or more user-defined system configurations such as keyboard key retraction options, keyboard lighting options, display lighting options, audio output settings, power management settings, performance monitoring recording settings, designated keyboard macros and/or variable pressure key settings and/or macros, for example, in a manner such as described in U.S. Pat. Nos. 7,772,987; 8,700,829, 8,411,029; 9,272,215; U.S. patent application Ser. No. 14/182,647 filed Feb. 18, 2014, and U.S. Pat. No. 9,368,300, each of which is incorporated herein by reference in its entirety. In one example illustrated in FIG. 1, dedicated non-volatile memory 127 may be directly coupled to auxiliary EC 111 for this purpose as shown.

As shown in FIG. 1, host programmable integrated circuit 105 may be optionally programmed to execute an audio engine 147 to process multi-channel audio data stream from application layer 143 to produce multi-channel audio information that may be further processed and provided as lighting event command signals from CPU 105 to auxiliary controller 111 in a manner such as described in U.S. patent application Ser. No. 15/223,613 filed Jul. 29, 2016, which is incorporated herein by reference in its entirety for all purposes. Auxiliary controller 111 may in turn produce lighting control signals for light driver chip 122 based on the lighting event command signals provided from host programmable integrated circuit 105.

Figure 2A:
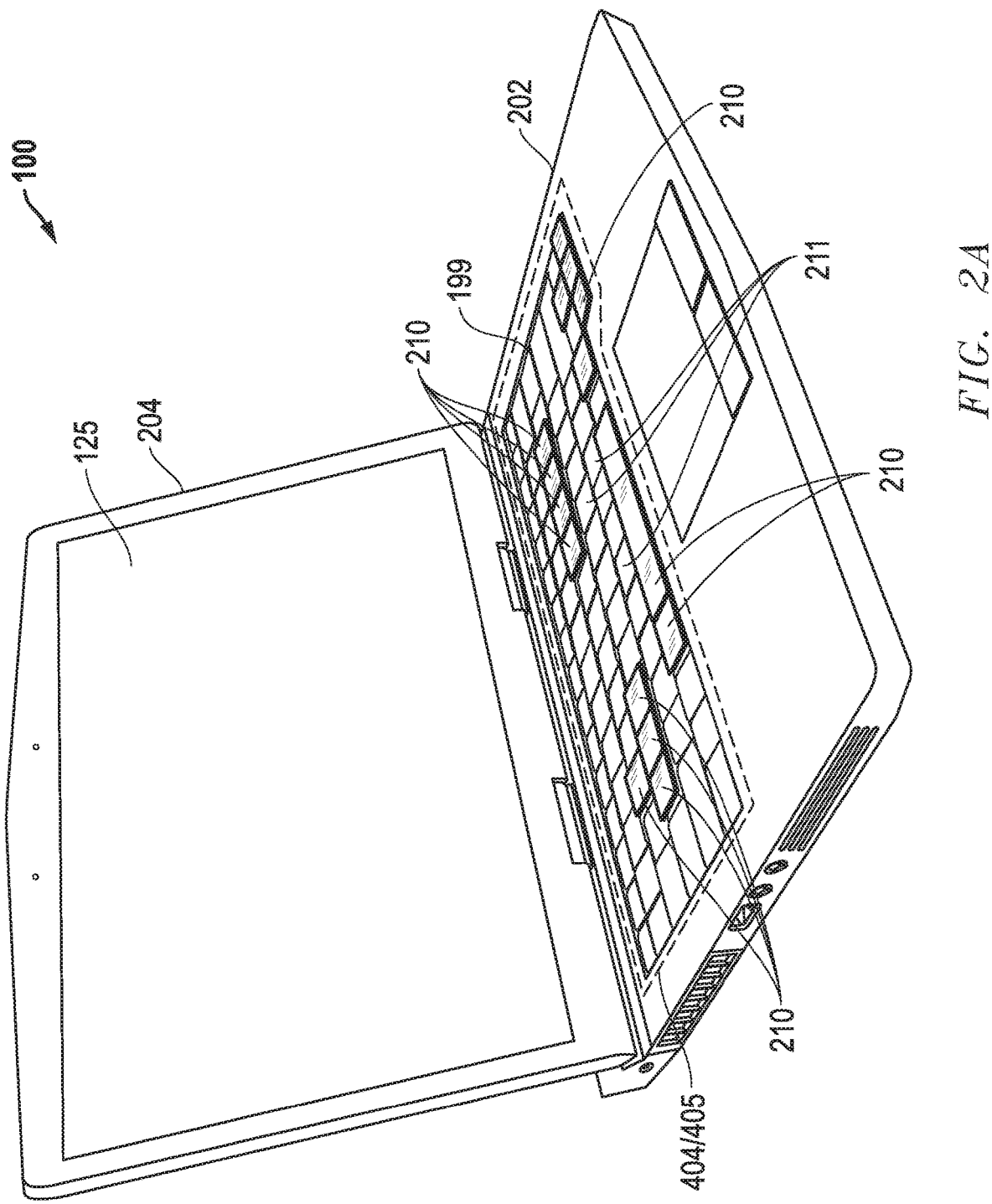
FIG. 2A illustrates a perspective view of a portable information handling system according to one exemplary embodiment of the disclosed systems and methods.
Figure 2B:
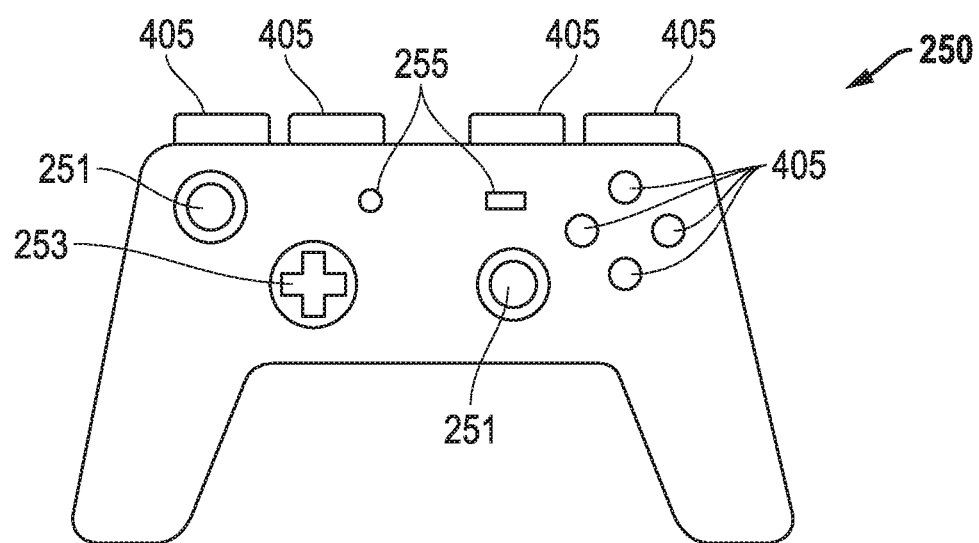
FIG. 2B illustrates an overhead view of a game controller according to one exemplary embodiment of the disclosed systems and methods.
Figure 2C:
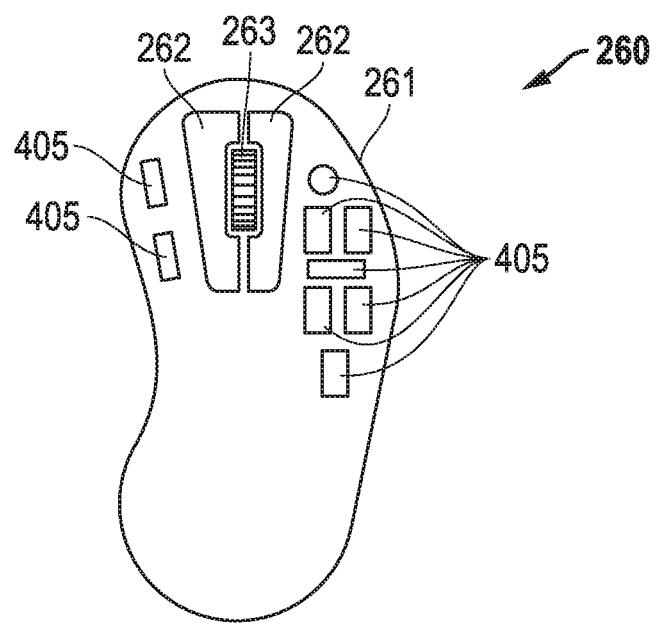
FIG. 2C illustrates an overhead of a mouse according to one exemplary embodiment of the disclosed systems and methods.

FIG. 2A illustrates one embodiment of a portable information handling system 100 as it may be configured in one exemplary embodiment with a keyboard matrix 199 having multiple retractable key assemblies 405. It will be understood that FIG. 2A is exemplary only and that a variety of information handling systems or peripherals thereof may be provided with one or more retractable key assemblies 405 that are actuated by EPMs 197 in a manner as described herein, e.g., including peripherals having retractable key assemblies such as external keyboards, mice, game controllers etc. In this regard, a retractable key assembly 405 as described herein includes, for example, retractable key assemblies 405 that are employed as game controller buttons such as illustrated in FIG. 2B, mouse buttons such as illustrated in FIG. 2C, etc. In this regard, FIG. 2B illustrates one exemplary embodiment of a game controller 250 having retractable key assemblies 405 which may be selectably extended and retracted in a manner as described herein for providing particular signal outputs and/or macro signal outputs for a given user application when depressed, as well as joysticks 251, D-pad 253, and conventional buttons 255. FIG. 2C illustrates one exemplary embodiment of a gaming mouse 260 having retractable key assemblies 405 which may be selectably extended and retracted in a manner as described herein for providing particular signal outputs or macro signal outputs when depressed, as well as mouse wheel 263, and optional conventional left/right mouse buttons 262.

In the embodiment of FIG. 2A, system 100 includes a chassis base component 202 that is hingeably coupled to an integrated display 125 of a chassis lid component 204. As shown, keyboard 199 may be configured with retractable key assemblies 405 having keycaps 404 arranged in a QWERTY layout, although any other arrangement of one or more retractable key assemblies 405 is possible. In FIG. 2, some key assemblies 405 (with keycaps 404) of keyboard matrix 199 are in a mechanically extended position 210 of greater height relative to the keyboard matrix 199 while the remaining key assemblies 405 (with keycaps 404) of keyboard matrix 199 are in retracted condition 211 of a lower height relative to the keyboard matrix. As will be described further herein, selected individual key assemblies of keyboard matrix 199 may be controlled to selectively extend and retract key assemblies 405 with their keycaps 404, e.g., according to user commands, user-created application key map files, application key map files from an application 143 executing on a host programmable integrated circuit 105, from logic executing on keyboard MCU 121, or from any other type or combination of programmable integrated circuit of information handling system 100.

Figure 3:
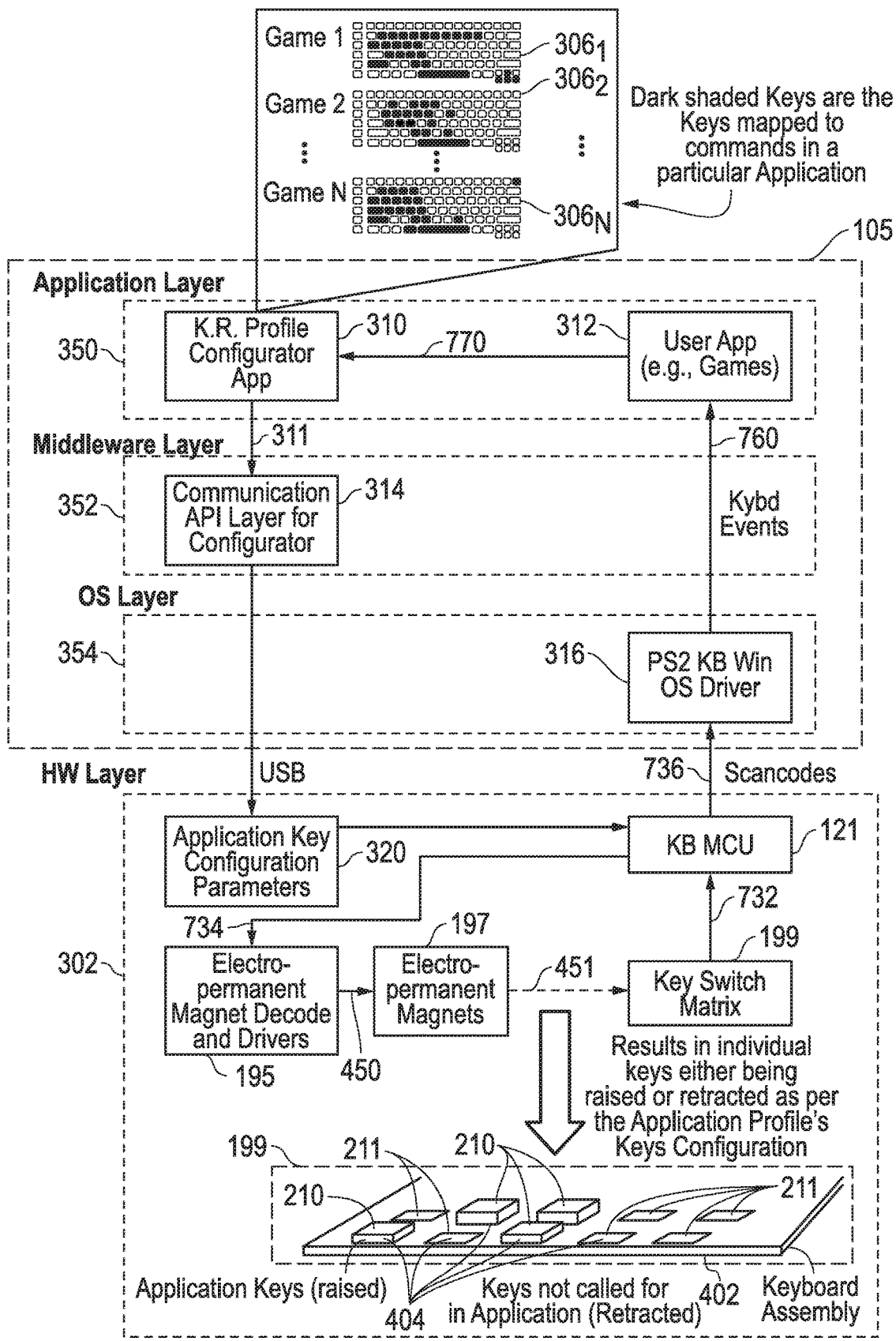
FIG. 3 is a block diagram showing interrelation of various logic and hardware layers of an information handling system according to one exemplary embodiment of the disclosed systems and methods.

FIG. 3 illustrates a block diagram that shows interrelation of various logic and hardware layers of an information handling system 100 according to one exemplary embodiment of the disclosed systems and methods. As shown in FIG. 3, each of an application layer 350, middleware layer 352, and operating system (OS) layer 354 may be executing on a processor such as host programmable integrated circuit 105 or any other suitable one or more programmable integrated circuits such as controller, microcontroller, microprocessor, ASIC, programmable logic device "PLD" such as FPGA, complex programmable logic device "CPLD", etc. As further shown, OS layer 354 may be coupled to components of hardware layer 302 that are responsible for controlling retractable key assemblies 405 of keyboard matrix 199 based on commands received through the OS layer 354, and for receiving digital output signals 732 from individual key assemblies of keyboard matrix 199 when depressed by a user.

Referring to FIG. 3 in further detail, application layer 350 may include multiple user applications 312 such as one or more Windows-based or other OS type of computer games (e.g., first person shooter games and other types of shooter games, fighting games, stealth games, platform games, role playing games, etc.). Non-gaming types of applications 312 may also or alternatively be executing in application layer 350, including Windows-based or other OS type of word processing applications, spreadsheet applications, media player applications, web browser applications, etc. As shown, application layer 350 may also include a key retraction profile configurator application 310 (e.g., present as a stand-alone retractable key configurator application or may be executing as part of a game profile configurator application or control center application such as the Alienware Command Center "AWCC" and "AlienFX Plug-In", both available from Dell Products L.P. of Round Rock, Tex.). Further information on control center applications such as gaming control centers may be found, for example, in U.S. Pat. Nos. 9,111,005, 7,772,987, and United States Patent Application Publication No. 20160117793, each of which is incorporated herein by reference in its entirety.

As described further herein, key retraction profile configurator application 310 may identify or select at least a portion of the retractable key assemblies 405 of keyboard matrix 199 that are to be extended and active at any time for accepting user input for a given user application 312 that is currently in focus on system 100, and/or may select peak depression force level for individual key assemblies 405. Key retraction profile configurator application 310 may make one or both of these selections, for example, based on application key information 770 (e.g., an application key map file designating a portion of the available key assemblies 405 of keyboard matrix 199) communicated from the current application 312 that is in focus, a user selection of extended keys for a given application 312 in focus, a map of extended keys from a stored lookup table of different combinations of extended keys associated with different corresponding applications 312, etc. It will be understood that application key information 770 may be different (e.g., may designate different number and/or identity of key assemblies 405 for extension and retraction, may designate different peak depression force levels for different key assemblies 405, etc.) for each different user application 312.

For example, as shown in FIG. 3, multiple different key mappings $306_1$ to $306_N$ may be defined for respective different games 1 to N that may be executed as applications 312 by host programmable integrated circuit 105. These key mappings 306 may be provided to the key retraction profile configurator application 310 as map files 770, may be retrieved by the key retraction profile configurator application 310 from system storage 135 or memory 107/115, and/or may be defined or edited by a system user. In FIG. 3, the hatched keys of each key map 306 are designated to be extended and active for accepting user input for the current application in focus, with all remaining keys of the given key map 306 designated to be retracted and non-active for accepting any input from a user. As shown, the key mappings $306_1$ to $306_N$ designate a different combination of keys to be retracted and non-active for each different game. It will be understood that similar key mappings may be provided for non-game applications such as word processing software (e.g., in which all keys may be mapped to be extended).

Table 1 below illustrates an example application key map file 770 in the form of an application control list for a given user application 312 that in this example is a first person shooter computer game. Key map file 770 includes a list of the application control commands supported in the user application 312, along with the default key/button, identification of the default control key/button settings for a mouse or retractable keyboard, and the identification of the make and model retractable keyboard, mouse, game controller (not shown), etc. In one embodiment, all retractable key assemblies not listed and assigned to the EPM retractable keyboard in Table 1 may be retracted when the given user application 312 is in focus. Also, included in application key map file 770 of Table 1 are optional peak depression force values that may be designated (and/or user selected) for individual key assemblies 405 for use with a given application 312. As shown in Table 1, in one embodiment values of peak depression force may range from 55 grams to 70 grams. However other peak depression force values are possible, e.g., in one embodiment, values of peak depression force ma range from about 40 grams to about 100 grams, although values less than 40 grams and greater than 100 grams are alternatively possible.

As further shown in FIG. 3, middleware layer 352 may include a communication API 314 to facilitate communication between key retraction profile configurator application 310 and keyboard MCU 121 through OS layer 354. In this regard, profile configurator application 310 may provide user configurable key map information 311 (e.g., as a user configurable application key map file) to communication API 314 before this information is in turn passed to keyboard MCU 121 as application key configuration parameters 320. In one embodiment, application key configuration parameters 320 may reside (be stored) in volatile and/or non-volatile random access memory (RAM) inside keyboard MCU 121, or may alternatively reside in volatile or non-volatile memory separate from keyboard MCU 121 as illustrated in FIG. 3. In any case, keyboard MCU 121 may then access and use the user-configurable key map information within the application key configuration parameters 320 as the basis for controlling retraction and/or peak depression force of individual retractable key assemblies 405 of keyboard matrix 199. Keyboard MCU 121 may be, for example, an ARM Cortex M3 type microcontroller or any other one or more types of programmable integrated circuits suitable for processing digital output signals 732 from key assemblies 405 and controlling extension and retraction of key assemblies 405 in a manner as described herein.

In one embodiment, application key configuration parameters 320 may include a translation of the user configurable key map file information 311 into a format that is understood by EPM decode and drivers 195. In this regard EPM decode and drivers 195 may organize and address the EPMs 197

TABLE 1

| Device Type | Device name | Command | Key/Button | Peak Depression Force, grams |
|---|---|---|---|---|
| Keyboard | EPM Retractable KB | Forward | W | 55 |
| Keyboard | EPM Retractable KB | Back | S | 55 |
| Keyboard | EPM Retractable KB | Left | A | 55 |
| Keyboard | EPM Retractable KB | Right | D | 55 |
| Keyboard | EPM Retractable KB | Sprint | Left Shift | 60 |
| Keyboard | EPM Retractable KB | Go prone | CTRL Key | 60 |
| Keyboard | EPM Retractable KB | Crouch | C | 60 |
| Keyboard | EPM Retractable KB | Jump | Space bar | 60 |
| Keyboard | EPM Retractable KB | Use Equipment | F | 65 |
| Keyboard | EPM Retractable KB | Reload Weapon | R | 65 |
| Mouse | Mouse 1 | Switch Weapons | Wheel Up | 65 |
| Mouse | Mouse 1 | Shoot | Left Mouse Button | 55 |
| Mouse | Mouse 1 | Zoom | Middle Mouse Button | 65 |
| Mouse | Mouse 1 | Aim Down Sight | Right Mouse Button | 65 |
| Keyboard | EPM Retractable KB | Melee | E | 60 |
| Keyboard | EPM Retractable KB | Night vision | N | 65 |
| Keyboard | EPM Retractable KB | Throw Frag Grenade | G | 60 |
| Keyboard | EPM Retractable KB | Throw Smoke, Flash bang Grenades | Q | 60 |
| Keyboard | EPM Retractable KB | Next Weapon | 1 | 65 |
| Keyboard | EPM Retractable KB | Previous Weapon | 2 | 65 |
| Keyboard | EPM Retractable KB | Grenade Launcher/Inventory | 5 | 60 |
| Keyboard | EPM Retractable KB | Air Support | 6 | 65 |
| Keyboard | EPM Retractable KB | Menu | Esc Key | 70 |
| Keyboard | EPM Retractable KB | Multiplayer Text Chat | T | 70 |
| Keyboard | EPM Retractable KB | Multiplayer Team Chat | Y | 70 |
| Keyboard | EPM Retractable KB | Multiplayer Voice Chat | Z | 70 |
| Keyboard | EPM Retractable KB | Multiplayer Vote Yes | F1 | 70 |
| Keyboard | EPM Retractable KB | Multiplayer Vote No | F2 | 70 |
| Keyboard | EPM Retractable KB | Multiplayer Scores | F4 | 70 |
| Keyboard | EPM Retractable KB | Take a Screenshot | F12 | 70 | into (or as) a matrix of rows and columns, and may also ensure that the keycaps 404 of the key assemblies 405 (e.g., corresponding to gaming keys) identified by the output of the game profile configurator application 311 are driven into extended position, and all other key assembly keycaps 404 are driven into retracted position, thus providing magnetic polarity control for each respective EPM 197 of the key assemblies 405 of keyboard matrix 199. In a further embodiment, application key configuration parameters 320 may also be used to block the scan codes 736 from the retracted keys 211 from being reported to the OS 354 via keyboard device drivers 316.

It will be understood that while user configurable key map information 311 may be configurable by a user, it is not necessary that a user actually configure the user configurable key map information 311 before it is passed to keyboard MCU 121 (e.g., user configurable key map information 311 may be the same as application key information 770 originally provided from a user application 312). Moreover, in another embodiment no user configurability is required, and application key information 770 may be passed by key retraction profile configurator application 310 without user modification from application layer 350 to keyboard MCU 121.

Still referring to FIG. 3, keyboard MCU 121 may be coupled as shown to provide addressed key assembly control signals 734 to EPM decode and driver circuitry 195, which in this embodiment are configured to provide a current pulse of either a positive or negative polarity to corresponding individually-addressed EPMs 197 to impart mechanical retraction force 451 to only those key assemblies 405 of keyboard matrix 199 that are designated to be retracted by the current instance of the user-configurable key map information within the application key configuration parameters 320 of keyboard MCU 121 so as to match the current user application 312 that is in focus. Keyboard MCU 121 may also provide addressed key assembly control signals 734 to EPM decode and driver circuitry 195, to provide a current pulse of either a positive or negative polarity to corresponding individually-addressed EPMs 197 of respective key assemblies 405 to impart each identified key assembly 405 of keyboard matrix 199 into an extended (active) position. Alternatively or additionally, keyboard MCU 121 may provide addressed key assembly control signals 734 to cause EPM decode and driver circuitry 195 to provide an appropriate current pulse to corresponding individually-addressed EPMs 197 to impart a desired peak depression force to only those key assemblies 405 of keyboard matrix 199 that are designated by the current instance of the user-configurable key map information within the application key configuration parameters 320 of keyboard MCU 121 so as to match the current user application 312 that is in focus.

As further shown, keyboard MCU 121 may also be coupled to receive digital output signals 732 from individual user-depressed active extended keys 210 of keyboard matrix 199, while ignoring any input signals received from individual retracted keys 211 of keyboard matrix 199, which are treated by MCU 121 as being inactive. Keyboard MCU 121 may be coupled to in turn provide appropriate scan codes 736 to keyboard driver 316 of OS layer 354 (e.g., such as PS2 Windows keyboard driver as shown or other suitable keyboard driver logic) that correspond to the current user-depressed (and active) keys 210. Keyboard driver 316 may then provide user keyboard events 760 corresponding to the scan codes 736 of the currently depressed extended (and active) key/s 210 to the user application 312 that is currently in focus. It will be understood that the embodiment of FIG. 3 is exemplary only, and that in other embodiments a programmable integrated circuit (e.g., such as auxiliary EC 111) separate from keyboard controller 121 may be employed to receive application key configuration parameters 320 and to provide addressed key assembly control signals 734 to EPM decode and driver circuitry 195. It also not necessary that retracted keys 211 be made inactive when retracted.

FIGS. 4A-4D illustrate a single retractable key assembly 405 of keyboard matrix 199 as it may be implemented according to one exemplary embodiment for each of the multiple key assemblies 405 of a keyboard matrix 199. In this embodiment two separate "on-off" EPMs 197 are employed to selectively extend and retract the keycap 404 of the assembly, e.g., in one embodiment with 2 millimeter of keycap travel between extended position 210 and retracted position 211 although keycap travel values of greater or less than 2 millimeters are also possible. Such an on-off EPM 197 may be selectively turned "ON" by a current pulse 450 to produce an attractive magnetic force, and turned "OFF" by another current pulse so that it does not produce an attractive magnetic force. In a further embodiment described herein, at least EPM 197b may be controlled to produce different magnitudes of attractive magnetic force by varying the amplitude of a current pulse 450 that is applied to turn "ON" the EPM 197 (e.g., by using pulse width modulated signal to control current amplitude or other suitable current control technique and/or circuitry) so as to vary the degree of magnetization, which in turn varies the upward bias applied to keycap 404 and the resulting required peak depression force for the key switch mechanical structure 403 of key assembly 405, i.e., to translate into different typing forces exhibited by the same key assembly 405.

Figure 4A:
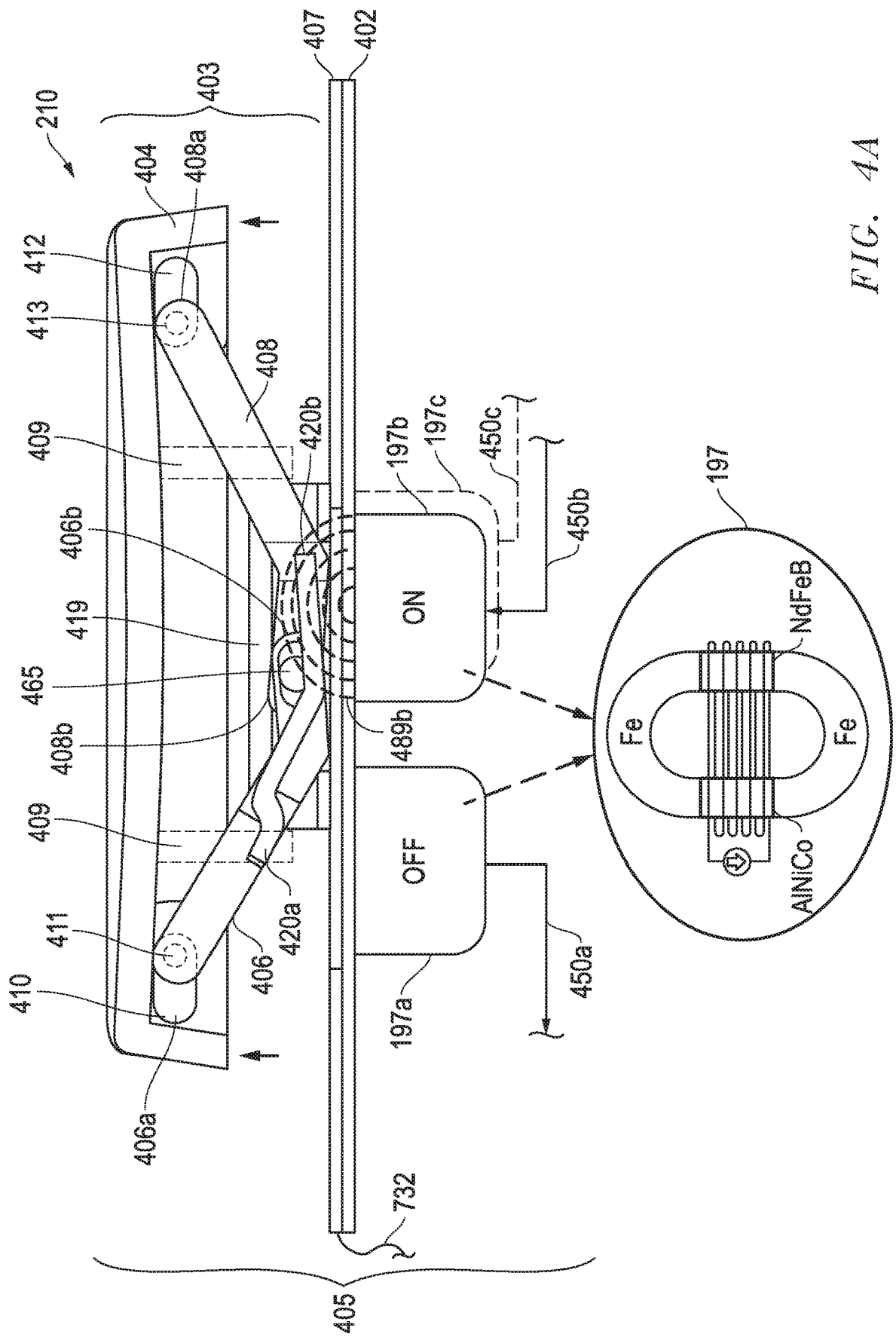
FIG. 4A illustrates a side cross section view of a retractable key assembly according to one exemplary embodiment of the disclosed systems and methods.

In one embodiment illustrated in the inset of FIG. 4A, each of EPM's 197 may include two permanent magnet material components (permanent magnets) with very different intrinsic coercivities (e.g., such as relatively low coercivity AlNiCo and relatively high coercivity permanent neodymium (NdFeB) magnetic materials), placed side by side with their polarities in parallel direction. In such an embodiment, a magnetically permeable material (such as Iron) may be placed as a shunt on the ends of the magnetic materials, completely covering the ends of both magnetic materials. Also in this embodiment, a conductive wire (e.g., copper or other suitable conductive wire) is wrapped in a coil around both magnetic materials, e.g., covering the entire length of the magnetic materials per the exemplary illustration of FIG. 4A. This configuration may be advantageous, for example, for use with relative small scale applications. However, in alternative embodiments a conductive wire may be wrapped in a coil around only one of the magnetic materials, such as the AlNiCo. In the illustrated embodiment, the coercivity values of the two magnetic materials may be selected to be so different so as to allow use of the coil to easily generate a magnetic field that is stronger than the intrinsic coercivity and fully saturated values of a first one of the magnetic materials (e.g., Alnico magnetic material), but that is less than the intrinsic coercivity value of the second one of the magnetic materials (e.g., NdFeB magnetic material). So in such an embodiment, the current pulse will re-magnetize the first magnetic material (e.g., Alnico) without affecting the second magnetic material (e.g., NdFeB).

Thus, in one embodiment, the relatively low intrinsic coercivity first magnetic material (e.g., semi-hard_AlNiCo) material may be magnetized and demagnetized by different polarity current pulses 450 passed through the conductor coil. In this regard, a current pulse 450 passed through the coil around the magnetically soft AlNiCo material can re-magnetize that material in a desired direction, and the current pulse 450 only has to be present long enough to generate a magnetic field substantially strong enough to re-magnetize the AlNiCo material in the desired direction. When the current pulse 450 is switched off, the AlNiCo will hold that polarization until another strong field is presented. When both the AlNiCo and NdFeB are magnetically polarized in the same direction, the magnetic fields exit the iron shunts to interact with the external world. When the AlNiCo and NdFeB magnets are polarized in opposite directions, the fields loop between the two magnets entirely inside the iron shunts to cancel themselves out, essentially turning off the magnet to the outside world. The amount of magnetic field exiting the iron shunts (field strength) may also be controlled by varying the amplitude of the current pulse 450.

In one embodiment, the amplitude of a current pulse 450 may be controlled to be small enough that the magnetic field it generates is greater than the relatively lower intrinsic coercivity magnetic material (e.g., AlNiCo) but at the same time less than the relatively higher intrinsic coercivity value of the second magnetic material (e.g., NdFeB) of an EPM 197. In this regard, once steady state current flow through the coil is achieved, the magnetic field generated by the coil is proportional to the number of turns in the coil and the amplitude of the current. Given that the coil has a fixed number of turns (windings) and therefore a fixed resistance, voltage applied to the coil may be varied to control the resulting current 450 through the coil of an EPM 197.

Figure 4B:
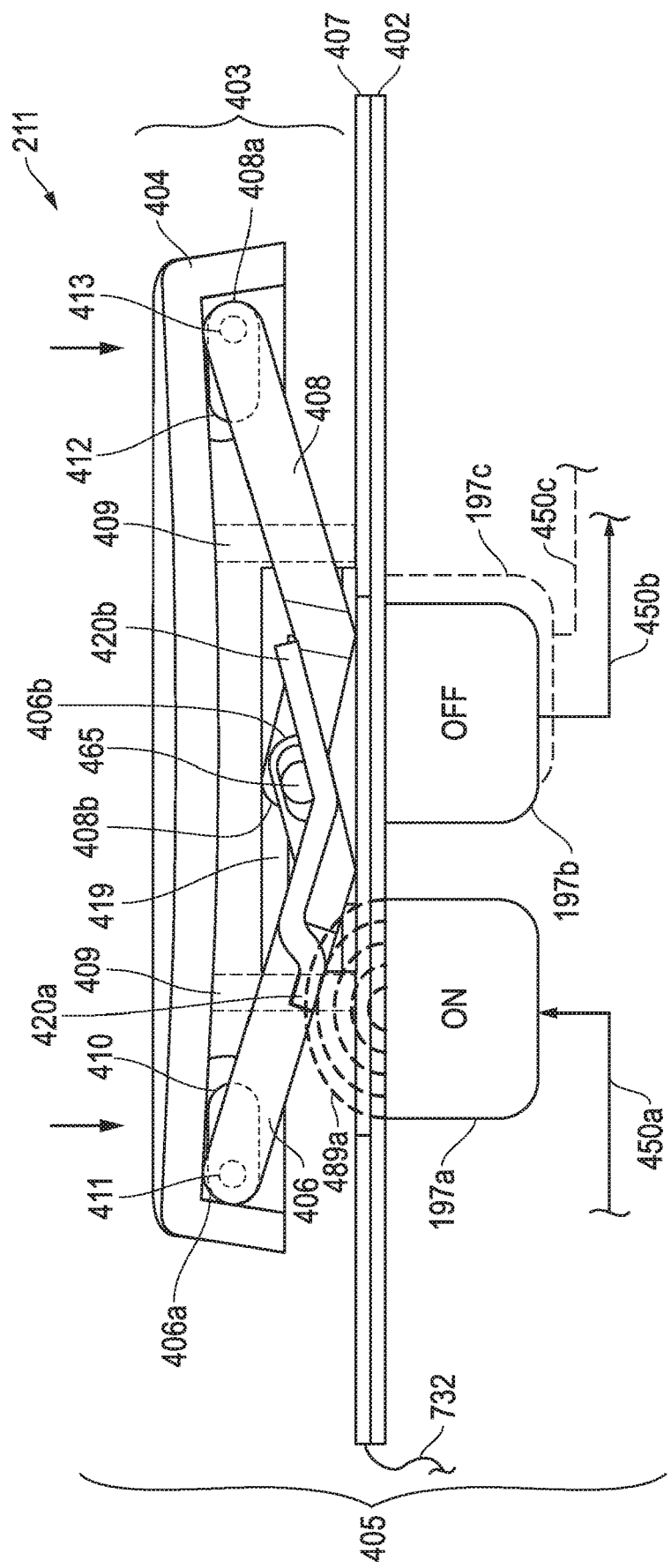
FIG. 4B illustrates a side cross section view of a retractable key assembly according to one exemplary embodiment of the disclosed systems and methods.
Figure 4C:
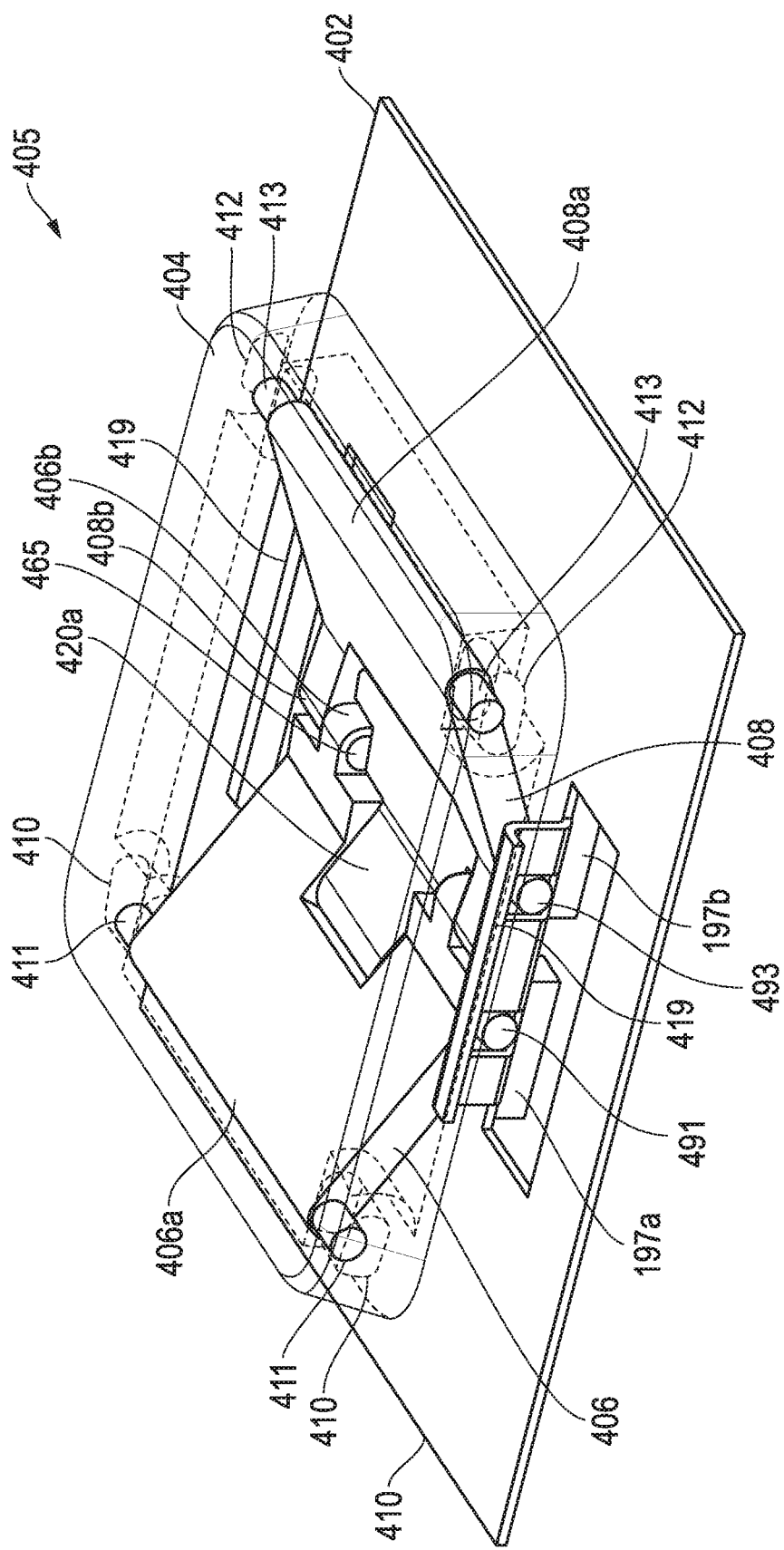
FIG. 4C illustrates an overhead perspective view of a retractable key assembly according to one exemplary embodiment of the disclosed systems and methods.
Figure 4D:
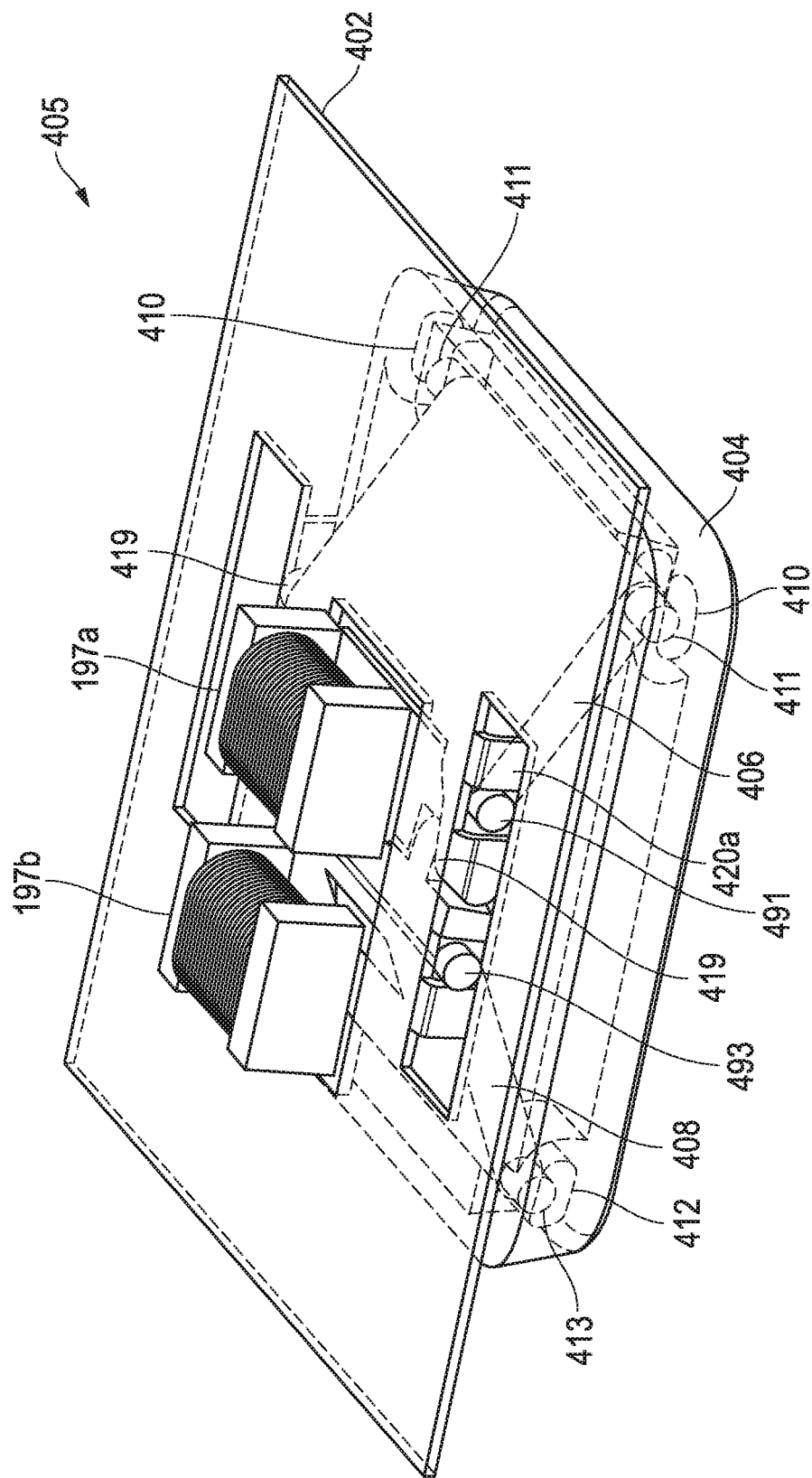
FIG. 4D illustrates an underside perspective view of a retractable key assembly according to one exemplary embodiment of the disclosed systems and methods.

In FIGS. 4A-4D, a retractable key assembly 405 of this embodiment has a key switch mechanical structure 403 that includes a movable keycap component 404 (e.g., plastic or other suitable material) that is supported above a base component (e.g., a keyboard base plate 402 such as planar sheet metal, plastic, etc.), by two opposing angled support arms (e.g., lever arms or scissor components) 406 and 408. In one embodiment, keyboard base plate 402 may be a common planar base plate that extends beneath a plurality of retractable key assemblies 405 of keyboard matrix 199, and may contain, support and/or be positioned above circuitry such as keyboard or peripheral device circuitry (e.g., key press detection or key signal output circuitry configured to output a key output signal for each depressed key assembly 405, lighting circuitry, etc.). For example a key press detection membrane 407 may be positioned on top of a metal base plate 402 and aligned with a rigid pin 409 downwardly projecting from underside of keycap 404 (shown in dashed outline in FIGS. 4A and 4B) such that an output key signal 732 unique to the given key assembly 405 is produced at a key signal output when pin 409 contacts and compresses key press detection membrane as illustrated in FIG. 4B. Optional keyboard lighting may also be provided from a lighting element (e.g., LED or light pipe) positioned below keyboard base plate 402 to direct light upward toward keyboard base plate 402. One or more aligned openings may be provided within keyboard base plate 402 and membrane 407 beneath keycap 404 to allow the light to shine on the underside of keycap 404 and through optional light transmission features (e.g., opening/s or translucent features) provided within keycap 404 to be observed by a user positioned above the keycap 404. Further information on example keyboard matrix structure and circuitry may be found in U.S. Pat. Nos. 8,674,941; 9,246,487; 8,748,767; and 9,368,300; each of the foregoing being incorporated herein by reference in its entirety for all purposes.

The retractable key assembly 405 of this embodiment is shown with keycap 404 in extended position 210 in the cross-section view of FIG. 4A, and is shown with keycap 404 in retracted position 211 in the cross-section view of FIG. 4B. As further shown in FIGS. 4A-4D, movable angled support arm components 406 and 408 are coupled to pivot relative to base plate 402 about respective pivot points or fulcrums, e.g., in this case provided in the form of pivot pins 491 and 493 that extend outwardly from opposing sides of support arms 406 and 408 and that are received by corresponding support rails 419 that extend upward from base plate 402. First and proximal ends 406a and 408a of respective angled support arms 406 and 408 each include opposing pins 411 or 413 that are slidably received in respective channels 410 and 412 defined in corresponding opposing sides of keycap 404 as shown. In this configuration, keycap 404 is retractable from an extended position 210 of FIG. 4A to retracted condition 211 of FIG. 4B by virtue of downward pivot of first ends 406a and 408a of respective angled support arms 406 and 408 about pins 491 and 493, and by simultaneous outward sliding of opposing pins 411 within channels 410 and 412, as shown in FIG. 4B. As further shown, a sliding coupler 465 may be provided to couple second ends 406b and 408b of respective angled support arms 406 and 408 together in movable relationship to help ensure horizontally-even upward and downward displacement of keycap 404.

Also shown in FIGS. 4A-4D is movable angled magnetically permeable (e.g., ferromagnetic) body component (e.g., ferromagnetic lever or rocker plate 420) that has a first end 420a that is coupled to or otherwise integrated with first angled support arm 406 to mechanically secure or tie together first end 420a of angled magnetically permeable body 420 and first angled support arm 406 together in fixed relationship so that they move together, e.g., in this embodiment a first end 420a of angled magnetically permeable plate 420 is received (e.g., inserted into or surrounded by molded support arm 406) within a corresponding recess 423 defined in support arm 406 as shown. However, one or more magnetically permeable plates may be otherwise secured or integrated with an angled support arm in any other manner suitable for implementing the key retraction capability described further herein. In one embodiment, angled support arms 406 and 408 may be constructed of non-magnetically permeable material (e.g., non-magnetically permeable plastic) so as to not to interact with magnetic field of EPMs 197 and/or their effect on angled magnetically permeable plate 420 during operation.

Examples of ferromagnetic materials that may be employed as magnetically permeable materials in the embodiments herein (e.g., as shunts, plate, levers, etc.) include, but are not limited to, iron, nickel, cobalt, or alloys including some amount of one or more of those elements. For example, in one exemplary embodiment, a magnetically permeable lever or plate 420 may be composed of a ferromagnetic alloy having high magnetic permeability, e.g., such as 400 series stainless steels, or "electrical-steel" or "silicon-steel" having relative high magnetic permeability and relatively low coercivity. Examples of permanent magnet materials that may be employed in the embodiments herein (e.g., for components of EPMs 197, attached to angled support arms, etc.) include, but are not limited to Neodymium (Nd), Samarium Cobalt, Alnico, Ceramic, etc.

As shown in FIG. 4A, at least two EPMs 197 may be provided on, within or beneath baseplate 402, e.g., with a first EPM 197a being at least partially aligned with and beneath (or otherwise positioned to emit an external magnetic field that acts on) the first end 420a of angled magnetically permeable plate 420 and a second EPM 197b being at least partially aligned with and beneath the (or otherwise positioned to emit an external magnetic field that acts on) second end 420b of angled magnetically permeable plate 420. EPMs 197 may be mounted beneath a solid base plate 402 (where baseplate 402 is non-magnetically permeable material such as plastic), or may be mounted within or beneath corresponding aligned openings defined within baseplate 402 (where baseplate 402 is magnetically permeable material such as steel or is non-magnetically permeable material such as plastic). A current pulse 450b of appropriate polarity may be provided to EPM 197b to turn ON the external magnetic field 489b of EPM 197b while at the same time a current pulse 450a of appropriate polarity may be provided to EPM 197a to turn OFF the external magnetic field 489a of EPM 197a, and vice-versa. In this embodiment, EPMs 197a and 197b are positioned to selectably emit an upward external magnetic field that is at least partially aligned with (or acts on) first end 420a and second end 420b of angled magnetically permeable plate 420, respectively. EPMs 197a and 197b are also positioned to selectably emit an upward external magnetic field that is not aligned with (or does not act on) second end 420b and first end 420a of angled magnetically permeable plate 420, respectively. Thus, external magnetic fields of EPMs 197a and 197b may be controlled so that an upward external magnetic field is applied to and acts on only one end 420a or 420b of magnetically permeable plate 420 at a time.

To extend the keycap 404 of FIG. 4A upward, the external magnetic field of EPM 197b may be placed in the ON condition and the external magnetic field of EPM 197a may at the same time be placed in the OFF condition to attract the second end 420b of angled magnetically permeable plate 420 downward toward baseplate 402. When the second end 420b of angled magnetically permeable plate 420 is attracted downward toward baseplate 402 it causes the first end 420a of angled magnetically permeable plate 420 to separate and move upwards and away from baseplate 402 together with coupled first end 406a of first angled support arm 406. Keycap 402 is in turn moved upwards by upward movement of first end 406a of support arm 406 while its corresponding pin 411 slides inward within channel 410. This upward movement of keycap 404 is mechanically transmitted through keycap 404 to cause simultaneous upward movement of second end 408a of second angled support arm 408 while its corresponding pin 411 slides inward within channel 412 as shown. In the extended position 210 of FIG. 4A, the amount of applied upward bias force that resists downward depression of key assembly 405 by a user (and that returns key assembly 405 upward after it has been depressed by a user) is provided by virtue of the amount of downward attractive force applied to second end 420b of angled magnetically permeable plate 420 by EPM 197b in its ON condition.

Thus it is optionally possible in one embodiment to vary the peak depression force required by a user to depress the extended key assembly 405 by varying the amplitude of the current pulse 405 applied to turn "ON" EPM 197b, e.g., current pulses 450 may be applied to EPM 197b that are of different selectable amplitudes greater than minimally required to extend key assembly 405 so as to result in different selectable magnitudes of external attractive magnetic force emitted from EPM 197b that attracts the second end 420b of angled magnetically permeable plate 420 downward toward baseplate 402 so as to vary the peak depression force required by a user to overcome the magnetic force emitted from EPM 197b and depress the extended key assembly to cause output of key signal from key assembly 405.

Referring to FIG. 4B, keycap 404 may be retracted by placing the external magnetic field of EPM 197a in the ON condition (e.g., by applying current pulse 450a of opposite polarity) to attract the first end 420a of angled magnetically permeable plate 420 downward toward baseplate 402 at the same time that the external magnetic field of EPM 197b is placed in the OFF condition (e.g., by applying current pulse 450b of opposite polarity). When the first end 420a of angled magnetically permeable plate 420 is attracted by EPM 197a it moves downwards toward baseplate 402 together with coupled first end 406a of first angled support arm 406 as shown in FIG. 4B. This in turn causes keycap 402 to move downwards together with first end 406a of angled support arm 406 while its corresponding pin 411 slides outward within channel 410. This downward movement of keycap 404 is mechanically transmitted through keycap 404 to cause simultaneous downward movement of second end 408a of second angled support arm 408 while its corresponding pin 411 slides outward within channel 412 as shown.

As further shown in FIGS. 4A-4B it is optionally possible to include one or more additional EPMs 197x that are positioned adjacent EPM 197b and also at least partially aligned with (or otherwise positioned to emit an external magnetic field that acts on) and beneath the second end 420b of angled magnetically permeable plate 420. as shown. In this embodiment, each additional EPM 197x may be optionally and selectably turned "ON" by a separate current pulse 450x at the same time that EPM 197b is turned "ON" by current pulse 450b, i.e., to selectably and optionally provide an increased magnitude of external attractive magnetic force emitted from a combination of EPMs 197b and 197x to attract the second end 420b of angled magnetically permeable plate 420 downward toward baseplate 402 with greater force than when only EPM 197b is turned "ON" by current pulse 450b. In this way the peak depression force required by a user to overcome the magnetic force emitted from EPM 197b may be increased when desired by turning "ON" both EPMs 197b and 197x (while EPM 197a is "OFF"), and may be decreased again by turning "ON" EPM 197b with EPM 197a "OFF" and with all or a portion of additional EPMs 197x turned "OFF".

FIGS. 5A-5D illustrate a single retractable key assembly 405 of keyboard matrix 199 as it may be configured according to another exemplary embodiment of the disclosed systems and methods, and as it may be implemented for each of the multiple keycaps 404 of a keyboard matrix 199. In this embodiment, keycap 404 is in extended position 210 in the cross-section view of FIG. 5A, and is shown with keycap 404 in retracted position 211 in the cross-section view of FIG. 5B. As further shown in FIGS. 5A-5D, angled support arms 406 and 408 of key switch mechanical structure 403, as well as base plate 402, are provided to operate in a manner similar to that described in relation to FIGS. 4A-4D. Also, in the embodiment of FIGS. 5A-5D, a first end 420a of angled magnetically permeable plate 420a is coupled to or otherwise integrated with first angled support arm 406 to secure these components 420 and 406 together in movable relationship in similar manner as described in relation to FIGS. 4A-4D.

As shown in FIGS. 5A-5D, a single "on-off" EPM 197 may be provided on, within or beneath baseplate 402 and at least partially aligned with and beneath (or otherwise positioned to emit an external magnetic field that acts on) the second end 420b of angled magnetically permeable plate 420 with no EPM 197 aligned with (or positioned to emit an external magnetic field that acts on) the first end 420a of angled magnetically permeable plate 420. EPM 197 of FIGS. 5A-5D may be mounted relative to base plate 402 as previously described in relation to FIGS. 4A-4D. In the embodiment of FIGS. 5A-5D, a current pulse 450 of appropriate polarity may be provided to EPM 197 to turn ON an attractive external magnetic field 489 of EPM 197 that is at least partially aligned with (or otherwise positioned to emit an external magnetic field that acts on) and attracts first end of 420a of angled magnetically permeable plate 420, and of a current pulse 450 of opposite polarity may be provided to turn OFF the attractive external magnetic field 489 of EPM 197 so as to not attract first end of 420a of angled magnetically permeable plate 420. As further shown in FIGS. 5A-5D, at least one resilient material component in the form of a semi-elliptical or leaf spring 530 (e.g., steel wire spring, plastic spring, etc.) is provided that is fixedly coupled relative to base plate 402, e.g., coupled to at least one of rails 419 at its center by connector 421 or otherwise coupled directly or indirectly to base plate 402. In the embodiment of FIGS. 5A-5D, opposing ends of spring 530 are positioned to contact and rest on bosses 501 and 503 that extend outwardly from the opposite sides of angled support arms 406 and 408, respectively. Other types of springs that may be alternately employed for the same purpose include tension coil spring/s, torsion spring/s, etc.

Figure 5A:
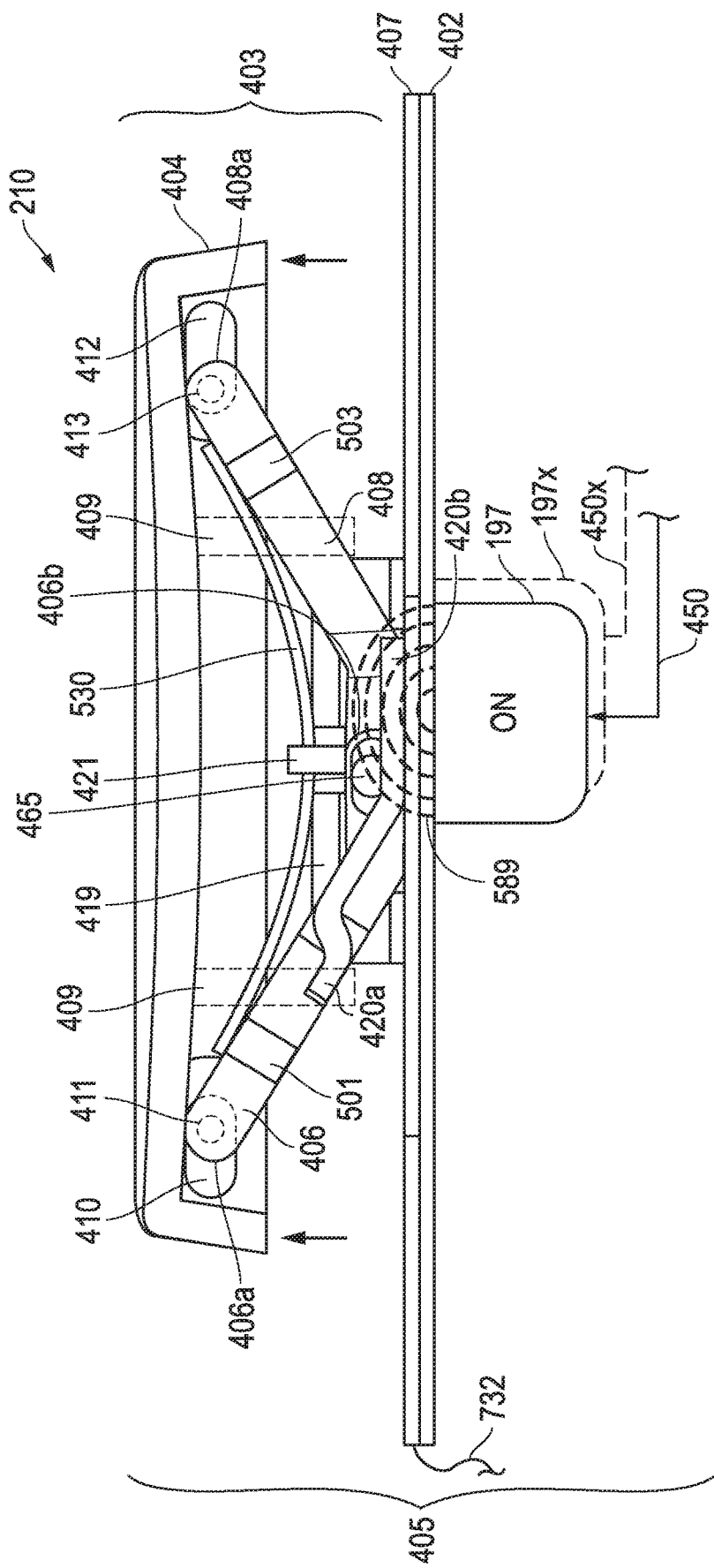
FIG. 5A illustrates a side cross section view of a retractable key assembly according to one exemplary embodiment of the disclosed systems and methods.
Figure 5B:
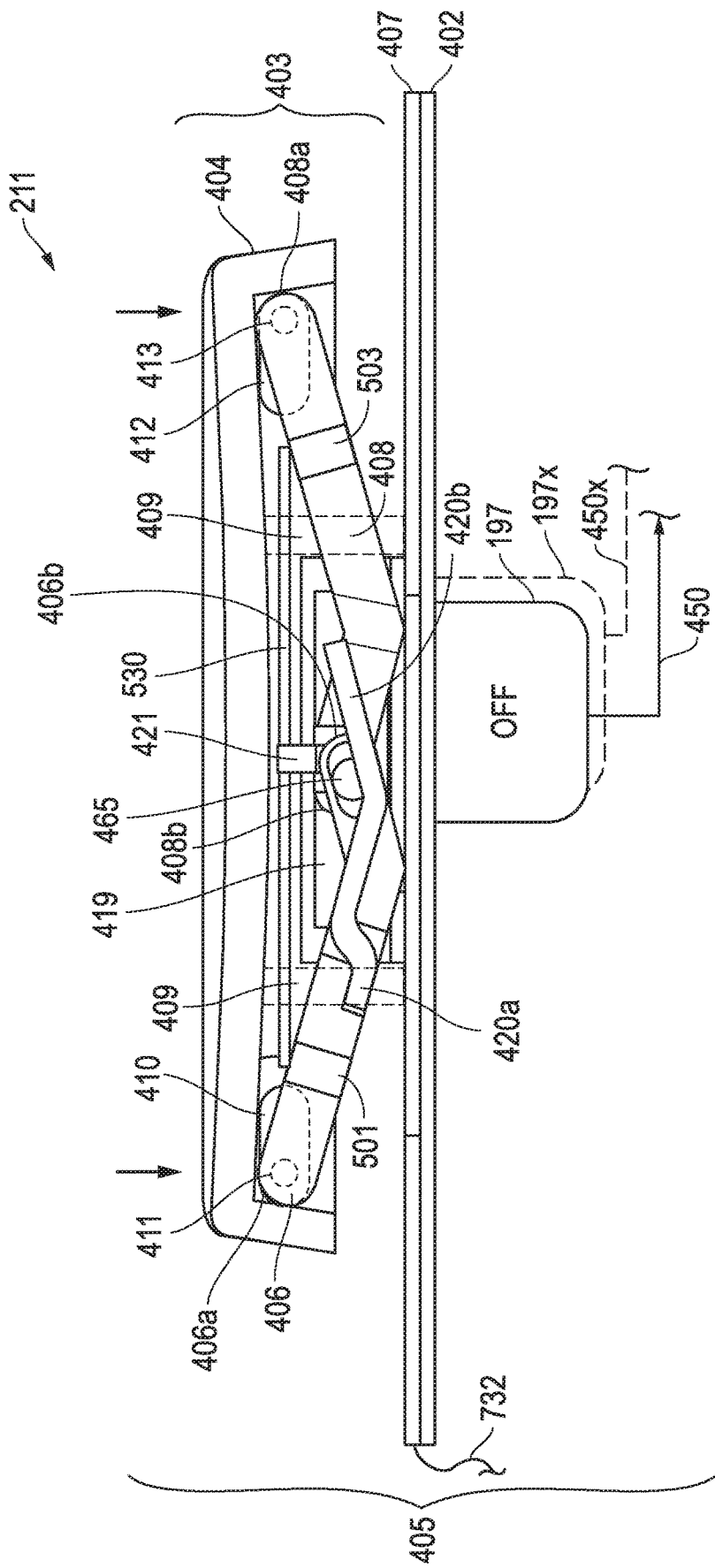
FIG. 5B illustrates a side cross section view of a retractable key assembly according to one exemplary embodiment of the disclosed systems and methods.
Figure 5C:
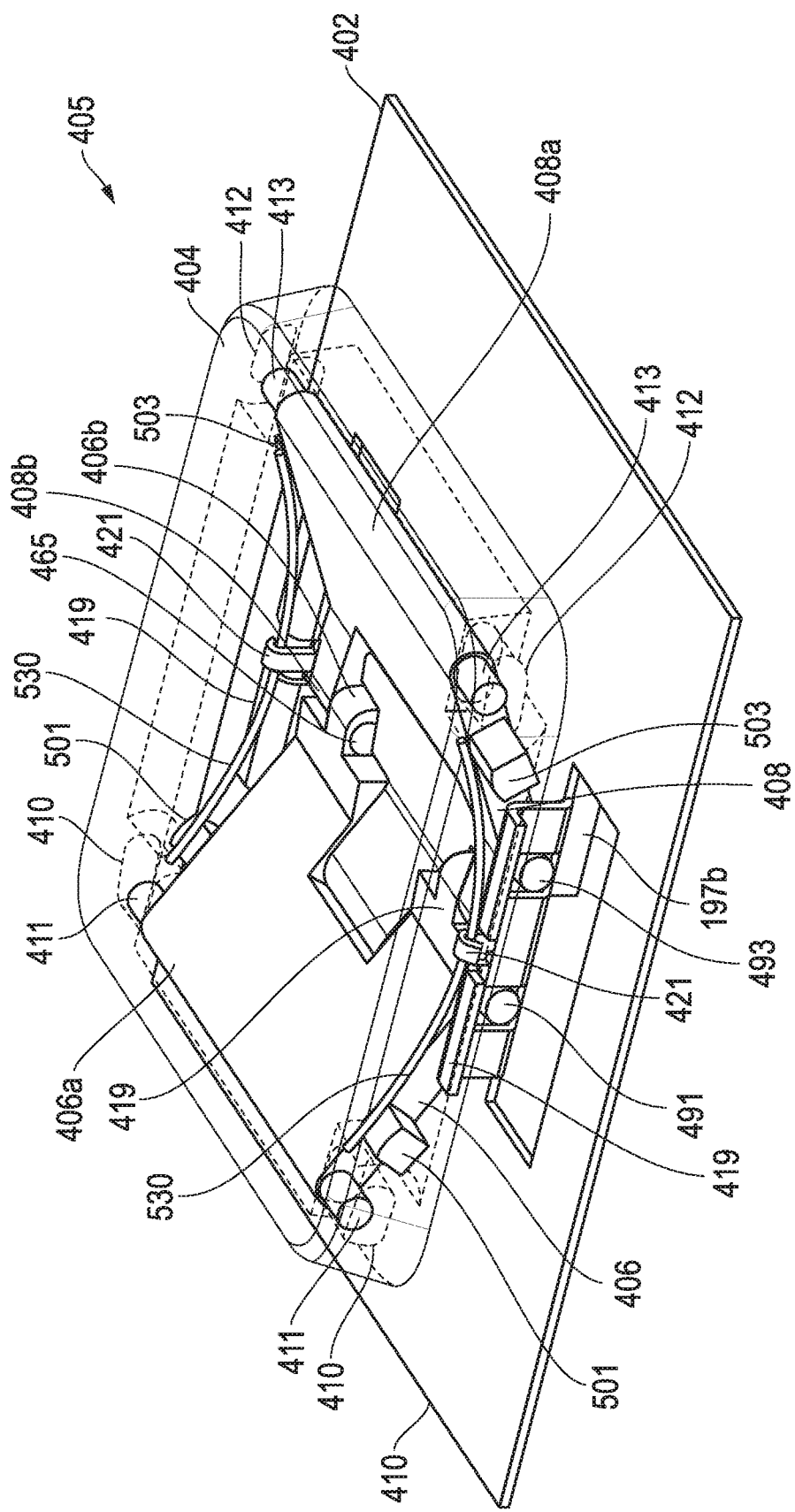
FIG. 5C illustrates an overhead perspective view of a retractable key assembly according to one exemplary embodiment of the disclosed systems and methods.
Figure 5D:
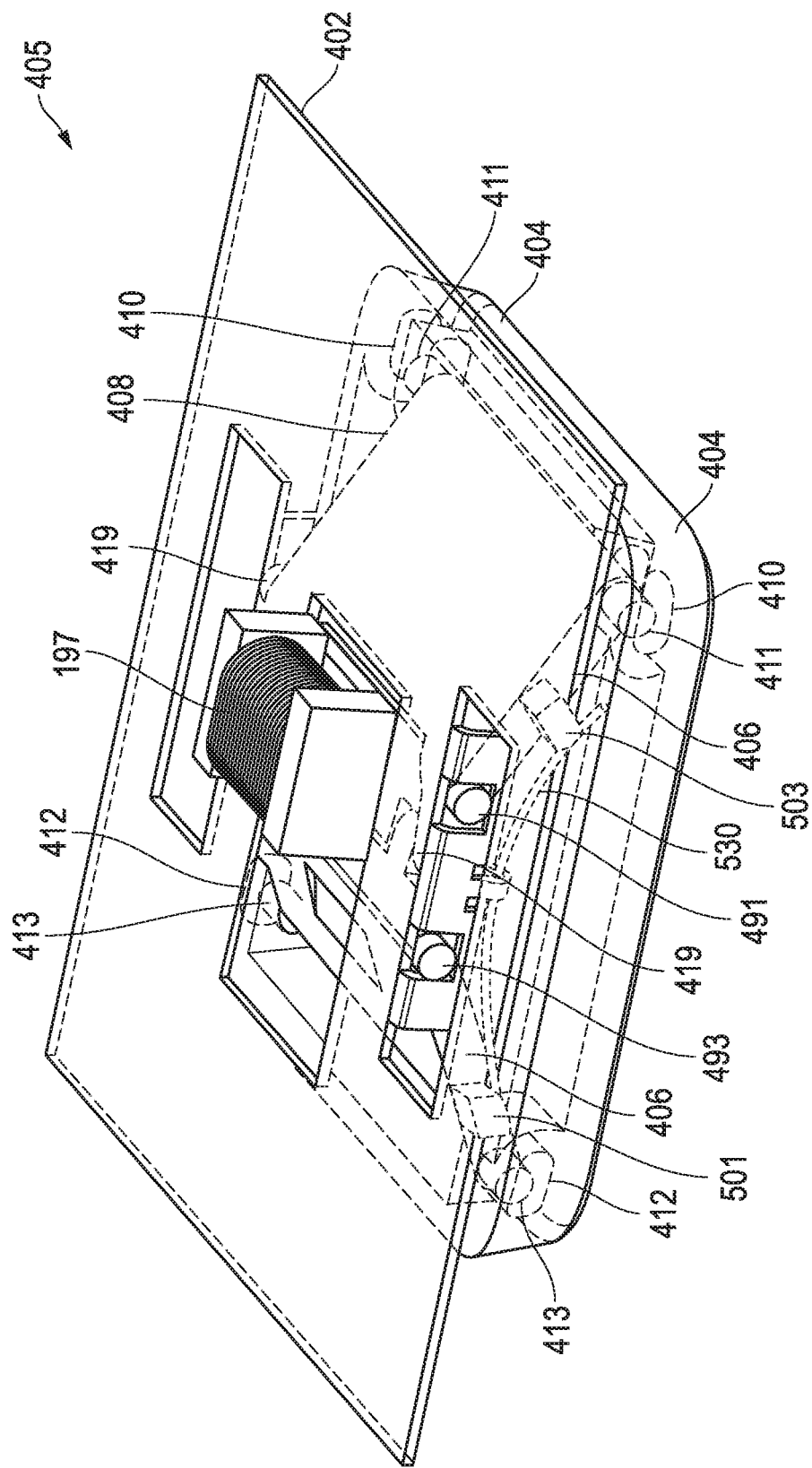
FIG. 5D illustrates an underside perspective view of a retractable key assembly according to one exemplary embodiment of the disclosed systems and methods.

As shown in FIGS. 5C and 5D, a separate spring 530 may be provided at each of opposing sides of angled support arms 406 and 408, and a corresponding pair of bosses 501 and 503 may be provided to extend from each of opposing sides of angled support arms 406 and 408. In such an embodiment, the separate springs 530 may be configured to operate in tandem on opposing sides of the retractable key assembly. Each spring 530 may be positioned and tensioned between a connector 421 and corresponding bosses 501 and 503 so as to bias keycap 404 in downward direction toward retracted position 211 to maintain keycap 404 in a retracted position 210 in the absence of an applied attractive external magnetic field of EPM 197 (i.e., when attractive external magnetic field of EPM 197 is turned OFF) as shown in FIG. 5B. EPM 197 may be configured to produce an attractive external magnetic field of sufficient strength to attract the second end 420b of angled magnetically permeable plate 420 downward toward baseplate 402 and raise the first end of 420a of angled magnetically permeable plate 420 with sufficient force to overcome the downward bias of spring 530 as illustrated in FIG. 5A. Thus, to extend the keycap 404 of FIG. 5A upward to extended position 210, the external magnetic field of EPM 197 may be placed in the ON condition to attract the second end 420b of angled magnetically permeable plate 420 downward toward baseplate 402 to cause the first end 420a of angled magnetically permeable plate 420 to separate and move upwards and away from baseplate 402 together with coupled first end 406a of first angled support arm 406. Keycap 404 may be retracted by placing the external magnetic field of EPM 197 in the OFF condition to release the second end 420b of angled magnetically permeable plate 420 to allow spring 530 to move keycap 404 in downward direction toward retracted position 211.

Although the key switch mechanical structure 403 embodiment of FIGS. 5A-5D employs a leaf spring 530, it will be understood that any other suitable type of one or more springs (e.g., tension coil spring/s, torsion spring/s, etc.) may be provided and configured to bias a keycap 404 in downward direction toward retracted position 211. In an alternate embodiment, one more springs may be provided to bias a keycap 404 in an upward direction toward an extended position 210. In such an alternate embodiment, a single EPM 197 may be positioned be provided on, within or beneath baseplate 402 and aligned with (or otherwise positioned to emit an external magnetic field that acts on) the first end 420a of angled magnetically permeable plate 420 with no EPM 197 aligned with (or positioned to emit an external magnetic field that acts on) the second end 420a of angled magnetically permeable plate 420 such that a current pulse 450 of appropriate polarity may be provided to EPM 197 to turn ON an attractive external magnetic field of EPM 197 to attract first end 420a of angled magnetically permeable plate 420 downward so as to retract keycap 404 in a downward direction toward a retracted position 211, and a current pulse 450 of opposite polarity may be provided to turn OFF the attractive external magnetic field of EPM 197 so as to move bias keycap 404 in an upward direction toward extended position 211.

In the embodiment of FIGS. 5A-5D, it is optionally possible in one embodiment to vary the peak depression force required by a user to depress the extended key assembly 405 by varying the amplitude of the current pulse 405 applied to turn "ON" EPM 197, e.g., current pulses 450 may be applied to EPM 197 that are of different selectable amplitudes greater than minimally required to extend key assembly 405 against the downward bias of spring 530 so as to vary the peak depression force required by a user touch together with downward bias of spring 530 to overcome the magnetic force emitted from EPM 197 to depress the extended key assembly to cause output of a key signal from key assembly 405.

As further shown in FIGS. 5A-5B it is optionally possible to include one or more additional EPMs 197x that are positioned adjacent EPM 197 and also at least partially aligned with and beneath (or otherwise positioned to emit an external magnetic field that acts on) the second end 420b of angled magnetically permeable plate 420 as shown. In this embodiment each EPM 197x may be optionally and selectably turned "ON" by a separate current pulse 450x at the same time that EPM 197 is turned "ON" by current pulse 450, i.e., to selectably and optionally provide an increased magnitude of external attractive magnetic force emitted from a combination of EPMs 197 and 197x to attract the second end 420b of angled magnetically permeable plate 420 downward toward baseplate 402 with greater force than when only EPM 197 is turned "ON" by current pulse 450. In this way the peak depression force required by a user together with downward bias of spring 530 to overcome the magnetic force emitted from EPM 197 may be increased when desired by turning "ON" both EPMs 197 and 197x, and may be decreased again by turning "ON" EPM 197 with all or a portion of additional EPMs 197x turned "OFF".

FIGS. 6A-6D illustrate a single retractable key assembly 405 of keyboard matrix 199 as it may be configured according to another exemplary embodiment of the disclosed systems and methods, and as it may be implemented for each of the multiple keycaps 404 of a keyboard matrix 199. In this embodiment, keycap 404 is in extended position 210 in the cross-section view of FIG. 6A, and is shown with keycap 404 in retracted position 211 in the cross-section view of FIG. 6B. As further shown in FIGS. 6A-6D, key switch mechanical structure 403 has angled support arms 406 and 408, as well as base plate 402, that are provided to operate in a manner similar to that described in relation to FIGS. 4A-4D. In this embodiment, at least one permanent magnet 610 may be provided in or on a second end 406b of angled support arm 406 as shown (e.g., as a bar-shaped magnet, or other suitable shape having two magnetic poles oriented as shown). In this embodiment, permanent magnet material of permanent magnet 610 may be any permanent magnet material having a magnetization, or magnetic field strength and polarity, that is not affected by current pulses 450. Examples of suitable permanent magnet materials for use as permanent magnet 610 include, but are not limited to, Neodymium grade N35, N40, N42, N45, N52, etc. magnetic materials.

As shown in FIGS. 6A-6D, a single reversible polarity or polarity-switching EPM 197 may be provided on, within or beneath baseplate 402 and at least partially aligned with and beneath (or otherwise positioned to emit an external magnetic field that acts on) the second end 406b of angled support arm 406 with no EPM 197 aligned with (or positioned to emit an external magnetic field that acts on) the first end 406a of angled support arm 406. In one embodiment illustrated in the insets of FIGS. 6A and 6B, each of polarity switching EPM's 197 of FIG. 6A may include a single permanent magnet or magnetic material component (e.g., AlNiCo or other suitable magnetic material such as Neodymium, etc.), with a conductive wire (e.g., copper or other suitable conductive wire) wrapped in a coil around the permanent magnet material, e.g., covering the entire length of the magnetic material. For example, It will be understood that a magnetic material may be selected based on its intrinsic coercivity, e.g., Alnico magnetic material has a relatively lower intrinsic coercivity so that it is requires current pulse of lower amplitude/voltage to remagnetize (or flip or switch polarity) than other permanent magnet materials such as Neodymium.

Figure 6A:
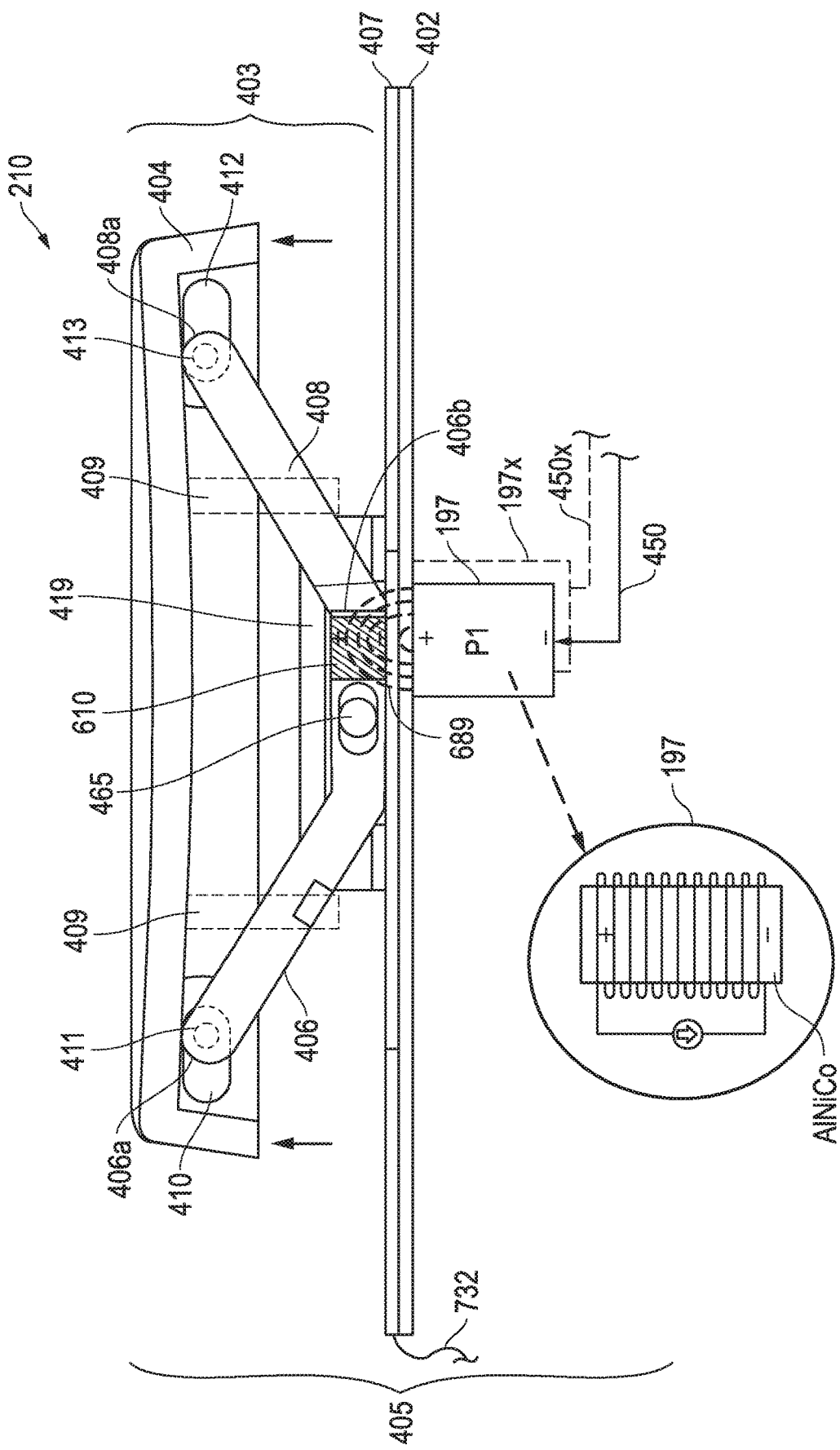
FIG. 6A illustrates a side cross section view of a retractable key assembly according to one exemplary embodiment of the disclosed systems and methods.

In one embodiment a linear permanent magnet or other shape magnet having two magnetic poles and having no attached shunts may be provided for a polarity-switching EPM 197 as illustrated in the inset of FIG. 6A. For example, as illustrated in insets of FIGS. 6A and 6B, orientation of the EPM permanent magnet axis extending between its poles may be vertical, so that a first one of its switchable magnetic poles faces upward toward overlying permanent magnet 610 and so that the second and opposite one of its switchable-polarity magnetic poles faces downward. In such a case, permanent magnet 610 may be oriented so that one of its fixed polarity poles (e.g., positive pole in FIGS. 6A and 6B) faces downward toward the switchable upper pole of EPM 197, and such that the that the other one of its poles (e.g., negative pole in FIGS. 6A and 6B) faces upward and away from underlying EPM 197. Thus, in a first attracting polarity state (e.g., P1) of EPM 197, switchable upper pole of EPM 197 may be controlled to have a magnetic polarity that is opposite to (e.g., negative in FIGS. 6A and 6B) the magnetic polarity of the overlying pole of permanent magnet 610 and interacts with (or acts on) the magnetic polarity of the overlying pole of permanent magnet 610. On the other hand, in a second repelling polarity state (e.g., P2) of EPM 197, switchable upper pole of EPM 197 may be controlled to have a magnetic polarity that is the same as (e.g., positive in FIGS. 6A and 6B) the magnetic polarity of the overlying pole of permanent magnet 610 and interacts with (or acts on) the magnetic polarity of the field of overlying pole of permanent magnet 610.

In an alternative embodiment, magnetically permeable material (such as Iron or Fe) may optionally be coupled as a shunt on each ends of the permanent magnet material to steer the magnetic flux, e.g., at a right angle to the axis of the EPM permanent magnet (e.g., in a manner similar to a horse-shoe shaped magnet). For example, linear orientation of the EPM permanent magnet axis (extending between its opposite magnetic poles) may be horizontal, with a vertically upward pointing magnetically permeable shunt segment provided on each end. In such a case, the axis between the poles of permanent magnet 610 may be oriented horizontally and parallel to the magnetic axis of EPM permanent magnet, such that the positive pole at one end of the permanent magnet 610 is at least partially aligned with (or otherwise positioned to be acted on by an external magnetic field emitted by) one of the upward-extending EPM magnet shunts, and such that the negative pole of the permanent magnet 610 is at least partially aligned with (or otherwise positioned to be acted on by an external magnetic field emitted by) the other and opposite one of the upwardly-extending EPM magnet shunts. Thus, in a first attracting polarity state (e.g., P1) of EPM 197, each of the upward extending shunts has a magnetic polarity that is opposite to the magnetic polarity of the overlying pole of permanent magnet 610 with which it interacts. On the other hand, in a second repelling polarity state (e.g., P2) of EPM 197, each of the upward extending shunts now has a magnetic polarity that is the same as the magnetic polarity of the overlying pole of permanent magnet 610 with which it interacts.

Figure 6B:
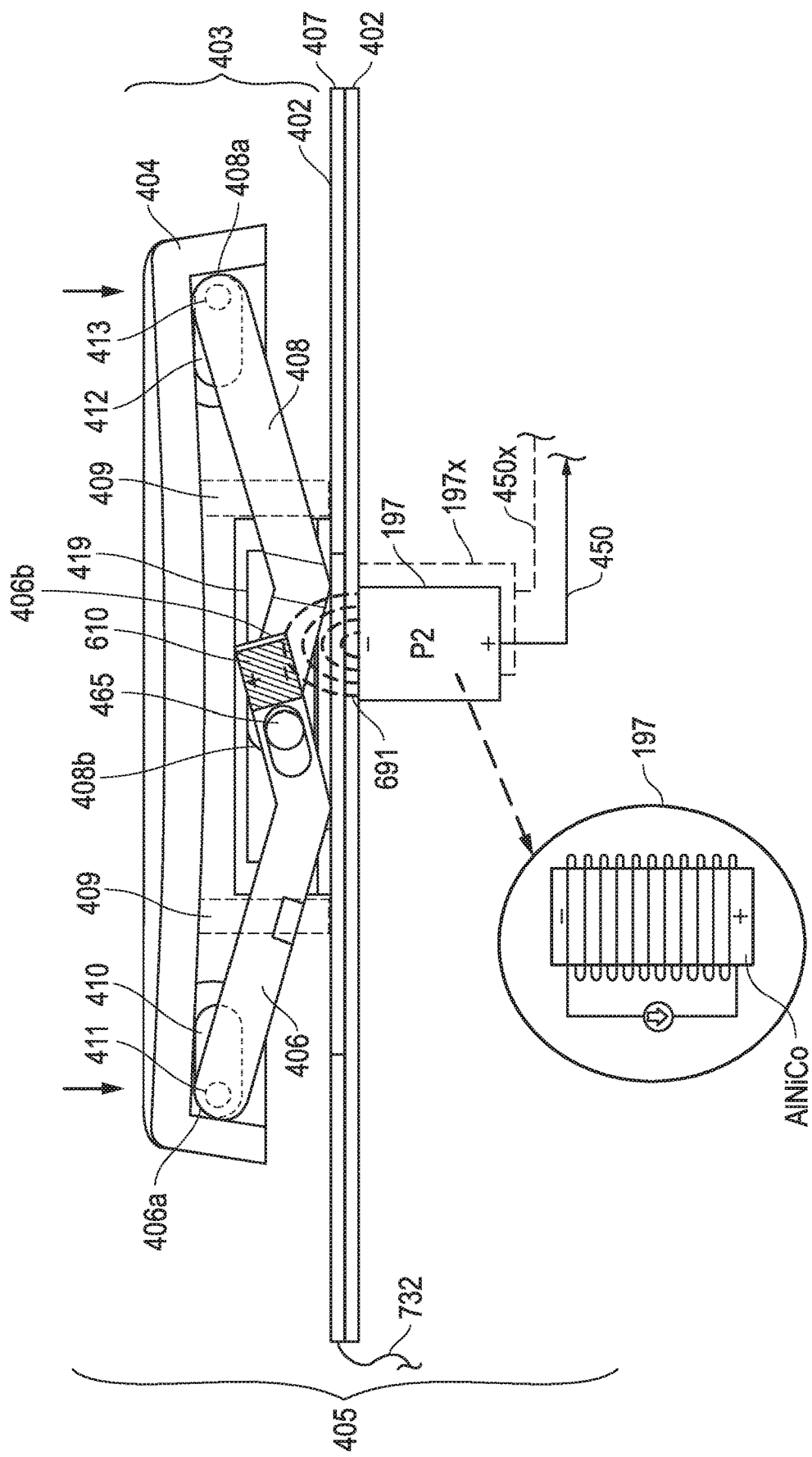
FIG. 6B illustrates a side cross section view of a retractable key assembly according to one exemplary embodiment of the disclosed systems and methods.
Figure 6C:
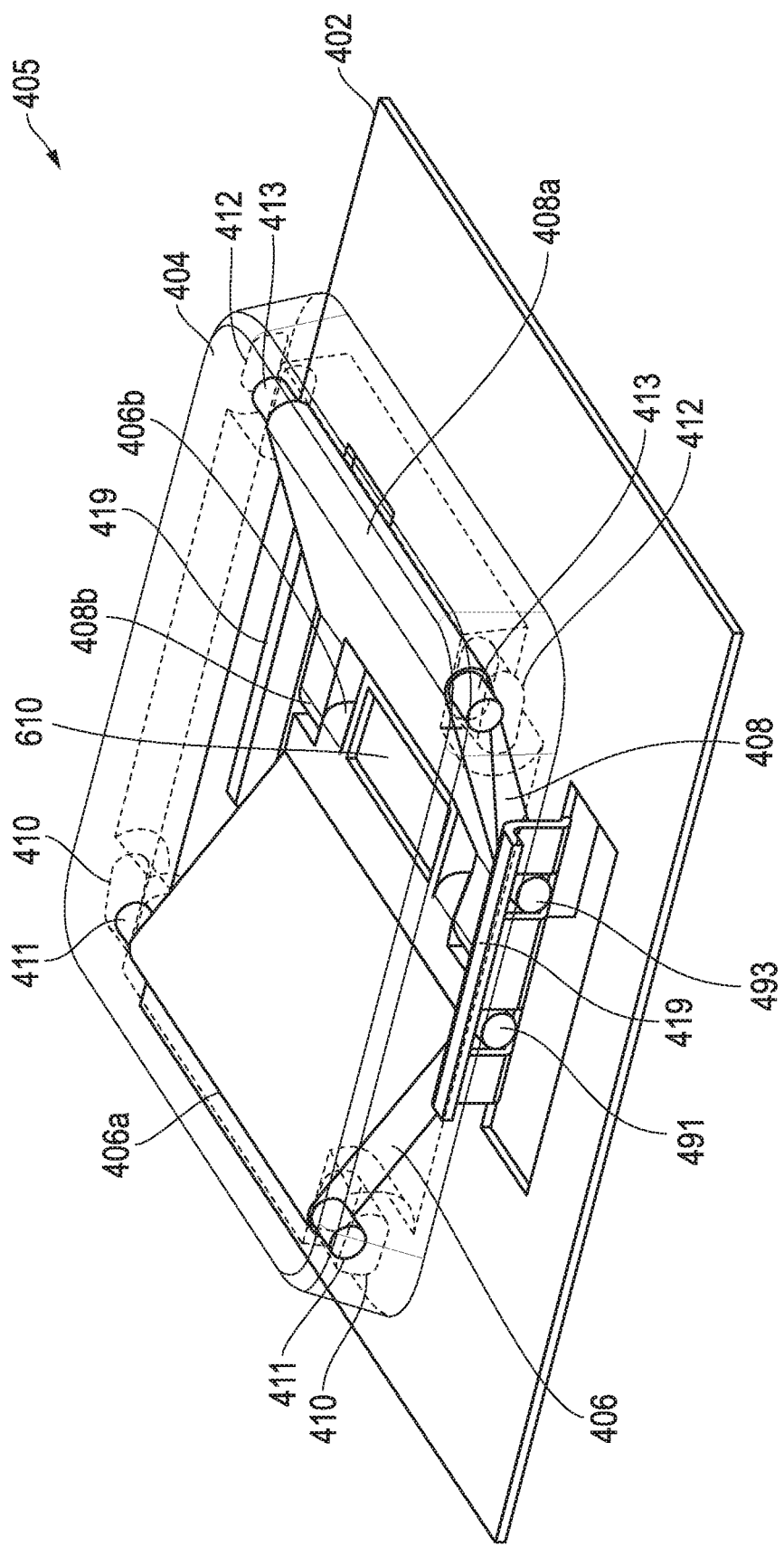
FIG. 6C illustrates an overhead perspective view of a retractable key assembly according to one exemplary embodiment of the disclosed systems and methods.
Figure 6D:
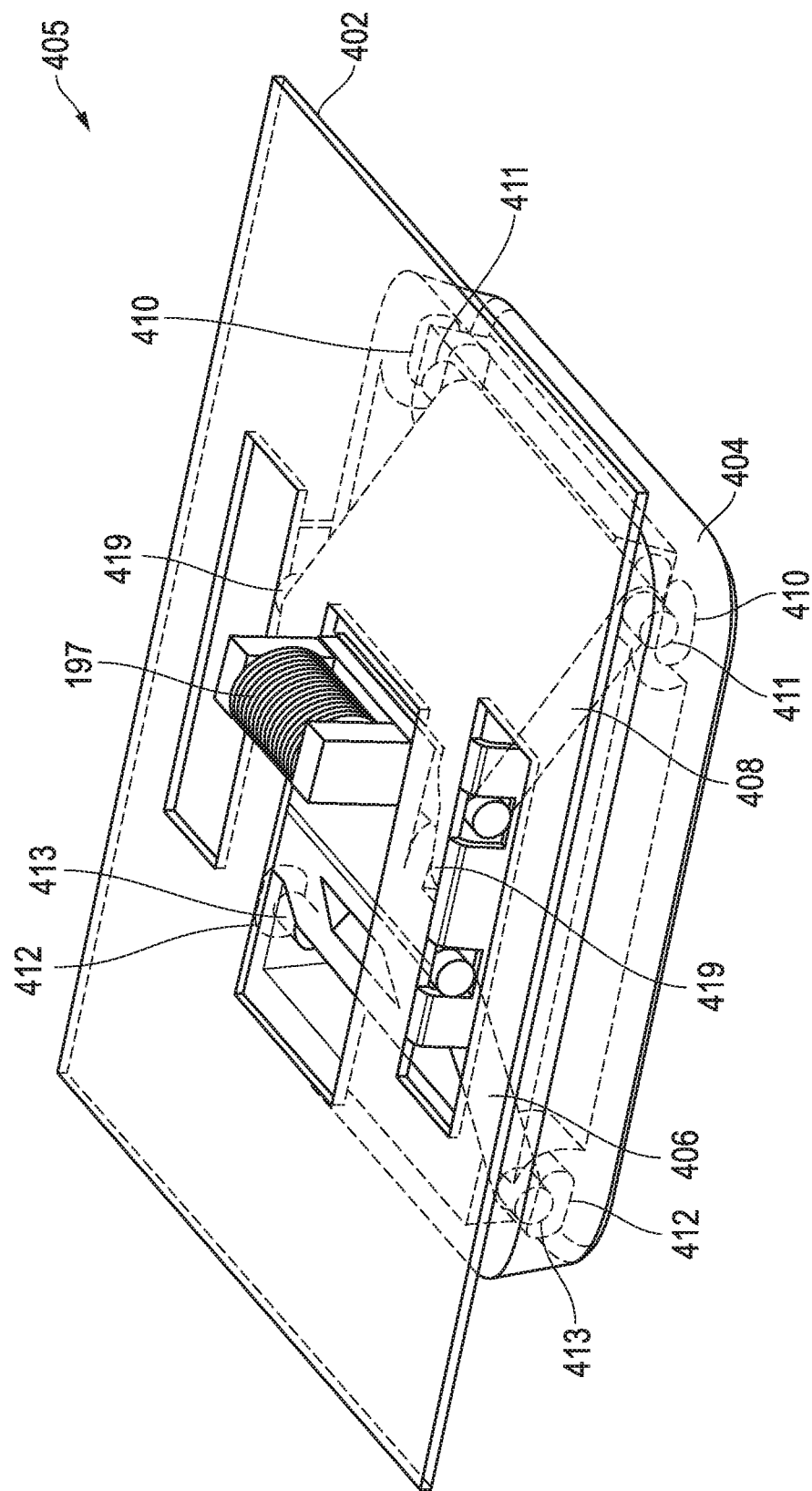
FIG. 6D illustrates an underside perspective view of a retractable key assembly according to one exemplary embodiment of the disclosed systems and methods.

EPM 197 of FIGS. 6A-6D may be mounted relative to base plate 402 as previously described for other EPMs described in relation to FIGS. 4A-4D. In the embodiment of FIGS. 6A-6D, a first current pulse 450 of appropriate polarity may be provided to polarity-switching EPM 197 to cause the permanent magnet of EPM 197 to produce an attractive external magnetic field 689 of a first polarity "P1" that is at least partially aligned with and attracts the permanent magnet 610 of second end 406b of angled support arm 406 to cause second end 406b of angled support arm 406 to move downward toward base plate 402 and first end 406a of angled support arm 406 to move upward and away from base plate 402 to extend keycap 404 of key switch mechanical structure 403 into extended position 210 as shown in FIG. 6A. A second current pulse 450 of opposite polarity may be provided to cause the permanent magnet of EPM 197 to produce a repellant external magnetic field 691 of a second and opposite polarity "P2" that is at least partially aligned with and repels the permanent magnet 610 of second end 406b of angled support arm 406 to cause second end 406b of angled support arm 406 to move upward and away from base plate 402 and first end 406a of angled support arm 406 to move downward and toward base plate 402 to retract keycap 404 into retracted position 210 as shown in FIG. 6B. The embodiment of FIGS. 6A-6D may be implemented in a manner that saves power over some other embodiments. It will be understood that identity of attractive and repellant fields of EPM 197 are determined relative to the magnetic field orientation of permanent magnet 610.

In the embodiment of FIGS. 6A-6D, it is optionally possible in one embodiment to vary the peak depression force required by a user to depress the extended key assembly 405 by varying the amplitude of the current pulse 405 applied to cause EPM 197 to produce an attractive external magnetic field of a first polarity "P1", e.g., current pulses 450 may be applied to EPM 197 that are of different selectable amplitudes greater than minimally required to attract permanent magnet 610 of second end 406b of angled support arm 406 so as to vary the peak depression force required by a user touch to overcome this attractive magnetic force emitted from EPM 197 to depress the extended key assembly to cause output of a key signal from key assembly 405.

As further shown in FIGS. 6A-6B it is optionally possible to include one or more additional EPMs 197x that are each positioned adjacent EPM 197 and also at least partially aligned with and beneath (or otherwise positioned to emit an external magnetic field that acts on) the at least one permanent magnet 610 in or on a second end 406b of angled support arm 406. In this embodiment each additional EPM 197x may be optionally and selectably controlled by a separate current pulse 450x to produce an attractive external magnetic field of a first polarity "P1" that attracts the permanent magnet 610 of second end 406b of angled support arm 406 at the same time that EPM 197 is also controlled to produce the attractive external magnetic field of first polarity "P1" by a separate current pulse 450 i.e., to selectably and optionally provide an increased magnitude of external attractive magnetic force emitted from a combination of EPMs 197 and 197x to attract the second end 420b of angled magnetically permeable plate 420 downward toward baseplate 402 with greater force than when only EPM 197 is controlled to produce attractive external magnetic field "P1" by current pulse 450. In this way the peak depression force required by a user to overcome the magnetic force emitted from EPM 197 may be increased when desired by causing one or more additional EPMs 197x to also emit the attractive external magnetic field "P1", and may be decreased again by causing EPM 197 to emit the attractive external magnetic field "P1" (e.g., with all or a portion of additional EPMs 197x emitting the external magnetic field of second polarity "P2" to repel the permanent magnet 610 of second end 406b of angled support arm 406, and/or by providing a reduced amplitude current pulse 450x to cause one or more additional EPMs 197x to emit a reduced external magnetic field of second polarity "P2" to less strongly repel the permanent magnet 610 of second end 406b of angled support arm 406).

It will be understood that the embodiments described and illustrated in FIGS. 4A to 6D are exemplary only, and that positions of EPMs and magnetically permeable materials (e.g., such as magnetically permeable plates) may be interchanged, e.g., EPMs may be mounted on the movable key assembly components, while aligned magnetically permeable materials may be fixedly mounted to a baseplate, etc. Moreover, other types of retractable key assembly key mechanism configurations are possible that are configured (e.g., employing one or more EPMs, movable key assembly components, and/or spring or other resilient material components that bias the key assembly upward away from the base or baseplate) to selectably retract and extend an individual keycap or individual keycaps of keyboard matrix.

For example one or more EPMs may be fixedly positioned beneath a spring loaded mechanical key switch assembly having a keycap coupled to a shaft, plunger body, internal spring element (e.g., helical spring or compression coil), and plunger axle movably received within a plunger cavity that is mounted on or to a baseplate (e.g., metal plate, printed circuit board, plastic plate, etc.) such as described in U.S. Pat. No. 9,343,248 which is incorporated herein by reference in its entirety for all purposes. In such an alternative embodiment, a magnetically permeable material (e.g., magnetically permeable plate or body) may be fixedly coupled to a movable key assembly component (e.g., plunger body and/or shaft) of the mechanical key switch assembly, and at least one EPM may be fixedly mounted on, within or beneath the baseplate in a position that is at least partially aligned with and beneath (or otherwise positioned emit an external magnetic field that acts on) the magnetically permeable material. In such an alternate embodiment, a current pulse of appropriate first polarity may be provided to the EPM turn ON the external magnetic field of the EPM to attract the magnetically permeable material and movable key assembly components (e.g., keycap, shaft, plunger body, and plunger axle) downward into a retracted position against (and overcoming) an upward force imparted by the compressed internal spring element, while another current pulse of opposite polarity may be provided to the EPM to turn OFF the external magnetic field of the EPM so as to allow the upward force imparted by the compressed internal spring element to re-extend the movable key assembly components of the key assembly upward into extended position.

Other types of key assemblies that may be configured with one or more EPMs to selectably retract and extend movable key assembly components include, but are not limited to, collapsible dual lever (scissor) action key mechanism that supports a keycap over a resilient rubber or other flexible dome structure/member and key signal output circuitry, such as described in U.S. Pat. Nos. 8,748,767 and 8,674,941, each of which is incorporated herein by reference in its entirety for all purposes. Similar to described above, a magnetically permeable material (e.g., magnetically permeable plate or body) may be fixedly coupled to a movable component (e.g., keycap, lever, etc.) of the mechanical key switch assembly, and at least one EPM may be fixedly mounted on, within or beneath the baseplate in a position that is at least partially aligned with and beneath (or otherwise positioned emit an external magnetic field that acts on) the magnetically permeable material such that a first current pulse may be provided to turn ON and the external magnetic field of the EPM to selectably attract the magnetically permeable material and retract the movable components and keycap of the key assembly while overcoming upward force of (and compressing) the resilient rubber dome. A second and opposite polarity current pulse may be provided to turn OFF and the external magnetic field of the EPM to selectably release the magnetically permeable material and allow the resilient rubber dome to upwardly bias the movable components and keycap of the key assembly.

It will also be understood that various features of the disclosed systems and methods may be implemented with types of keys other than a QWERTY or similar style notebook or desktop computer keyboard. In this regard, one or more of the disclosed retractable keys may be similarly implemented for any type of user-input device that employs one or more keys, e.g., such as a computer mouse, game controller, control panel (e.g., for an automobile, aircraft, chemical plant, etc.).

Figure 7:
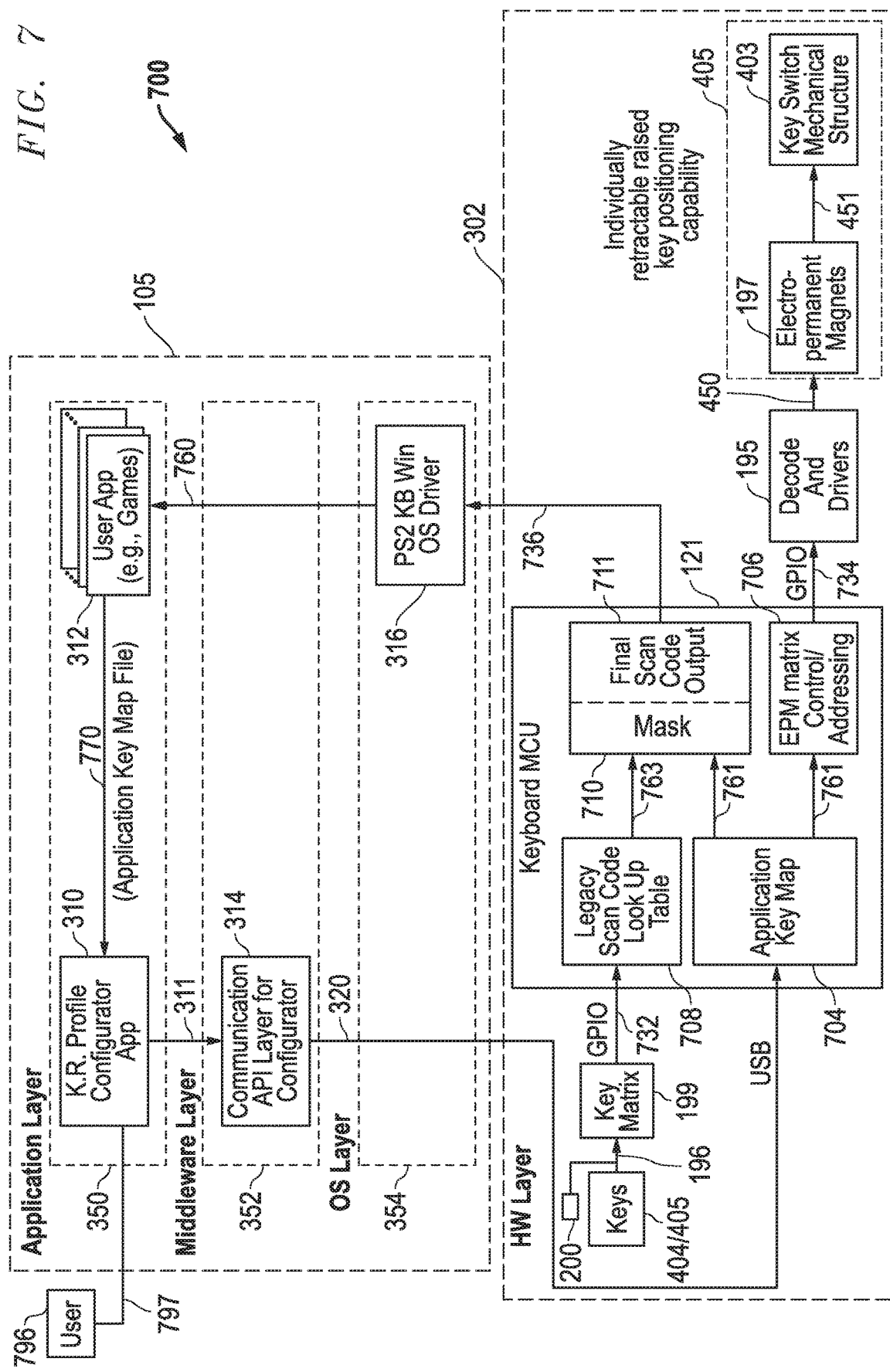
FIG. 7 is a flow chart illustrating interaction between layers of an information handling system according to one exemplary embodiment of the disclosed systems and methods.

FIG. 7 is a flowchart 700 illustrating interaction between hardware layer 302 and other previously-described layers 350, 352 and 354 of an information handling system 100 according to one exemplary embodiment of the disclosed systems and methods. As shown in FIG. 7, hardware layer 302 is configured to allow a user to provide user-input 196 by depressing individual keycaps of key assemblies 405 and an optional non-EPM driven Mode Toggle Key or button 200 of key matrix 199 to cause production of corresponding digital key output signals 732 at a key signal output to keyboard controller 121. It will be understood that in other embodiments, analog output signals (e.g., from variable pressure keys or variable displacement keys) or signals based on such analog output signals may be additionally or alternatively provided to keyboard controller 121 (e.g., via suitable analog to digital conversion (ADC) circuitry or intervening programmable integrated circuit), where such signals may be similarly processed as described herein for digital output signals 732.

Keyboard controller 121 may also be configured as shown to execute firmware including stored information in the form of an application key map register 704 that is created and/or updated according to application key configuration parameters 320 received from communication API 314. In this embodiment, application key map register 704 translates the list of active application (e.g., game) keys 320 into a list that is indicative of allowed and unallowed keys across the entire keyboard matrix 199. The content of the application key map register 704 may be used in two operations in parallel: 1) it may be used to dictate whether to block or allow a scan code 736 of a particular key assembly from being reported to the OS 354 and 2) it may be used to address a respective EPM 197 or set of EPM's 197 of each key assembly 405 to pulse accordingly to result in either a retraction or extension of the keycap 404 of the respective key assembly 405. In this embodiment, keyboard controller 121 may execute other firmware components such as legacy scan lookup table 708, mask 710, and final scan code output 711 that together operate to produce the final scan code signals 736 reported to the OS only for those allowed key/s 404 currently specified by a current list 761 of allowed key assemblies 405 that is provided from application key map register 704. In this regard, digital output signals 732 exiting the key matrix 199 may be first provided to legacy scan code lookup table 708 to output scan code signals 763 corresponding to each of currently-depressed key assemblies 405 to a key mask 710. The key mask 710 operates to block scan codes 736 from unallowed key assemblies 405 from being reported to the OS 354 via the keyboard device driver 316, as well as allowing scan codes 736 from allowed key assemblies 405 to be reported to the OS 354 via the keyboard device driver 316. Final scan code output 711 then outputs final scan code signals 736 corresponding to only the currently-allowed keys identified by allowed key assembly list 761 to device driver 316 executing on host programmable integrated circuit 105. Further information on production of scan codes based on digital output signals received from keys (key assemblies) of a keyboard matrix may be found in U.S. Pat. No. 8,700,829, which is incorporated herein by reference in its entirety for all purposes.

Keyboard controller 121 is also configured in this embodiment to implement EPM matrix control and addressing 706 based on the same list of currently allowed key/s 761 described above that is provided from application key map register 704. In particular, EPM matrix control and addressing 706 may output general purpose input/output signals as addressed key assembly control signals 734 corresponding to currently-allowed keys identified by allowed key assembly list 761 to decode and driver circuitry 195 (e.g., half H-bridge drivers or other suitable drivers), which in turn provides individual current pulses 450 to selected EPMs 197 to cause retraction and/or extension of those keycaps 404 of individual key assemblies 405 as specified by the list of currently-allowed key/s 761 (e.g., to extend currently-identified individual key assemblies 405, and to retract any individual key assemblies 405 that are not currently identified as allowed). Alternatively or additionally, keyboard MCU 121 may provide addressed key assembly control signals 734 to cause EPM decode and driver circuitry 195 to provide a current pulse to corresponding individually-addressed EPMs 197 to impart a desired peak depression force to only those key assemblies 405 of keyboard matrix 199 that are designated by the current instance of the user-configurable key map information within the application key configuration parameters 320 of keyboard MCU 121 based on information contained in allowed key assembly list 761.

It will be understood that the allowed key assembly list 761 may be updated in real time according to key retraction profile configurator application 310, e.g., according to change in identity of the application 312 currently in focus, according to user-input changes to the identity of keys to be retracted for the current application 312 in focus via the user configured or modified key map file 311.

When a given user application 312 of FIG. 7 goes into focus, key retraction profile configurator application 310 accepts an application key map file 770 provided as default key settings from the currently in-focus application 312 (e.g., such as computer game, word processing application, spreadsheet application, media player application, web browser application, etc.). The provided application key map file 770 may include a default list of the designated keyboard key assemblies 405 that are to be used by the particular application 312 that is currently in focus. It will be understood that key retraction profile configurator application 310 may access such a list of key assemblies 405 in any other suitable manner, e.g., such as stored in a lookup table of designated key assemblies 405 for different user applications 312 that are maintained on system storage 135, NVM 107, etc. As shown in FIG. 7, key retraction profile configurator application 310 may be configured to allow a user 796 to optionally modify or change the default key settings for an in-focus user application 312, including the particular combination of key assemblies 405 designated for the application 312 (and/or peak depression force of individual key assemblies designated for the application 312) by its application key map file 770, lookup table, etc. Examples of types of user modifications to default key settings include, but are not limited to, inclusion of the keys (key assemblies 405) required for a user to type in their Windows password (e.g., especially if they are not used in the designated active application 312), changes to the identity of designated key assemblies 405, creation of a user's own custom list of designated key assemblies 405 assigned to a given user application 312, creation or modification of designated macro key assemblies 405 for use with the in-focus application 312, reassignment of keyboard key assemblies 405 to different application functions, creation of macros assigned to given key assemblies 405, etc. Input 797 from user 796 may be received, for example, via input from integrated keyboard and touchpad 145 to a GUI of display 125, or using any other suitable input/output device. A user 796 may also download (e.g., from social sharing) a list of designated key assemblies 405 assigned to a given user application 312.

After receiving key settings from the currently in-focus application 312 and accepting any user modifications or changes, configurator application 310 then passes the resulting user-configurable application key map file 311 (list of together with any user modifications or changes) to keyboard controller 121 via communication API 314 as application key configuration parameters 320. Keyboard controller 121 accepts the provided application key configuration parameters 320 (including application key map file 311) and creates an application key map register 704 in firmware that identifies both the list of allowed key assemblies 405 and/or peak depression force for key assemblies 405 designated to be used by the application 312 currently in focus, together with any additional allowed key assemblies 405 added by user configuration input 797 as well as identification and designation of all non-allowed keys (i.e., in this embodiment all keyboard keys not found in the key map file 311).

In one embodiment further described below, under the control of keyboard controller 121, key assemblies 405 designated as allowed by application key map register 704 will be the only key assemblies extended and rendered capable of functioning and outputting final (or filtered) scan code signals 736 to OS layer 354 via final scan code output 711. All other non-designated key assemblies 405 will have their scan codes 763 blocked by the mask 710 so they are not reported to the OS layer 354, and will be retracted out of position and rendered not capable of accepting user input by EPM matrix control/addressing firmware 706 implemented by keyboard controller 121. In particular, EPM matrix control/addressing 706 individually addresses the EPM or EPMs 197 of each key assembly 405 of the keyboard matrix 199, and dictates whether to cause decode and bridge driver circuitry 195 to apply appropriate current pulse/s 450 to each given key assembly 405, e.g., to magnetize a respective EPM 197, to de-magnetize a respective EPM 197, to cause a particular peak depression force, or to reverse polarity of magnetic field of a respective EPM 197 so as to retract or extend each given key assembly 405 according to the current application key map register 704 for the application 312 in focus. It will be understood that appropriate types and number of current pulses 450 required to retract and extend the keycap 404 and/or vary peak depression force will depend on specific configuration of each given key assembly 405 and/or specified peak depression force, e.g., such as the different configurations described and illustrated in relation to FIGS. 4A-6D.

EPM matrix control/addressing firmware 706 of keyboard controller 121 may be configured to cycle through addressing (writing) to the EPM/s 197 of each key assembly 405 in a matrixing or matrix type method by addressing the EPM/s 197 of one row and column intersection at a time (e.g., while the EPM/s 197 at all other row and column intersections are tri-stated or otherwise placed out of circuit). In an alternative embodiment, EPMs 107 of multiple key assemblies 405 may be independently addressed at the same time to reduce the amount of time required to program all EPMs 107 of keyboard matrix 199. In any case, general purpose input/output (GPIO) output signals may be provided under the control of EPM matrix control/addressing firmware 706 to decode and bridge driver circuitry 195, which in turn provides corresponding current pulses 450 to EPMs 197 of particular key assemblies 405 specified by EPM matrix control/addressing firmware 706 to cause retraction or extension of, and/or to set or vary peak depression force for, key assemblies 405 designated by application key map register 704.

Still referring to keyboard controller 121 of FIG. 7, scan code reporting to OS layer 354 may also optionally be controlled based on the currently designated key assemblies 405 of application key map register 704 using mask 710 and final scan code output 711 firmware components. For example, when a given user application 312 is in focus and a corresponding application key map register 704 of corresponding designated key assemblies 405 has been created as previously described, initial scan code signals 763 corresponding to all key assemblies 405 not listed as allowed by current list 761 are filtered out by mask 710 and not passed to final scan code output 711 so as to block these filtered scan codes from being provided to OS layer 354 that correspond to any digital output signals 732 received from such non-allowed key assemblies 405. For example, if a given user application 312 (e.g., computer game) together with any user input 797 designates only a portion of the key assemblies 405 of a keyboard matrix 199 (e.g., designates 15 key assemblies 405 out of 107 available key assemblies of a QWERTY keyboard), these designated allowed keys 405 are reported by list 761 to mask 710 which then blocks reporting of scan codes from all other non-designated (i.e., non-allowed) keyboard assemblies 405 to keyboard driver 316 of OS layer 354.

In one embodiment, whenever no user application 312 is in focus and/or no application key map file 770 has been provided to key retraction profile configurator application 310, an "all keys active" mode keyboard state may be implemented. This may be implemented as part of the reset firmware in the keyboard controller 121 such that upon boot-up, the keyboard MCU 121 initializes, and part of the initialization is setting the application key map 704 such that all keys are designated as "allowed keys" and passed to the mask 710 and to EPM matrix control/addressing 706. When this is done, scan codes 736 from 100% (or all) of the keyboard key assemblies 405 are accepted (not blocked), and EPM matrix/control addressing 706 runs through a sequence of programming of EPM(s) 197 of each respective key assembly 405 so that all key assemblies 405 are placed in an extended state.

In an another possible embodiment, whenever no user application 312 is in focus and/or no application key map file 770 has been provided to key retraction profile configurator application 310, key retraction profile configurator application 310 may provide an application key map file 311 to keyboard controller 121 via communication API 314 as application key configuration parameters 320 that designate all key assemblies 405 of keyboard matrix as allowed key assemblies, e.g., with a default peak depression force in those embodiments where variable peak depression force is enabled. In this case, the list 761 of allowed key assemblies provided to EPM matrix control/addressing firmware 706 and mask 710 will include all key assemblies 405. In response, EPM matrix control/addressing firmware 706 will control extension of all keyboard assemblies 405 by their respective EPMs 197, and mask 710 will enable scan codes to from all keyboard assemblies 405 to be passed to keyboard driver 316 of OS layer 354. Whenever a user application 312 is again in focus, then application key map register 704 will again be updated via application key configuration parameters 320 to include only a subset of all available keys of keyboard matrix 199, and/or the specified peak key depression force/s for the key assemblies 405 specified for their user application 312 in focus. In this case, the list 761 of allowed key assemblies provided to EPM matrix control/addressing firmware 706 and mask 710 will include only the subset of designated allowed key assemblies 405. In response, EPM matrix control/addressing firmware 706 will control extension and/or peak depression force of only those designated keyboard assemblies 405 by their respective EPMs 197, and mask 710 will enable scan codes from only those designated keyboard assemblies 405 to be passed to keyboard driver 316 of OS layer 354. Similar real time update of allowable key assemblies 405 may be performed whenever application key map register 704 is updated with a different combination of designated allowed key assemblies 405 via application key configuration parameters 320, e.g., such as whenever the identity of an in-focus user application 312 changes and/or whenever a user inputs changes to the identity of the keys designated for an in-focus application 312. After the user application 312 is no longer in focus, EPM matrix control/addressing firmware 706 may once again control extension of all keyboard assemblies 405 by their respective EPMs 197, and mask 710 will enable scan codes to from all keyboard assemblies 405 to be passed to keyboard driver 316 of OS layer 354, e.g., until another user application 312 is in focus.

Figure 8:
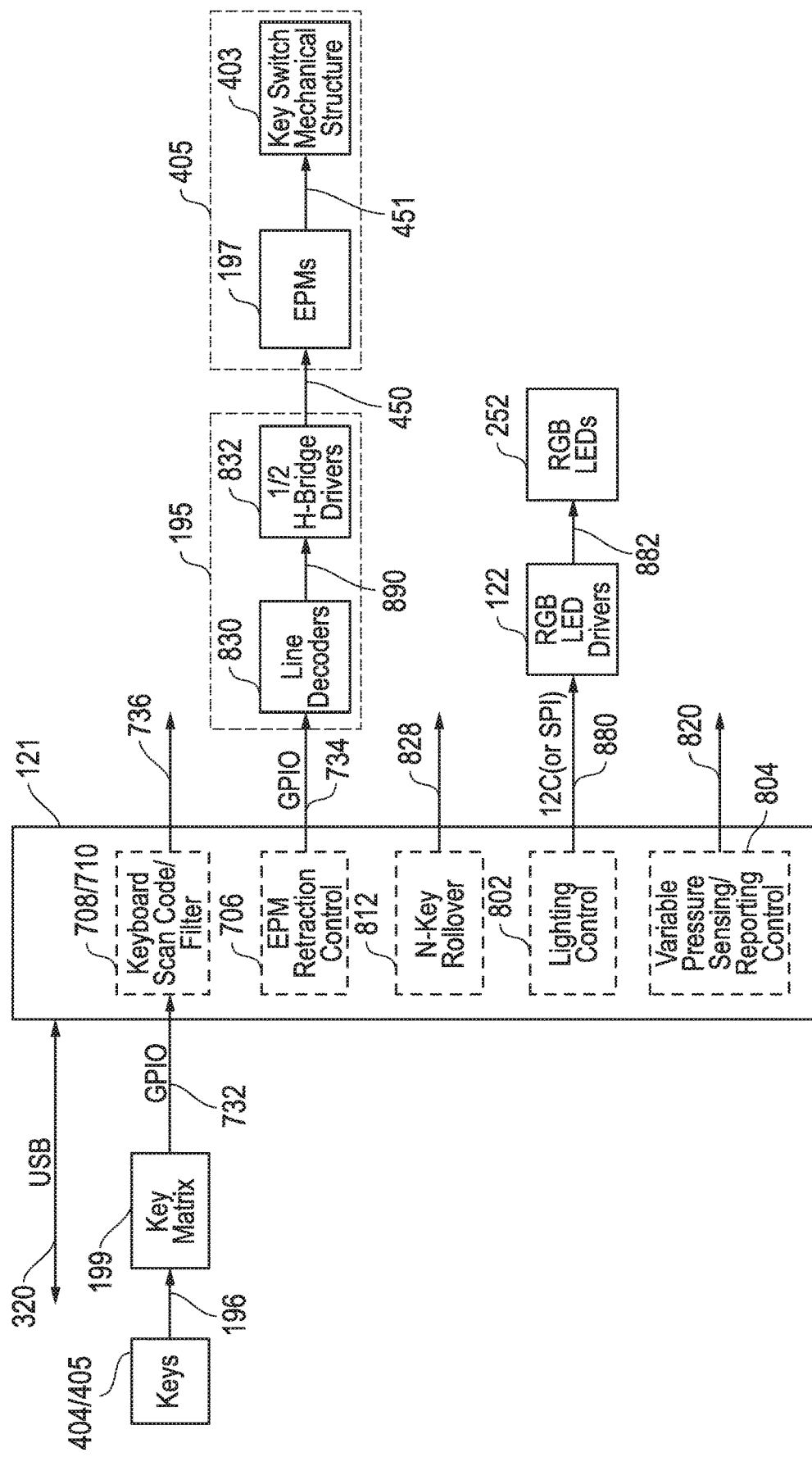
FIG. 8 is a block diagram showing circuit components of an information handling system according to one exemplary embodiment of the disclosed systems and methods.

FIG. 8 illustrates one exemplary embodiment of circuitry including a single keyboard controller 121 that is configured to implement digital keyboard scan code and filtering 708/710 for an information handling system 100, together with one or more other optional features such as EPM key assembly retraction control 706, N-key rollover 812 (i.e., the ability to report all scan codes of all key assemblies 405 that are pressed down simultaneously at any given time), lighting control 802 and variable pressure sensing/reporting control 804, etc. In this regard, FIG. 8 illustrates exemplary N-key rollover output signals 828 provided from keyboard controller 121, variable pressure scan code output signals 820 supplied from keyboard controller 121, as well as lighting control output signals 880 that may be supplied from keyboard controller 121, e.g., to light drivers 122 that respond by providing current 882 for driving LEDs or other type light elements 252. Examples of lighting control 802 tasks are described in U.S. Pat. No. 7,772,987, and examples of variable pressure sensing and reporting control may be found in U.S. Pat. No. 8,700,829, each of which is incorporated herein by reference in its entirety. Specific examples of programmable integrated circuits that may be employed for keyboard controller 121 include, but are not limited to, a Holtek part number HT32F1654 MCU based on an ARM Cortex M3 core and available from Holtek Semiconductor of Taiwan.

Still referring to FIG. 8, EPM retraction control 706 may in one exemplary embodiment be implemented by firmware of keyboard controller 121 to output key assembly signals 734 to decode and bridge driver circuitry 195 to address and control the EPM/s 197 of each individual key assembly 197 one at a time to retract or extend its respective keycap 404 while the EPMs 197 of all other key assemblies 405 of the keyboard matrix 199 are tri-stated, e.g., by providing individual key assembly control signals 734 from keyboard controller 121 to line decoders 830 in a round robin fashion. Line decoders 830 may in turn provide corresponding chip select signals 890 to driver circuitry 832 (e.g., ½ H-bridge drivers) to cause driver circuitry 832 to supply separate current pulses 450 to the EPM/s 197 of one key assembly 405 at time to impart mechanical retraction or extension action 451 to its corresponding keycap 404. It will be understood that in other embodiments, it is possible to control driver circuitry 832 to simultaneously retract or extend keycaps 404 of more than one key assembly 405 at a time, e.g., such as of all key assemblies of a keyboard matrix 199.

It will be understood that in other embodiments, multiple programmable integrated circuits may be employed to implement features such as EPM retraction control 706, N-key rollover 812, lighting control 802 and variable pressure sensing/reporting control 804. For example, in one exemplary embodiment, three separate MCUs may be provided to individually control each of respective legacy scan lookup table 708 and/or filtering 710, EPM retraction control 706, and lighting control 802. In another possible embodiment, a single MCU may be employed to controls all three of legacy scan lookup table 708 and/or filtering 710, EPM retraction control 706, and lighting control 802 to reduce utilized printed circuit board (PCB) area. In such an embodiment, EPM retraction control 706 is located in the same chip that processes the scan codes, and has sufficient GPIO pins as required by EPM addressing and control of EPM retraction control 706. In another possible embodiment, a first MCU may be employed to implement legacy scan lookup table 708 and/or filtering 710, and a second and different MCU employed to implement EPM retraction control 706 and lighting control 802. Such an embodiment may be employed, for example, for key assemblies of peripheral input devices (e.g., such as mice or game controllers) that do not have a keyboard matrix array. This also makes possible a single USB port for providing both lighting and EPM commands via a single API 314 to a single MCU that implements both EPM retraction control 706 and lighting control 802.

Figure 9A:
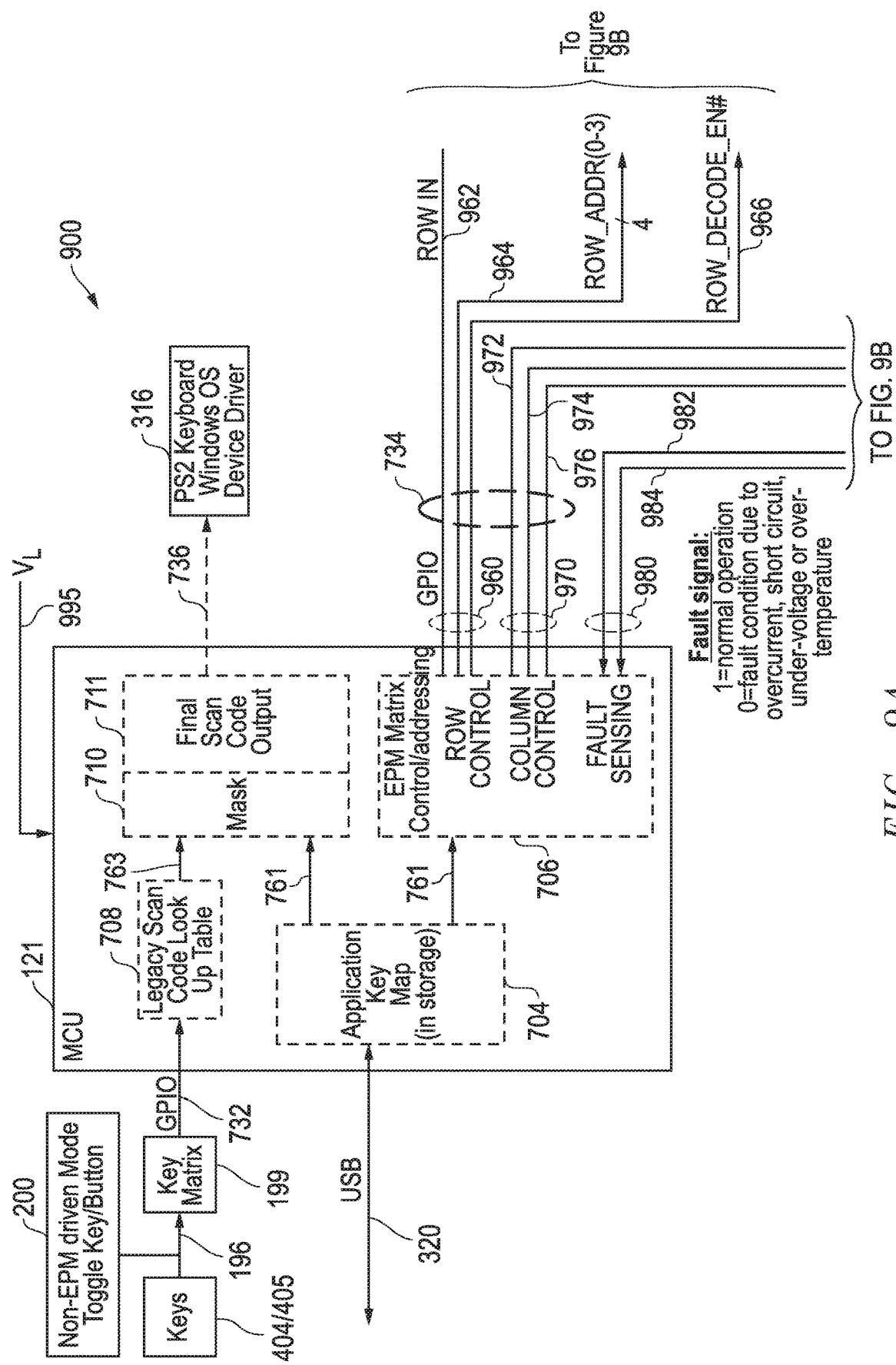
FIG. 9A is a block diagram showing circuit components of an information handling system according to one exemplary embodiment of the disclosed systems and methods.
Figure 9B:
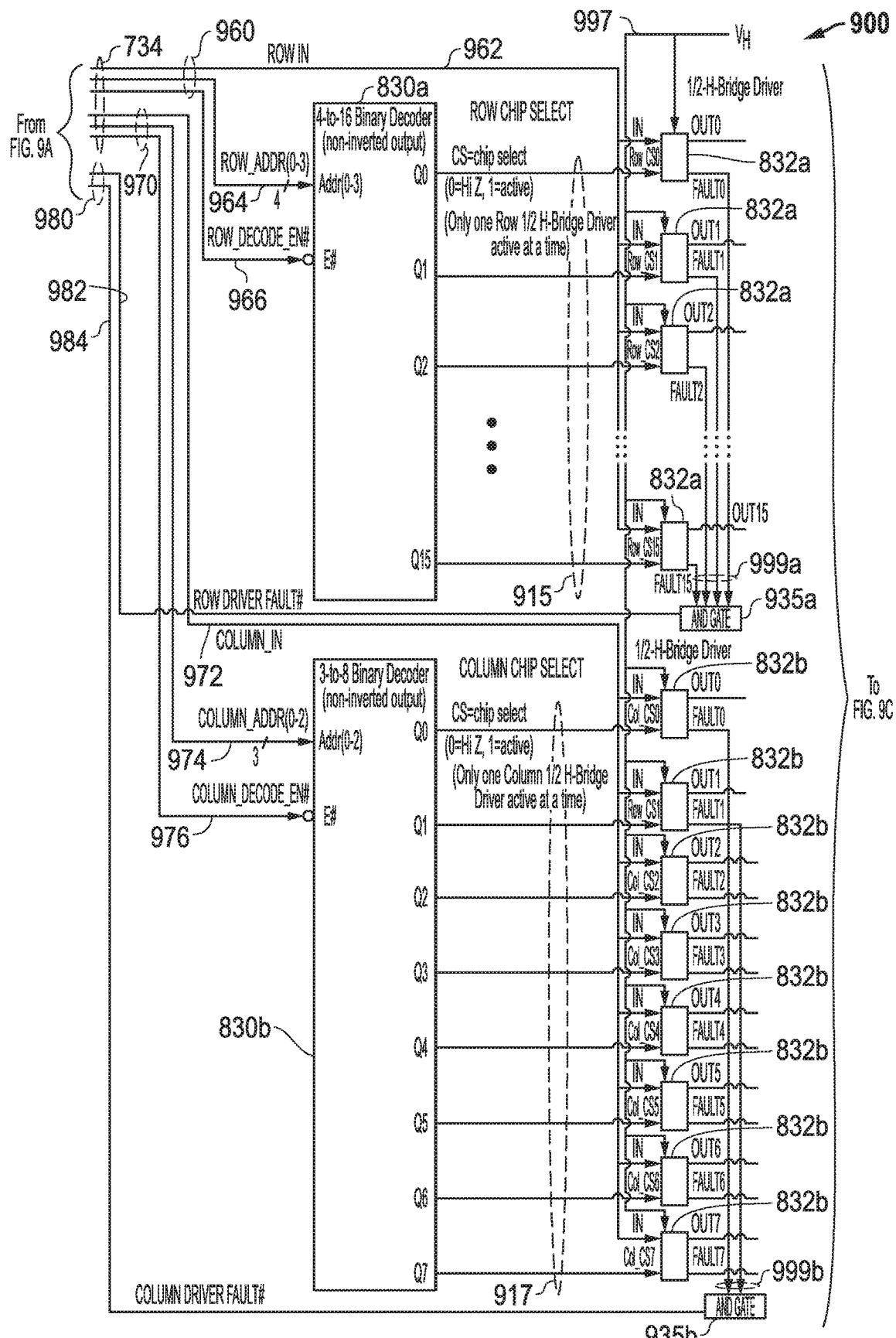
FIG. 9B is a block diagram showing circuit components of an information handling system according to one exemplary embodiment of the disclosed systems and methods.
Figure 9C:
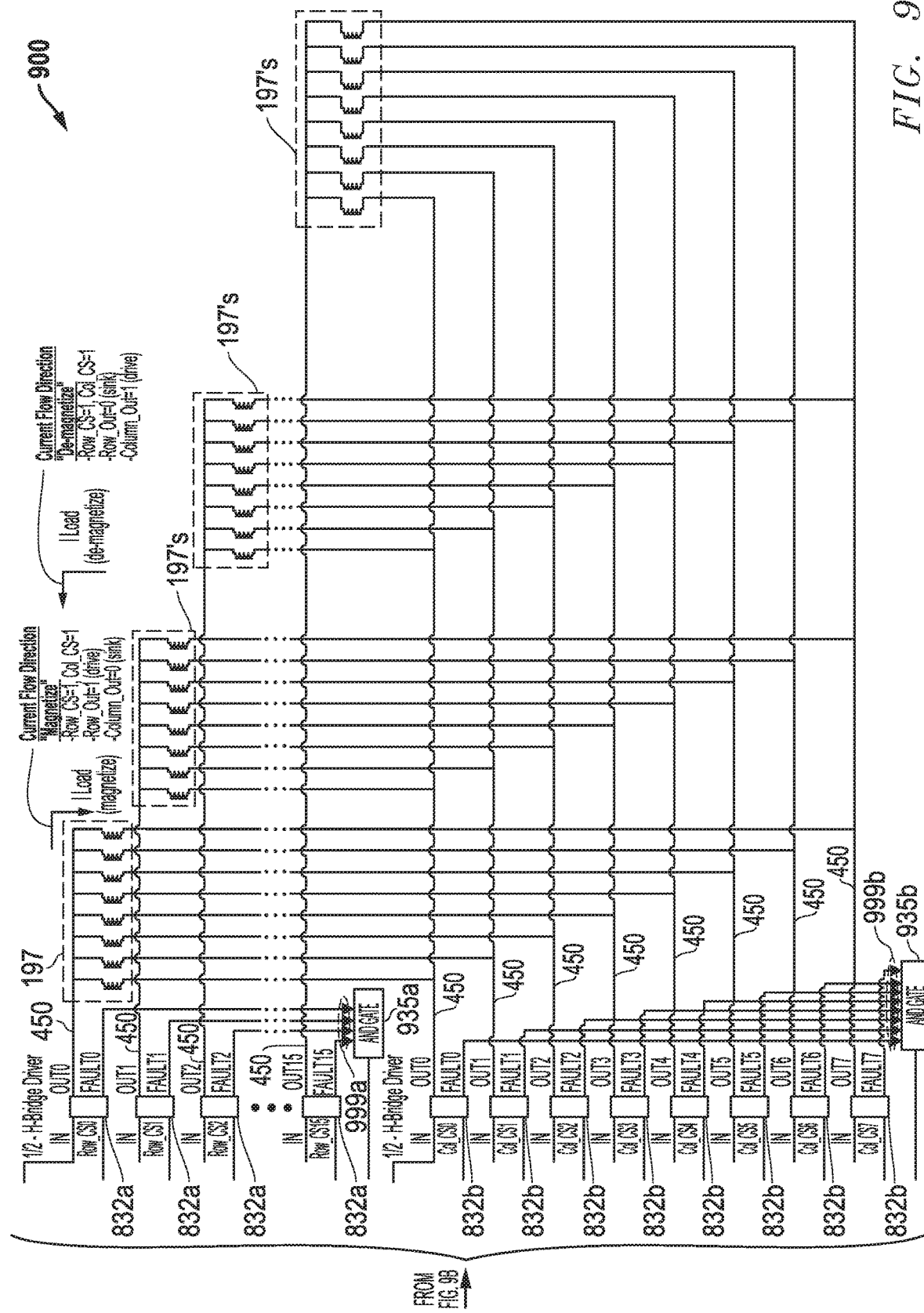
FIG. 9C is a block diagram showing circuit components of an information handling system according to one exemplary embodiment of the disclosed systems and methods.

FIGS. 9A-9C illustrate an exemplary embodiment of circuit components 900 that include keyboard controller 121, decode circuitry 830, driver circuitry 832 and EPMs 197 of key assemblies 405, and an optional non-EPM driven Mode Toggle Key or button 200, as they may be coupled together according to one exemplary embodiment. In this embodiment, bi-directional current drive is employed using half H-bridge drivers 832 in a matrixing scheme, and one EPM 197 at a time is programmed with a respective current pulse 450. Any suitable programmable integrated circuit and driver circuitry components may be employed, however in one exemplary embodiment keyboard controller 121 may be a Holtek HT32F1654 ARM Cortex M3 controller, decode circuitry 830a may be a 4-to-16 line decoder with non-inverting outputs (e.g., such as a NXP 74HCT4514), decode circuitry 830b may be a 3-to-8 line decoder with non-inverting outputs (e.g., such as a NXP 74HCT238), and ½-H-Bridge drivers 832a and 832b may be, for example, implemented using multiple Texas Instruments TI DRV8844 driver chips (each of which has Quad ½ H-Bridge drivers in one integrated circuit).

In the illustrated embodiment of FIGS. 9A-9C, keyboard controller 121 and decode circuitry 830 components are coupled to receive power from low voltage supply rail $V_L$ 995 (e.g., 3.5 volts or any other suitable voltage for powering keyboard controller 121 and decode circuitry 830), while driver components 832 are coupled to receive power from high voltage supply rail $V_H$ 997 (e.g., 40 volts or any other suitable voltage for driving EPMs 197). As illustrated, EPM matrix control and addressing 706 of this embodiment may output key assembly control signals 734 that include row control signals 960 for selecting a row of EPMs 197, column control signals 970 for selecting a column of EPMs 197, and fault sensing signals 980.

Row control signals 960 include row address signals 964 that are provided to row decoder circuit 830a for selecting a single row of EPMs 197 that includes a given key assembly 405 of interest selected in a given current pulse cycle. In this embodiment, row decoder circuit 830a is illustrated as a 4 to 16 binary non-inverting decoder for selecting one row among sixteen rows of EPMs 197 however more or less row decoder output signals may be used depending on the number of rows of keys in a given keyboard matrix 199. Row control signals 960 also include row decode enable signal 966 that that is provided to row decoder circuit 830a to force all decoder 830a outputs to an inactive state, such as after all EPM's 197 of key assemblies 405 have been programmed into their desired extended or retracted states. Row control signals 960 also include "Row In" signal 962 that is provided to each of individual ½-H bridge row drivers 832a to control direction of the current pulse 450 of the present current pulse cycle. Amplitude of a given current pulse may be controlled, for example, by a using pulse width modulated (PWM) signal during the current pulse to control the current pulse amplitude or by using any other suitable current control technique and/or circuitry. Column control signals 970 include column address signals 974 that are provided to column decoder circuit 830b for selecting a single column of EPM's 197 that includes a given key assembly 405 of interest selected in a given current pulse cycle. In this embodiment, column decoder circuit 830*b* is illustrated as a 3 to 8 binary decoder for selecting one column among eight columns of keys, however more or less column decoder output signals may be used depending on the number of columns of keys in a given keyboard. Column control signals 970 also include column decode enable signal 976 that that is provided to column decoder circuit 830*b* to force all decoder 830*b* outputs to an inactive state, such as after all EPM's 197 of key assemblies 405 have been programmed into their desired extended or retracted states. Column control signals 970 also include "Column In" signal 972 that is provided to each of individual ½-H bridge column drivers 832*b* to control direction of the current pulse 450 of the present current pulse cycle.

Also illustrated in FIGS. 9A-9C are optional fault sensing signals 980 that include row driver fault signal 982 that may be provided to keyboard controller 121 from row fault AND gate 935*a* when a driver fault (e.g., such as over-current, short circuit, under-voltage, over-temperature, etc. condition) is indicated by any of ½-H bridge row drivers 832*a* via its respective fault output signal 999*a*, and column driver fault 984 signal that may be provided to keyboard controller 121 from column fault AND gate 935*b* when a driver fault is indicated by any of ½-H bridge column drivers 832*b* via its fault output signal 999*b*. In one embodiment, fault AND gates 935*a* and 935*b* output high driver fault signals 982 and 984 to keyboard controller 121, respectively, to indicate normal operation as long as all of the respective coupled ½-H bridge drivers 832 all provide "high" inactive fault output signals 999 to the respective fault AND gates 935*a* and 935*b* during normal driver operation. In such an embodiment, a fault is indicated by any one or more of ½-H bridge drivers 832 by outputting a "low" fault output signal 999 to its respective fault AND gate 935*a* or 935*b*, which in turn causes the respective fault AND gate 935*a* or 935*b* to output a respective "low" driver fault signal 982 or 984 to keyboard controller 121 to indicate a driver fault. Keyboard controller 121 may then respond to a "low" driver fault signal 982 or 984 by taking a fault action such as shutting down, restarting, displaying a GUI message on display 125, etc.

Still referring to FIGS. 9A-9C, sixteen ½ H-bridge row drivers 832*a* are provided, each coupled to output/receive a current pulse 405 to/from a row of multiple EPMs 197 that correspond, for example, to one of sixteen keyboard rows of keyboard matrix 199. Similarly, eight ½ H-bridge column drivers 832*b* are provided, each coupled to output/receive a current pulse 405 to/from a group of EPMs 197 that correspond to one of the eight keyboard columns of keyboard matrix 199. In this configuration, a current pulse 450 may be passed through any given one of the EPMs 197 that corresponds to the intersection of a given one of the rows of EPMs 197 with a given one of the columns of EPMs 197.

To select one of the rows of EPMs 197 at any given time, row decoder circuit 830*a* is coupled as shown to output sixteen different separate chip select signals 915 (with only one active at time) to the respective sixteen different ½ H-bridge row drivers 832*a*. To simultaneously select one of the columns of EPMs 197 at the same given time, column decoder circuit 830*b* is coupled as shown to output eight different separate chip select signals 917 (with only one active at time) to the respective eight different ½ H-bridge column drivers 832*b*. In this regard, row decoder circuit 830*a* outputs only one active-high (CS=1) chip select signal 915 to one of the ½ H-bridge row drivers 832*a* that corresponds to a given row selected by row address signal 964 received from EPM matrix control/addressing firmware 706, while at the same time maintaining all other chip select signals 915 in an inactive-low state, resulting in their respective ½ H-bridge row drivers 832*a* operating in a tri-state condition, so un-powered EPM/s 197 are not increasing the load on the ½ H Bridge driver signal. Simultaneously, column decoder circuit 830*b* outputs only one active-high (CS=1) chip select signal 917 to one of the ½ H-bridge column drivers 832*b* that corresponds to a given column selected by column address signal 974 received from EPM matrix control/addressing firmware 706, while at the same time maintaining all other chip select signals 917 in an inactive-low state, resulting in their respective ½ H-bridge column drivers 832*b* operating in an tri-state condition, so un-powered EPMs 197 do not increase the load on the ½ H Bridge driver signal. Thus, EPM matrix control/addressing firmware 706 may select one of the EPMs 197 at any given time for receiving a current pulse 450 based on a combination of row address signal 964 and column address signal 974. EPM matrix control/addressing firmware 706 may then proceed similarly to provide a current pulse 450 to each of the EPM/s 197 for each of the other key assemblies 405 (e.g., in round robin fashion) to retract and/or extend the different key assemblies 405 of keyboard matrix 199 according to allowed key assembly list 761 from application key map register 704.

As shown in FIGS. 9A-9C, EPM matrix control/addressing firmware 706 may also control a polarity (or current direction) of a given current pulse 450 through the selected EPM 197 using a combination of digital Row In signal 962 value and digital Column In signal 972 value, e.g., current driven from a selected ½ H-bridge row driver 832*a* to a selected ½ H-bridge column driver 832*b* based on combination of Row In signal 962=1 (for drive) and Column In signal 972=0 (for sink), or current driven from a selected ½ H-bridge column driver 832*b* to a selected ½ H-bridge row driver 832*a* based on combination of Row In signal 962=0 (for sink) and Column In signal 972=1 (for drive). Table 2 below gives one example of current pulse direction (relative to FIGS. 9A-9C) as a function of the combination of Row In signal value and Column In signal value provided by EPM matrix control/addressing firmware 706, it being understood that other values may be employed.

TABLE 2

| Value of Row In signal 962 | Value of Column In signal 972 | Current Direction (Polarity) |
|---|---|---|
| 1 | 0 | Downward = from row driver to column driver |
| 0 | 1 | Upward = from column driver to row driver |

As previously described in relation to FIGS. 4A-6D, different current direction or polarity of current pulses 450 may be so selected to control the polarity of the magnetic field of one or more EPM/s 197 according to the configuration of the key assembly 405 of which it is a part. It will be understood that the above signal values are exemplary only, and that any other combination of one or more signal values, or different signal types, may be employed that is suitable for selecting a given EPM 197 and controlling current flow direction to the selected EPM 197 may be employed. Moreover it is possible in other embodiments that current pulses 450 may be simultaneously provided to multiple EPMs 197.

Figure 10:
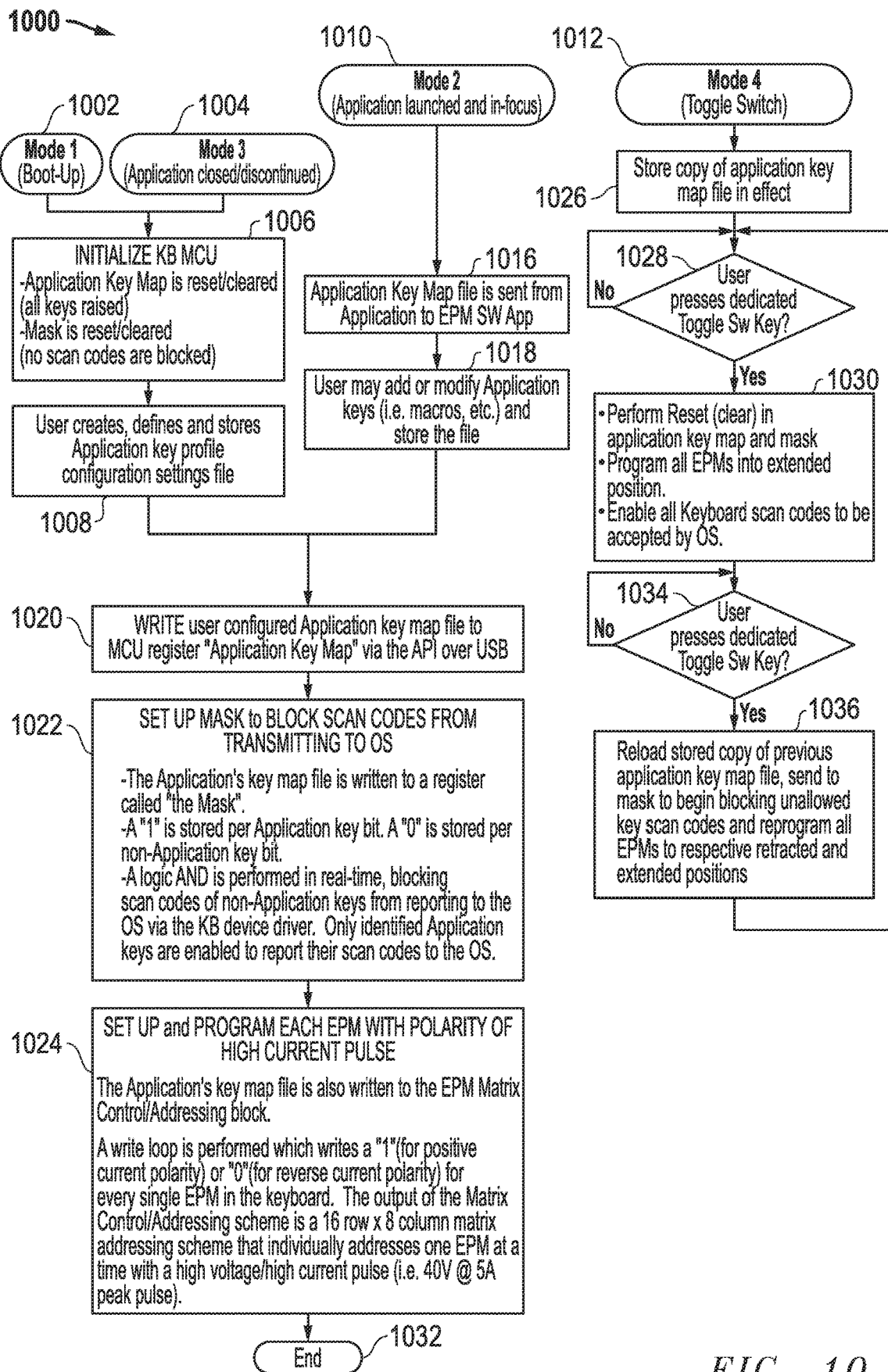
FIG. 10 illustrates a flow chart of methodology according to one exemplary embodiment of the disclosed systems and methods.

FIG. 10 illustrates one exemplary embodiment of retractable key assembly methodology 1000, e.g., as it may be implemented by software and firmware executing on one or more programmable integrated circuit components of information handling system 100 described herein. In this regard, it will be understood that information handling system 100 is only one embodiment of information handling system configuration with which the disclosed systems and methods may be implemented. As shown, methodology 1000 begins in one of steps 1002, 1004, 1010 or 1012 corresponding to one of four operating modes of host programmable integrated circuit 105.

As shown, methodology proceeds to step 1006 where keyboard controller 121 is initialized when host programmable integrated circuit 105 is booted up in step 1002 or when a given in-focus user application 312 executing in application layer 350 is closed or discontinued. Specifically, in step 1006 application key map register 704 is reset or cleared and the EPM matrix control/addressing 706 programs all the EPMs 197 to cause all key assemblies 405 to be extended, and mask 710 reset or cleared so that no scan code signals 763 are blocked. At this time no user application 312 is in focus and/or no application key information 770 is provided from an in-focus user application 312. In step 1008, a user 796 may create, define, download, and/or store application key profile configuration settings file, and this information may be provided as configurable key map information 311 (e.g., as a user configurable application key map file) via API 314 to keyboard controller 121 where it is used to create an application key map register 704 in step 1020. Next, in step 1022, mask 710 is set up to block scan code signals 763 from depressed key assemblies 405 that are not identified as allowed key assemblies 405 so that the scan codes signals 763 received from these non-identified key assemblies 405 will not be reported to device driver 316 of OS layer 354. In step 1024, each EPM 197 is set up and programmed with an appropriate high voltage high current pulse 450 to extend those key assemblies 405 identified by allowed key assembly list 761, and to retract those key assemblies 405 not identified as being allowed by allowed key assembly list 761 before ending in step 1032 with only those allowed key assemblies extended and accepting user input, e.g., until the system 100 enters another mode of steps 1002, 1004, 1010 or 1012.

As further shown in FIG. 10, when a user application 312 is launched and placed in focus in step 1010, default application key information 770 is provided from an in-focus user application 312 to key retraction profile configurator application 310 in step 1016. In step 1018, a user 796 may optionally modify or change the default key settings 770 for the in-focus user application 312, e.g., such as the particular combination of key assemblies 405 designated for use with the application 312. Methodology 1000 may then proceed to steps 1020-1032 which operate as previously described.

In step 1012, a mode is described which may be implemented in one embodiment to provide the ability for the user to press non-EPM driven Mode Toggle Key or Button 200 which is a designated physical key or button to toggle between a mode where all keys of keyboard matrix 199 are allowed (i.e., all keyboard key assemblies 405 are in extended position 210 and all their scan codes 736 are reported to the OS 354) and the most previous application key map register 704 that was formerly in effect (e.g., in which some of the keyboard key assemblies 405 are non-allowed in retracted position 211 with their scan codes 736 blocked from reporting to OS 354). In one embodiment, step 1012, prior to the user pressing the non-EPM driven Mode Toggle Key or button 200 (or alternatively, an assigned macro key assembly of keyboard matrix 199), the keyboard MCU 121 may be configured to always store a copy of the contents of the application key map register 704 currently in effect in step 1026. When the user presses non-EPM driven Mode Toggle Key or button 200 (or alternatively, an assigned macro key assembly of keyboard matrix 199) in step 1028, methodology 1000 moves to step 1030 where a reset is performed to the application key map register 704 and mask 710. All of the EPMs 197 are then programmed to move or retain all key assemblies 405 into extended position 210, and all scan codes 736 are allowed to exit the final scan code output 711 and be reported to OS layer 354 via keyboard device drivers 316. Once it is determined that the user has pressed the non-EPM driven Mode Toggle Key or button 200 (or alternatively, an assigned always-extended macro key assembly 405 of keyboard matrix 199) again in step 1034, the stored copy of the former contents of the application key map register 704 is reloaded, sent to the mask 710 to immediately start blocking unallowed keys and to reprogram the EPMs 197 to move all unallowed key assemblies 405 back into retracted position 211 in step 1036. This cycle may be continually repeated as the user continues to press the non-EPM driven Mode Toggle Key or button 200 (or alternatively, an assigned always-extended macro key assembly 405 of keyboard matrix 199) to allow the user to endlessly switch from reset of all key assemblies 405 of the entire keyboard matrix 199 to functional condition, back to application key map register 704 in effect, and vice-versa.

As an example implementation of one embodiment of step 1012, a user may be playing an in-focus multi-player game application 312 with keycaps 404 of a first (allowed) portion of key assemblies 405 of keyboard matrix 199 in extended position 210, and with keycaps 404 of a second (unallowed) portion of key assemblies 405 of keyboard matrix 199 in retracted position 211. While so playing the multi-player game application 312, the user may desire to temporarily text chat with other players online. To temporarily facilitate user text entry via any of key assemblies 405, the user may press the non-EPM driven Mode Toggle Key or button 200 (or alternatively, an assigned always-extended macro key assembly 405 of keyboard matrix 199) once to cause all currently-retracted keycaps 404 of key assemblies 405 to move upward to extended position 210, and to cause all currently-extended keycaps 404 of key assemblies 405 to remain in extended position 210, i.e., so that the user can use all key assemblies of keyboard matrix 199 to type whatever text is desired. Then, if the user presses the non-EPM driven Mode Toggle Key or button 200 (or alternatively, an assigned always-extended macro key assembly 405 of keyboard matrix 199) again (e.g., such as upon completion of the text chat session with fellow online gamers), the most previous former application key map register 704 for the currently in-focus multi-player game application 312 (i.e., which has been stored or saved in memory) is recalled and goes into effect immediately, resulting in the retraction of keycaps 404 of unallowed key assemblies 405 and blocking of scan codes 736 of these unallowed key assemblies 405 as dictated by the application's application key map register 704. In another example implementation, a user may also employ this feature of step 1012 to press the non-EPM driven Mode Toggle Key or button 200 (or alternatively, an assigned always-extended macro key assembly 405 of keyboard matrix 199) to login at a Windows login screen or to resume from a sleep mode (e.g., sleeping power state S3 or hibernation power state S4) should an application key map register 704 be currently in effect which otherwise would cause retraction of key assemblies 405 that are required for the user to enter the necessary text to login.

It will be understood that the methodology of FIG. 10 is exemplary only, and that any other combination of fewer, additional, and/or alternative steps may be performed to control selectable retraction and extension of key assemblies 405 and/or to control transmission of scan codes from key assemblies 405 or any other suitable key input device.

It will also be understood that in one embodiment, magnetically permeable materials employed herein (e.g., as shunts, plate, levers, etc.) may be selected to be magnetically "soft" materials, meaning that these materials become magnetic when a magnetic field is present but will relatively quickly become unmagnetized when the external field is removed. In one embodiment, permanent magnet materials employed herein (e.g., for EPM components, attached to angled support arms, etc.) may be selected to be magnetically "hard" materials, meaning that these materials require relatively very strong magnetic fields to magnetize but they will hold that magnetization after the external field is removed.

It will also be understood that one or more of the tasks, functions, or methodologies described herein for an information handling system or component thereof (e.g., including those described herein for components 103, 105, 110, 111, 120, 121, 123, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed (e.g., executed on a programmable integrated circuit such as CPU, controller, microcontroller, microprocessor, ASIC, etc. or executed on a programmable logic device "PLD" such as FPGA, complex programmable logic device "CPLD", etc.) to perform one or more steps of the methodologies disclosed herein. In one embodiment, a group of such processors and PLDs may be programmable integrated circuits selected from the group consisting of CPU, controller, microcontroller, microprocessor, FPGA, CPLD and ASIC. The computer program of instructions may include an ordered listing of executable instructions for implementing logical functions in an information handling system or component thereof. The executable instructions may include a plurality of code segments operable to instruct components of an information handling system to perform the methodologies disclosed herein. It will also be understood that one or more steps of the present methodologies may be employed in one or more code segments of the computer program. For example, a code segment executed by the information handling system may include one or more steps of the disclosed methodologies. It will be understood that a programmable integrated circuit may be configured to execute or otherwise be programmed with software, firmware, logic, and/or other program instructions stored in one or more non-transitory tangible computer-readable mediums (e.g., example, data storage devices, flash memories, random access memories, read only memories, programmable memory devices, reprogrammable storage devices, hard drives, floppy disks, DVDs, CD-ROMs, and/or any other tangible data storage mediums) to perform the operations, tasks, functions, or actions described herein for the disclosed embodiments.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A key assembly, comprising:
   at least one key assembly component comprising at least one permanent magnet material or magnetically permeable material and coupled to move toward and away from a base; and
   at least one electro-permanent magnet (EPM) coupled in fixed relationship to the base, the EPM being positioned to emit an external magnetic field that acts on the permanent magnet material or magnetically permeable material of the key assembly component;
   where the at least one EPM comprises first and second permanent magnets having different intrinsic coercivities disposed side by side with their polarities in parallel direction, a first end of the first permanent magnet disposed adjacent a first end of the second permanent magnet and a second end of the first permanent magnet disposed adjacent a second end of the second permanent magnet; a first shunt of the magnetically permeable material coupled between the first end of the first permanent magnet and the first end of the second permanent magnet; a second shunt of the magnetically permeable material coupled between the second end of the first permanent magnet and the second end of the second permanent magnet; and a conductive coil wrapped around at least one of the first and second permanent magnets and receiving a temporary current pulse of a first polarity to reverse a direction of a magnetic polarity of the at least one of the first and second permanent magnets from a first magnetic polarity to a second magnetic polarity that is held after the temporary current pulse ends with no further application of electrical current and until another temporary current pulse of a second opposite polarity is received by the coil to reverse the magnetic polarity of the at least one of the first and second permanent magnets.

2. The key assembly of claim 1, where the at least one EPM comprises multiple EPMs; where the key assembly component comprises a keycap coupled to move with the key assembly component relative to the base; where the base comprises a baseplate; where the key assembly component comprises opposing first and second angled support arms, the first angled support arm being coupled to the baseplate by a first fulcrum between a first portion and a second portion of the first angled support arm, and the second angled support arm being coupled to the baseplate by a second fulcrum between a first portion and a second portion of the second angled support arm, the first and second fulcrums being spaced apart; where the first portion of each of the first and second angled support arms is coupled to the keycap; and where the permanent magnet material or magnetically permeable material of the key assembly is fixedly coupled to the opposing first and second angled support arms so that the multiple EPMs are positioned to emit the external magnetic field that acts on the permanent magnet material or magnetically permeable material on same side of the first fulcrum.

3. The key assembly of claim 1, where the key assembly component comprises a keycap coupled to move with the key assembly component relative to the base; where the base comprises a baseplate; where the key assembly component comprises opposing first and second angled support arms, the first angled support arm being coupled to the baseplate by a first fulcrum between a first portion and a second portion of the first angled support arm, and the second angled support arm being coupled to the baseplate by a second fulcrum between a first portion and a second portion of the second angled support arm, the first and second fulcrums being spaced apart; where the first portion of each of the first and second angled support arms is coupled to the keycap; and where the permanent magnet material or magnetically permeable material of the key assembly is fixedly coupled to at least one of the opposing first and second angled support arms so that the EPM is positioned to emit the external magnetic field that acts on the permanent magnet material or magnetically permeable material on same side of the first fulcrum.

4. The key assembly of claim 3, where the second portions of the first and second angled support arms are coupled together in movable relationship between the first and second fulcrums; and where the permanent magnet material or magnetically permeable material is coupled to the second portion of the at least one of the opposing first and second angled support arms so that the EPM is positioned to emit the external magnetic field that acts on the permanent magnet material or magnetically permeable material.

5. The key assembly of claim 3, where the second portions of the opposing first and second angled support arms are coupled together in movable relationship between the first and second fulcrums; where the permanent magnet material or magnetically permeable material comprises a first magnetically permeable material having a first end fixedly coupled to the first portion of the opposing first angled support arm, and a second end that extends past the first fulcrum so that the first fulcrum is positioned between the first end of the first magnetically permeable material and the second end of the first magnetically permeable material; and where the at least one EPM is positioned to emit the external magnetic field that acts on one of the first end or second end of the first magnetically permeable material.

6. The key assembly of claim 5, further comprising at least two EPMs coupled in fixed relationship to the baseplate, a first one of the two EPMs being positioned to emit a first external magnetic field that acts on the first end of the first magnetically permeable material; and a second one of the two EPMs being positioned to emit a second external magnetic field that acts on the second end of the first magnetically permeable material.

7. The key assembly of claim 5, further comprising a resilient material coupled to bias the key assembly component either toward or away from the baseplate; and where the at least one EPM is positioned to emit the external magnetic field that acts on the second end of the first magnetically permeable material.

8. The key assembly of claim 1, where the key assembly component is either a button for a peripheral device or is a keyboard key of a keyboard matrix for an information handling system that includes multiple key assemblies.

9. A method, comprising:
  moving at least one key assembly component toward a base in response to a depression force applied to the key assembly component by a user, the key assembly component comprising at least one permanent magnet material or magnetically permeable material; and
  applying at least one temporary current pulse to at least one electro-permanent magnet (EPM) coupled in fixed relationship to the base;
  where the at least one temporary current pulse is applied to establish a state of an external magnetic field of the EPM that acts on the permanent magnet material or magnetically permeable material of the key assembly component, the established state of the external magnetic field of the EPM being maintained after the temporary current pulse has ended with no further application of electrical current of the temporary current pulse;
  where the applying of the at least one temporary current pulse to the at least one EPM coupled in the fixed relationship to the base comprises a first applying the at least one temporary current pulse with an amplitude selected to establish a controlled strength state of the external magnetic field of the EPM that acts on the permanent magnet material or magnetically permeable material of the key assembly component to produce a selected peak key depression force required to depress the key assembly component from an extended position toward the base, the established strength state of the external magnetic field of the EPM being maintained after the temporary current pulse has ended with no further application of the electrical current of the temporary current pulse; and
  where the at least one EPM comprises first and second permanent magnets having different intrinsic coercivities disposed side by side with their polarities in parallel direction, a first end of the first permanent magnet disposed adjacent a first end of the second permanent magnet and a second end of the first permanent magnet disposed adjacent a second end of the second permanent magnet; a first shunt of the magnetically permeable material coupled between the first end of the first permanent magnet and the first end of the second permanent magnet; a second shunt of the magnetically permeable material coupled between the second end of the first permanent magnet and the second end of the second permanent magnet; and a conductive coil wrapped around at least one of the first and second permanent magnets and receiving the temporary current pulse of a first polarity to reverse a direction of a magnetic polarity of the at least one of the first and second permanent magnets from a first magnetic polarity to a second magnetic polarity that is held after the temporary current pulse ends with no further application of the electrical current and until another temporary current pulse of a second opposite polarity is received by the coil to reverse the magnetic polarity of the at least one of the first and second permanent magnets.

10. The method of claim 9, where the applying of the at least one temporary current pulse to the at least one EPM coupled in the fixed relationship to the base further comprises applying the at least one temporary current pulse to the at least one EPM to establish at least one of an ON/OFF state, polarity state, or the controlled strength state of the external magnetic field of the EPM that acts on the permanent magnet material or magnetically permeable material of the key assembly component to produce a key retraction force to retract the key assembly component toward the base from the extended position, the at least one of the established ON/OFF state, the established polarity state, or the established controlled strength state of the external magnetic field of the EPM being maintained after the temporary current pulse has ended with no further application of the electrical current of the temporary current pulse.

11. The method of claim 9, where the key assembly component comprises a keycap coupled to move with the key assembly component relative to the base; where the base comprises a baseplate; where the key assembly component comprises opposing first and second angled support arms, the first angled support arm being coupled to the baseplate by a first fulcrum between a first portion and a second portion of the first angled support arm, and the second angled support arm being coupled to the baseplate by a second fulcrum between a first portion and a second portion of the second angled support arm, the first and second fulcrums being spaced apart; where the first portion of each of the first and second angled support arms is coupled to the keycap; where the permanent magnet material or magnetically permeable material of the key assembly component is fixedly coupled to at least one of the opposing first and second angled support arms; and where the method further comprises applying the at least one temporary current pulse of selected amplitude to the at least one EPM to establish the controlled strength state of the external magnetic field of the EPM that acts on the permanent magnet material or magnetically permeable material of the key assembly component to produce the selected peak key depression force required to depress the key assembly component from the extended position toward the base.

12. The method of claim 9, where the key assembly component comprises a keycap coupled to move with the key assembly component relative to the base; where the base comprises a baseplate; where the key assembly component comprises opposing first and second angled support arms, the first angled support arm being coupled to the baseplate by a first fulcrum between a first portion and a second portion of the first angled support arm, and the second angled support arm being coupled to the baseplate by a second fulcrum between a first portion and a second portion of the second angled support arm, the first and second fulcrums being spaced apart; where the first portion of each of the first and second angled support arms is coupled to the keycap; and where the permanent magnet material or magnetically permeable material of the key assembly component is fixedly coupled to at least one of the opposing first and second angled support arms.

13. The method of claim 12, where the second portions of the first and second angled support arms are coupled together in movable relationship between the first and second fulcrums; where the permanent magnet material or magnetically permeable material comprises a first magnetically permeable material having a first end fixedly coupled to the first portion of the first angled support arm, and a second end that extends past the first fulcrum so that the first fulcrum is positioned between the first end of the first magnetically permeable material and the second end of the first magnetically permeable material; where the at least one EPM comprises a first EPM; and where the method further comprises:

applying the at least one temporary current pulse as a first temporary current pulse to the first EPM to establish a first state of a first external magnetic field of the first EPM to attract the second end of the first magnetically permeable material toward the first EPM and cause the second portion of the at least one of the first and second angled support arm to move toward the baseplate and to cause the first end of the first magnetically permeable material with the first portion of the at least one of the first and second angled support arm to move away from the baseplate to extend the keycap relative to the baseplate, the established first state of the first external magnetic field of the first EPM from the first temporary current pulse being maintained after the first temporary current pulse has ended with no further application of a first electrical current of the first temporary current pulse.

14. The method of claim 9, further comprising outputting a signal to at least one programmable integrated circuit in response to the moving the at least one key assembly component toward the base in response to the depression force applied to the key assembly component by the user.

15. A method, comprising:
moving at least one key assembly component toward a base in response to a depression force applied to the key assembly component by a user, the key assembly component comprising at least one permanent magnet material or magnetically permeable material; and
applying at least one temporary current pulse to at least one electro-permanent magnet (EPM) coupled in fixed relationship to the base;
where the at least one temporary current pulse is applied to establish a state of an external magnetic field of the EPM that acts on the permanent magnet material or magnetically permeable material of the key assembly component, the established state of the external magnetic field of the EPM being maintained after the temporary current pulse has ended with no further application of electrical current of the temporary current pulse; and
where the method further comprises separately performing following steps at different times to perform the applying the at least one temporary current pulse to the at least one EPM coupled in the fixed relationship to the base:
applying at least one first temporary current pulse to a first one of multiple EPMs coupled in fixed relationship to the base to establish a first state of a first external magnetic field of the first one of the EPMs and not a second one of the EPMs coupled in fixed relationship to the base to act on the permanent magnet material or magnetically permeable material of the first key assembly component without the first external magnetic field of the second one of the EPMs to produce a first peak key depression force required to depress the key assembly component from an extended position toward the base, the established first state of the first external magnetic field of the first one of the EPMs from the first temporary current pulse being maintained after the first temporary current pulse has ended with no further application of a first electrical current of the first temporary current pulse, and separately applying at least one additional temporary current pulse to each of the first one of the multiple EPMs and the second one of the multiple EPMs coupled in fixed relationship to the base to establish a second state of a second external magnetic field of each of the first one and second one of the EPMs to simultaneously act on the permanent magnet material or magnetically permeable material of the key assembly component to produce a second peak key depression force required to depress the key assembly component from the extended position toward the base, the second peak key depression force being different than the first peak key depression force, and the established second state of the second external magnetic field of the first one and second one of the EPMs from the additional temporary current pulse being maintained after the additional temporary current pulse has ended with no further application of a second electrical current of the additional temporary current pulse.

16. A method, comprising:

moving at least one key assembly component toward a base in response to a depression force applied to the key assembly component by a user, the key assembly component comprising at least one permanent magnet material or magnetically permeable material; and applying at least one temporary current pulse to at least one electro-permanent magnet (EPM) coupled in fixed relationship to the base;

where the at least one temporary current pulse is applied to establish a state of an external magnetic field of the EPM that acts on the permanent magnet material or magnetically permeable material of the key assembly component, the established state of the external magnetic field of the EPM being maintained after the temporary current pulse has ended with no further application of electrical current of the temporary current pulse;

where the key assembly component comprises a keycap coupled to move with the key assembly component relative to the base; where the base comprises a baseplate; where the key assembly component comprises opposing first and second angled support arms, the first angled support arm being coupled to the baseplate by a first fulcrum between a first portion and a second portion of the first angled support arm, and the second angled support arm being coupled to the baseplate by a second fulcrum between a first portion and a second portion of the second angled support arm, the first and second fulcrums being spaced apart; where the first and second portions of the first and second angled support arms are coupled together in movable relationship between the first and second fulcrums; where the permanent magnet material or magnetically permeable material comprises a first magnetically permeable material having a first end fixedly coupled to the first portion of the first angled support arm, and a second end that extends past the first fulcrum so that the first fulcrum is positioned between the first end of the first magnetically permeable material and the second end of the first magnetically permeable material; where the at least one EPM comprises multiple EPMs; and where the method further comprises separately performing following steps at different times to perform the applying the at least one temporary current pulse to at least one EPM coupled in the fixed relationship to the base:

applying at least one first temporary current pulse to a first one of the multiple EPMs and not to a second one of the multiple EPMs to establish a first state of a first external magnetic field of the first one of the EPMs to attract the second end of the first magnetically permeable material toward the first one of the EPMs with a first attractive force that produces a first peak key depression force required to depress the key assembly component from an extended position toward the base, the established first state of the first external magnetic field of the first one of the EPMs from the first temporary current pulse being maintained after the first temporary current pulse has ended with no further application of a first electrical current of the first temporary current pulse, and separately applying at least one additional temporary current pulse to each of the first one of the multiple EPMs and the second one of the multiple EPMs to establish a second state of a second external magnetic field of each of the first one and second one of the EPMs to simultaneously attract the second end of the first magnetically permeable material toward the first one of the EPMs with a second attractive force that produces a second peak key depression force required to depress the key assembly component from the extended position toward the base, the second peak key depression force being greater than the first peak key depression force, and the established second state of the second external magnetic field of each of the first one and second one of the EPMs from the additional temporary current pulse being maintained after the additional temporary current pulse has ended with no further application of a second electrical current of the additional temporary current pulse.

17. A method, comprising:

moving at least one key assembly component toward a base in response to a depression force applied to the key assembly component by a user, the key assembly component comprising at least one permanent magnet material or magnetically permeable material; and applying at least one temporary current pulse to at least one electro-permanent magnet (EPM) coupled in fixed relationship to the base;

where the at least one temporary current pulse is applied to establish a state of an external magnetic field of the EPM that acts on the permanent magnet material or magnetically permeable material of the key assembly component, the established state of the external magnetic field of the EPM being maintained after the temporary current pulse has ended with no further application of electrical current of the temporary current pulse;

where the key assembly component comprises a keycap coupled to move with the key assembly component relative to the base; where the base comprises a baseplate; where the key assembly component comprises opposing first and second angled support arms, the first angled support arm being coupled to the baseplate by a first fulcrum between a first portion and a second portion of the first angled support arm, and the second angled support arm being coupled to the baseplate by a second fulcrum between a first portion and a second portion of the second angled support arm, the first and second fulcrums being spaced apart; where the first portion of each of the first and second angled support arms is coupled to the keycap; where the permanent magnet material or magnetically permeable material of the key assembly component is fixedly coupled to at least one of the opposing first and second angled support arms; where the method further comprises applying the at least one temporary current pulse to the at least one EPM to establish the state of the external magnetic field of the EPM that acts on the permanent magnet material or magnetically permeable material of the key assembly component;

where the second portions of the opposing first and second angled support arms are coupled together in movable relationship between the first and second fulcrums; where the permanent magnet material or magnetically permeable material comprises a first permanent magnet that is coupled to the second portion of at least one of the first and second angled support arms; and where the method further comprises performing each of following steps at different times to perform the applying the at least one temporary current pulse to at least one EPM coupled in the fixed relationship to the base:

applying at least one first temporary current pulse of a first polarity to the at least one EPM to establish a first state of a first external magnetic field of the EPM to attract the first permanent magnet toward the EPM and cause the second portion of the at least one of the first and second angled support arm to move toward the baseplate and the first portion of the at least one of the first and second angled support arm to move away from the baseplate to extend the keycap relative to the baseplate, the established first state of the first external magnetic field of the EPM from the first temporary current pulse being maintained after the first temporary current pulse has ended with no further application of a first electrical current of the first temporary current pulse, and separately applying at least one additional temporary current pulse of a second polarity opposite to the first polarity to the at least one EPM to establish a second state of a second external magnetic field of the EPM to repel the first permanent magnet away from the EPM and cause the second portion of the at least one of the first and second angled support arm to move away from the baseplate and the first portion of the at least one of the first and second angled support arm to move toward the baseplate to retract the keycap relative to the baseplate, the established second state of the second external magnetic field of the EPM from the additional temporary current pulse being maintained after the additional temporary current pulse has ended with no further application of a second electrical current of the additional temporary current pulse.

18. A method, comprising:

moving at least one key assembly component toward a base in response to a depression force applied to the key assembly component by a user, the key assembly component comprising at least one permanent magnet material or magnetically permeable material; and applying at least one temporary current pulse to at least one electro-permanent magnet (EPM) coupled in fixed relationship to the base;

where the at least one temporary current pulse is applied to establish a state of an external magnetic field of the EPM that acts on the permanent magnet material or magnetically permeable material of the key assembly component, the established state of the external magnetic field of the EPM being maintained after the temporary current pulse has ended with no further application of electrical current of the temporary current pulse;

where the key assembly component comprises a keycap coupled to move with the key assembly component relative to the base; where the base comprises a baseplate; where the key assembly component comprises opposing first and second angled support arms, the first angled support arm being coupled to the baseplate by a first fulcrum between a first portion and a second portion of the first angled support arm, and the second angled support arm being coupled to the baseplate by a second fulcrum between a first portion and a second portion of the second angled support arm, the first and second fulcrums being spaced apart; where the first portion of each of the first and second angled support arms is coupled to the keycap; where the permanent magnet material or magnetically permeable material of the key assembly component is fixedly coupled to at least one of the opposing first and second angled support arms; where the method further comprises applying the at least one temporary current pulse to the at least one EPM to establish the state of the external magnetic field of the EPM that acts on the permanent magnet material or magnetically permeable material of the key assembly component;

where the second portions of the first and second angled support arms are coupled together in movable relationship between the first and second fulcrums; where the permanent magnet material or magnetically permeable material comprises a first magnetically permeable material having a first end fixedly coupled to the first portion of the first angled support arm, and a second end that extends past the first fulcrum so that the first fulcrum is positioned between the first end of the first magnetically permeable material and the second end of the first magnetically permeable material; where the at least one EPM comprises a first EPM; and where the method further comprises:

applying the at least one temporary current pulse as a first temporary current pulse to the first EPM to establish a first state of a first external magnetic field of the first EPM to attract the second end of the first magnetically permeable material toward the first EPM and cause the second portion of the at least one first and second angled support arm to move toward the baseplate and to cause the first end of the first magnetically permeable material with the first portion of the at least one first and second angled support arm to move away from the baseplate to extend the keycap relative to the baseplate, the established first state of the first external magnetic field of the first EPM from the first temporary current pulse being maintained after the first temporary current pulse has ended with no further application of a first electrical current of the first temporary current pulse;

where the at least one EPM further comprises a second EPM; and where the method further comprises:

applying at least one second temporary current pulse to the second EPM to establish a second state of a second external magnetic field of the second EPM to attract the first end of the first magnetically permeable material toward the second EPM to retract the keycap relative to the baseplate, the established second state of the second external magnetic field of the second EPM from the second temporary current pulse being maintained after the second temporary current pulse has ended with no further application of a second electrical current of the second temporary current pulse.

19. A method, comprising:

moving at least one key assembly component toward a base in response to a depression force applied to the key assembly component by a user, the key assembly component comprising at least one permanent magnet material or magnetically permeable material; and applying at least one temporary current pulse to at least one electro-permanent magnet (EPM) coupled in fixed relationship to the base;

where the at least one temporary current pulse is applied to establish a state of an external magnetic field of the EPM that acts on the permanent magnet material or magnetically permeable material of the key assembly component, the established state of the external magnetic field of the EPM being maintained after the temporary current pulse has ended with no further application of electrical current of the temporary current pulse;

where the key assembly component comprises a keycap coupled to move with the key assembly component relative to the base; where the base comprises a baseplate; where the key assembly component comprises opposing first and second angled support arms, the first angled support arm being coupled to the baseplate by a first fulcrum between a first portion and a second portion of the first angled support arm, and the second angled support arm being coupled to the baseplate by a second fulcrum between a first portion and a second portion of the second angled support arm, the first and second fulcrums being spaced apart; where the first portion of each of the first and second angled support arms is coupled to the keycap; and where the permanent magnet material or magnetically permeable material of the key assembly component is fixedly coupled to at least one of the opposing first and second angled support arms; where the method further comprises applying the at least one temporary current pulse to the at least one EPM to establish the state of the external magnetic field of the EPM that acts on the permanent magnet material or magnetically permeable material of the key assembly component;

where the second portions of the first and second angled support arms are coupled together in movable relationship between the first and second fulcrums; where the permanent magnet material or magnetically permeable material comprises a first magnetically permeable material having a first end fixedly coupled to the first portion of the first angled support arm, and a second end that freely extends past the first fulcrum so that the first fulcrum is positioned between the first end of the first magnetically permeable material and the second end of the first magnetically permeable material; where the key assembly component comprises a resilient material coupled to bias the key assembly component only one of toward or away from the baseplate; and where the method further comprises only one of:

applying the at least one temporary current pulse to the EPM to establish the state of the external magnetic field of the EPM to attract the first end of the first magnetically permeable material toward the EPM and overcome a bias force of the resilient material away from the baseplate so as to retract the keycap relative to the baseplate, or applying the at least one temporary current pulse to the EPM to establish the state of the external magnetic field of the EPM to attract the second end of the first magnetically permeable material toward the EPM and overcome a bias force of the resilient material toward the baseplate so as to extend the keycap relative to the baseplate; and where the at least one EPM comprises first and second permanent magnets having different intrinsic coercivities disposed side by side with their polarities in parallel direction, a first end of the first permanent magnet disposed adjacent a first end of the second permanent magnet and a second end of the first permanent magnet disposed adjacent a second end of the second permanent magnet; a first shunt of the magnetically permeable material coupled between the first end of the first permanent magnet and the first end of the second permanent magnet; a second shunt of the magnetically permeable material coupled between the second end of the first permanent magnet and the second end of the second permanent magnet; and a conductive coil wrapped around at least one of the first and second permanent magnets and receiving the temporary current pulse of a first polarity to reverse a direction of a magnetic polarity of the at least one of the first and second permanent magnets from a first magnetic polarity to a second magnetic polarity that is held after the temporary current pulse ends with no further application of the electrical current and until another temporary current pulse of a second opposite polarity is received by the coil to reverse the magnetic polarity of the at least one of the first and second permanent magnets.

* * * * *